United States Patent
Suzuki et al.

(10) Patent No.: US 10,340,818 B2
(45) Date of Patent: Jul. 2, 2019

(54) ACTUATOR, SHUTTER DEVICE, FLUID CONTROL DEVICE, SWITCH, AND TWO-DIMENSIONAL SCANNING SENSOR DEVICE

(71) Applicants: National University Corporation Shizuoka University, Shizuoka-shi, Shizuoka (JP); OMRON Corporation, Kyoto-Shi, Kyoto (JP); KABUSHIKI KAISHA SAGINOMIYA SEISAKUSHO, Nakano-ku, Tokyo (JP)

(72) Inventors: Masato Suzuki, Hamamatsu (JP); Akito Mori, Mitoyo (JP); Gen Hashiguchi, Hamamatsu (JP); Tatsuhiko Sugiyama, Hamamatsu (JP); Hiroshi Imamoto, Kyoto (JP); Masatoshi Oba, Kyoto (JP); Hiroyuki Mitsuya, Koganei (JP); Hisayuki Ashizawa, Tokorozawa (JP); Kazunori Ishibashi, Sayama (JP)

(73) Assignees: National University Corporation Shizuoka University, Shizuoka-shi (JP); OMRON Corporation, Kyoto-Shi (JP); KABUSHIKI KAISHA SAGINOMIYA SEISAKUSHO, Tokyo (JP)

( * ) Notice: Subject to any disclaimer, the term of this patent is extended or adjusted under 35 U.S.C. 154(b) by 548 days.

(21) Appl. No.: 14/910,622

(22) PCT Filed: Jul. 30, 2014

(86) PCT No.: PCT/JP2014/070072
§ 371 (c)(1),
(2) Date: Feb. 5, 2016

(87) PCT Pub. No.: WO2015/019919
PCT Pub. Date: Feb. 12, 2015

(65) Prior Publication Data
US 2016/0204716 A1    Jul. 14, 2016

(30) Foreign Application Priority Data

Aug. 8, 2013   (JP) .................. 2013-165166

(51) Int. Cl.
*H02N 1/00* (2006.01)
*F16K 31/02* (2006.01)
(Continued)

(52) U.S. Cl.
CPC .......... *H02N 1/008* (2013.01); *B81B 3/0054* (2013.01); *F16K 31/02* (2013.01); *G02B 26/02* (2013.01);
(Continued)

(58) Field of Classification Search
CPC ....... H02N 1/008; B81B 3/0054; F16K 31/02; G02B 26/02; H01H 59/00
(Continued)

(56) References Cited

U.S. PATENT DOCUMENTS 5,362,213 A   11/1994 Komatsu et al.
5,780,948 A    7/1998 Lee et al.
(Continued)

FOREIGN PATENT DOCUMENTS

CN    1881004 A    12/2006
JP    5-2978 A     1/1993
(Continued)

OTHER PUBLICATIONS

International Search Report (PCT/ISA/210) issued in PCT Application No. PCT/JP2014/070072 dated Oct. 28, 2014, with English translation (four (4) pages).

*Primary Examiner* — Terrance L Kenerly
(74) *Attorney, Agent, or Firm* — Crowell & Moring LLP

(57) ABSTRACT

An actuator includes: an electrostatic actuation mechanism including a stationary electrode and a movable electrode; a first movable part driven by the electrostatic actuation mechanism; a first elastic support part that elastically supports the first movable part; an electret formed in at least one of the stationary electrode and the movable electrode; and a (Continued)

drive control unit that controls application of voltage to the electrostatic actuation mechanism. In the actuator a plurality of stable states are set in which the first movable part is positioned at a stable position at which an electrostatic force generated by the electret matches with an elastic force exerted by the first elastic support part or at a stable position near such stable position. By applying a voltage to the electrostatic actuation mechanism, the first movable part may be displaced from any stable position to another stable position.

23 Claims, 61 Drawing Sheets

(51) Int. Cl.
    *G02B 26/02* (2006.01)
    *H01H 59/00* (2006.01)
    *B81B 3/00* (2006.01)

(52) U.S. Cl.
    CPC ....... *H01H 59/00* (2013.01); *B81B 2201/018* (2013.01); *B81B 2201/0292* (2013.01); *B81B 2201/033* (2013.01); *B81B 2201/036* (2013.01); *B81B 2201/047* (2013.01); *B81B 2203/0109* (2013.01); *B81B 2203/0163* (2013.01); *B81B 2203/051* (2013.01)

(58) Field of Classification Search
    USPC ........................................................ 310/309
    See application file for complete search history.

(56) References Cited

U.S. PATENT DOCUMENTS

| | | | |
|---|---|---|---|
| 6,519,834 B1 | 2/2003 | Sasaki | |
| 6,539,803 B2 * | 4/2003 | Mochida | G01C 19/5719 73/504.12 |
| 2002/0125117 A1 * | 9/2002 | Knieser | H02N 1/008 200/181 |
| 2003/0038558 A1 | 2/2003 | Fujita et al. | |
| 2004/0263937 A1 * | 12/2004 | Fujii | G02B 26/0841 359/199.1 |
| 2005/0040730 A1 | 2/2005 | Baeck et al. | |
| 2005/0264131 A1 * | 12/2005 | Hong | H02N 1/008 310/309 |
| 2006/0082250 A1 * | 4/2006 | Ko | G02B 26/0841 310/309 |
| 2006/0113862 A1 | 6/2006 | Suzuki et al. | |
| 2006/0227553 A1 | 10/2006 | Nakamura et al. | |
| 2006/0284514 A1 | 12/2006 | Ko et al. | |
| 2012/0169179 A1 * | 7/2012 | Masaki | H01G 7/02 310/300 |

FOREIGN PATENT DOCUMENTS

| | | |
|---|---|---|
| JP | 5-272457 A | 10/1993 |
| JP | 9-178494 A | 7/1997 |
| JP | 2001-28106 A | 1/2001 |
| JP | 2005-269714 A | 9/2005 |
| JP | 2005-335052 A | 12/2005 |
| JP | 2006-78969 A | 3/2006 |
| JP | 2006-180450 A | 7/2006 |
| JP | 2006-311783 A | 11/2006 |
| JP | 2006-353081 A | 12/2006 |
| JP | 2011-87384 A | 4/2011 |
| JP | 2011-188182 A | 9/2011 |
| JP | 2012-57692 A | 3/2012 |
| JP | 2013-13256 A | 1/2013 |
| JP | 2013-27143 A | 2/2013 |
| KR | 10-2005-0020872 A | 3/2005 |
| WO | WO 01/68512 A1 | 9/2001 |

* cited by examiner

FIG.22
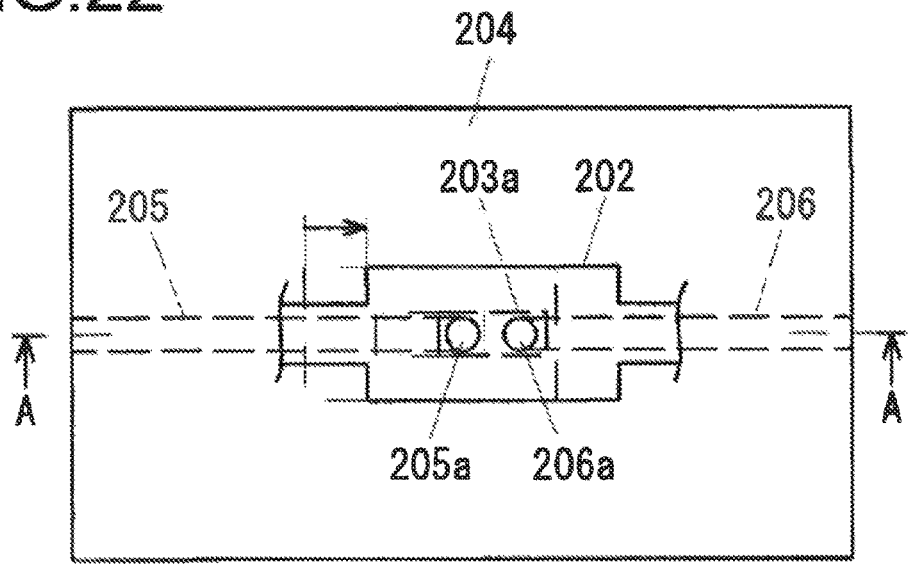
(a)
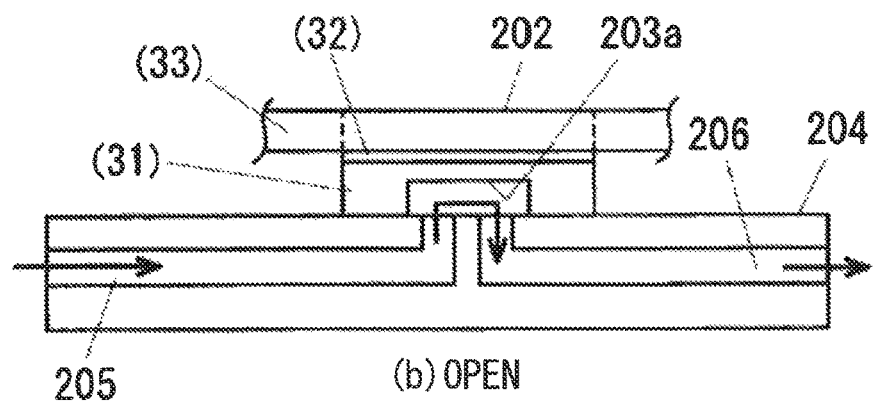
(b) OPEN
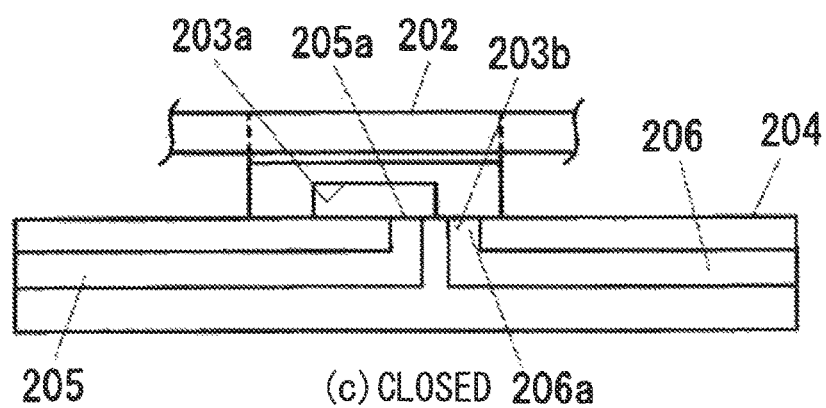
(c) CLOSED

FIG.23
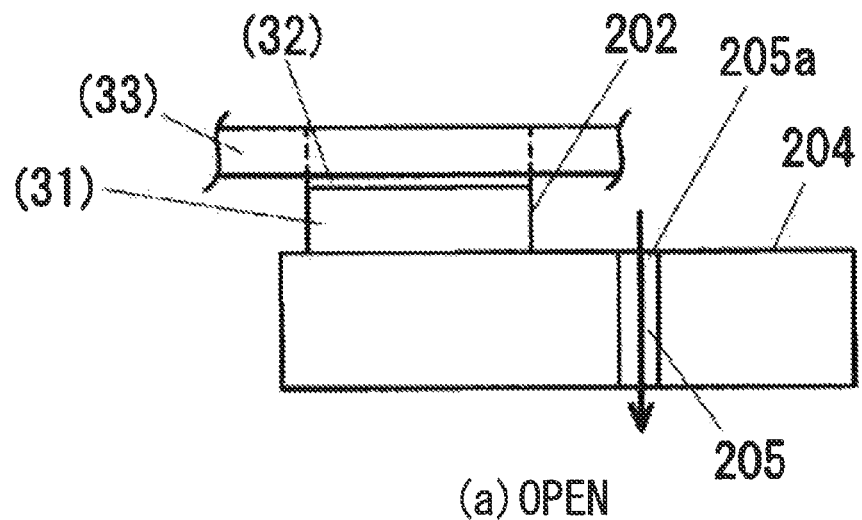
(a) OPEN
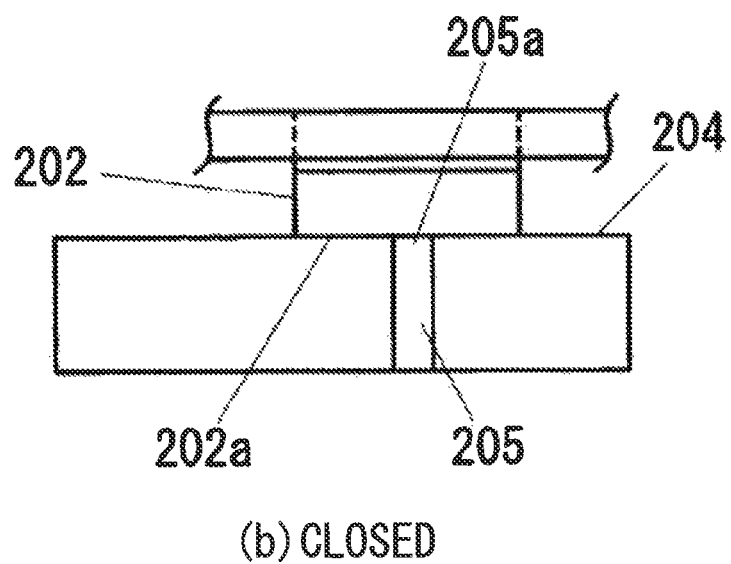
(b) CLOSED

FIG.57
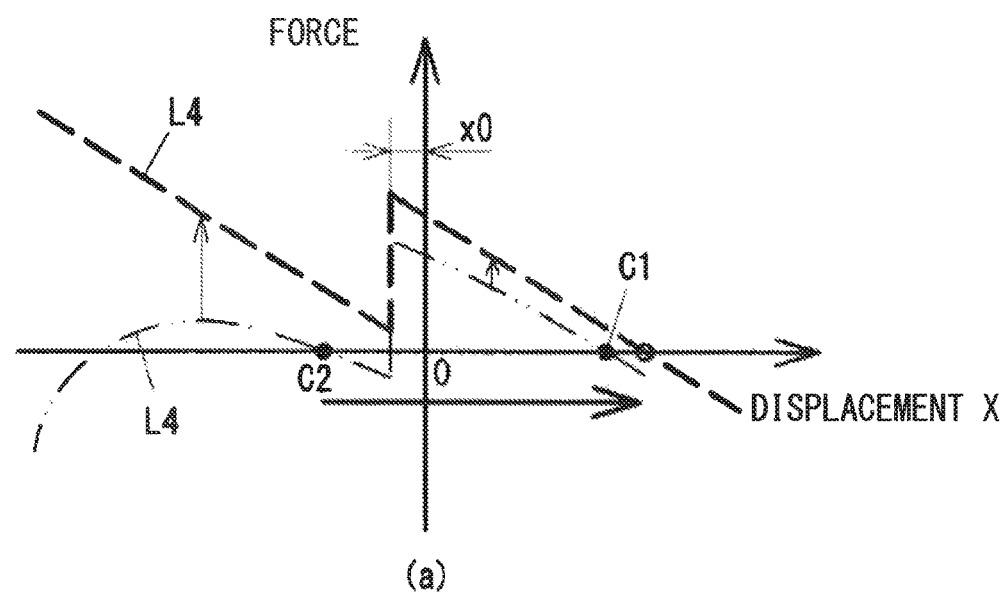
(a)
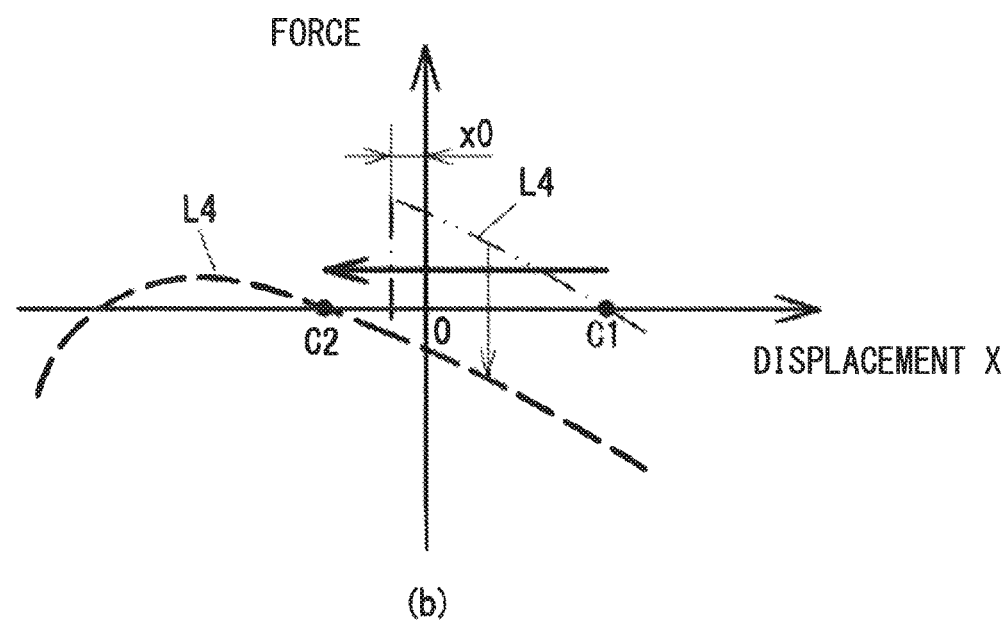
(b)

FIG.58
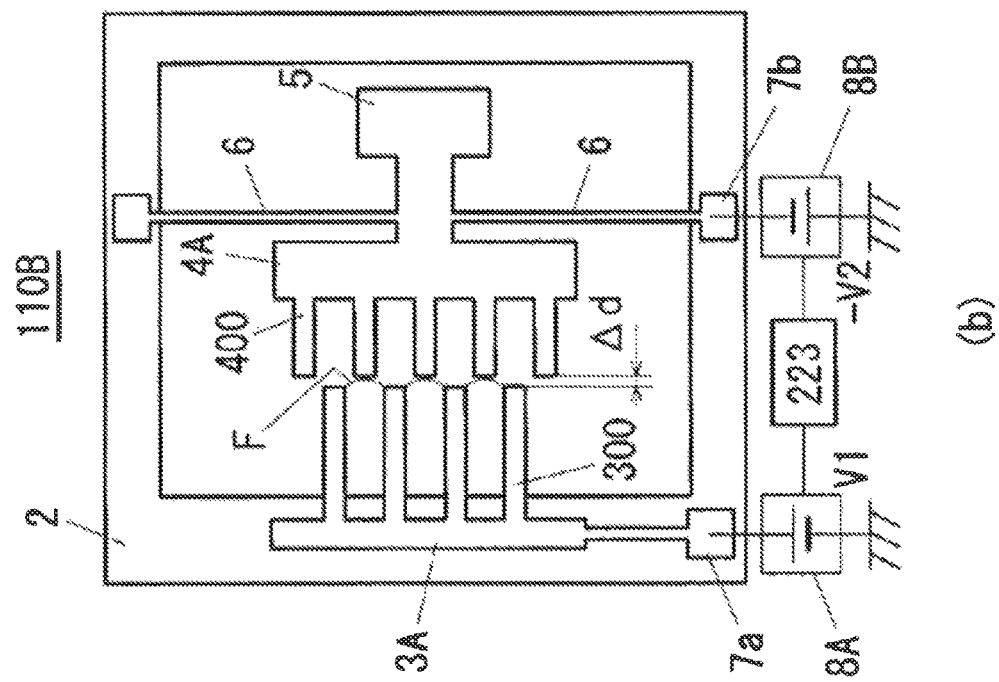
(a)
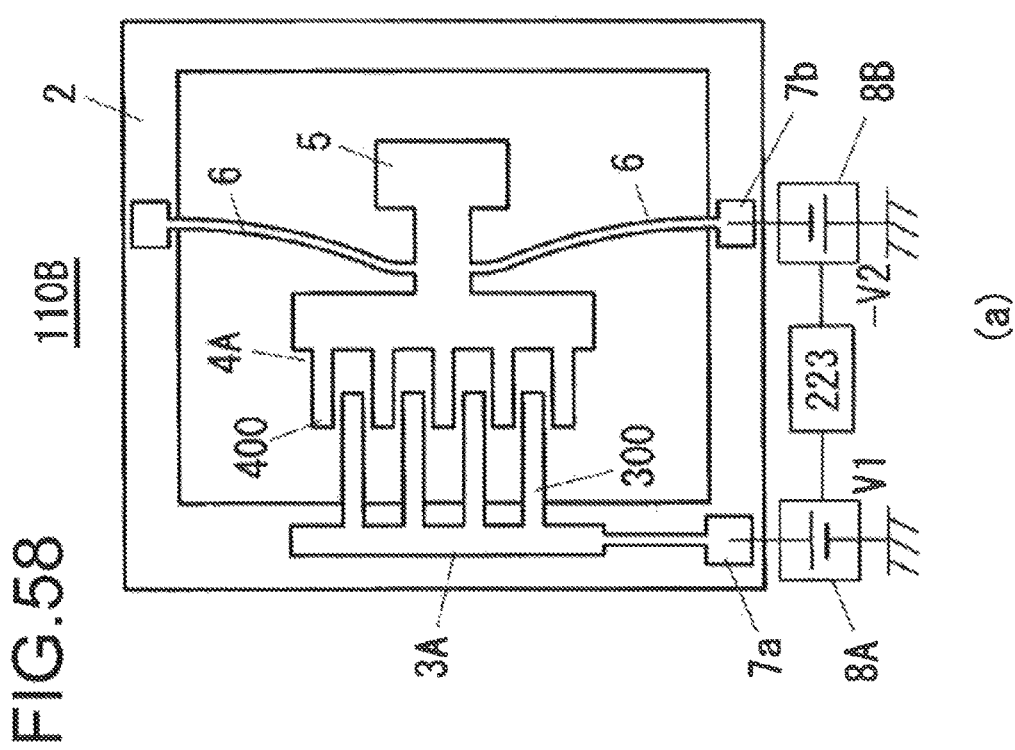
(b)

ACTUATOR, SHUTTER DEVICE, FLUID CONTROL DEVICE, SWITCH, AND TWO-DIMENSIONAL SCANNING SENSOR DEVICE

TECHNICAL FIELD

The present invention relates to an actuator that includes comb-teeth electrodes provided with electrets to enable displacement to a plurality of stable positions, and to a shutter device, a fluid control device, a switch, and a two-dimensional scanning sensor device including such an actuator.

BACKGROUND ART

An actuator provided with electrets and has a bistable structure is known as disclosed in PTL 1 below. PTL 1 discloses an electrostatic relay that includes a stationary side actuator electrode and an electret arranged so as to sandwich a movable plate capable of making a seesaw motion. The movable plate seesaws upon application of voltage to the stationary side actuator electrode, thereby turning ON/OFF of a contact.

CITATION LIST

Patent Literature

PTL 1: Japanese Laid-Open Patent Publication No. H05-2978

SUMMARY OF INVENTION

Technical Problem

However, since the movable plate is configured to seesaw, it requires a space sufficient for allowing seesaw motion of the movable plate in the direction of height. This increases the size in height of the electrostatic relay. The electrostatic relay is configured such that the movable side base provided with the movable plate is connected to and sandwiched by the upper and lower stationary side bases. This configuration is disadvantageous in that it requires precise positioning and increases man-hour.

Solution to Problem

An actuator according to a first aspect of the present invention comprises: an electrostatic actuation mechanism including a stationary electrode and a movable electrode; a first movable part provided with the movable electrode and driven by the electrostatic actuation mechanism; a first elastic support part that elastically supports the first movable part to enable the movable electrode to be displaced by sliding in a plane with respect to the stationary electrode; an electret formed in at least one of the stationary electrode and the movable electrode of the electrostatic actuation mechanism; and a drive control unit that controls application of voltage to the electrostatic actuation mechanism, wherein: in the actuator a plurality of stable states are set in which the first movable part is positioned at a stable position at which an electrostatic force generated by the electret matches with an elastic force exerted by the first elastic support part or at a stable position near such stable position; and the drive control unit controls the electrostatic force generated by the electrostatic actuation mechanism by applying a voltage to the electrostatic actuation mechanism to change any one of the stable states to another of the stable states to displace the first movable part from any stable position to another stable position.

According to a second aspect of the present invention, in the actuator according to the first aspect, it is preferable that the electrostatic actuation mechanism includes at least a comb-teeth actuation unit that is provided with a stationary comb-teeth electrode as the stationary electrode and a movable comb-teeth electrode as the movable electrode, with a direction in which an insertion amount of the movable comb-teeth electrode changes with respect to the stationary comb-teeth electrode corresponding to a direction in which displacement by sliding occurs; and the electret is formed in at least one of the stationary comb-teeth electrode and the movable comb-teeth electrode.

According to a third aspect of the present invention, in the actuator according to the second aspect, it is preferable that the electrostatic actuation mechanism includes: a first comb-teeth actuation unit having a first stationary comb-teeth electrode, and a first movable comb-teeth electrode that disengageably interdigitates with the first stationary comb-teeth electrode; and a second comb-teeth actuation unit having a second stationary comb-teeth electrode, placed opposite to and at a distance from the first stationary comb-teeth electrode, and a second movable comb-teeth electrode that disengageably interdigitates with the second stationary comb-teeth electrode; the first movable part is arranged between the first stationary comb-teeth electrode and the second stationary comb-teeth electrode and is provided with the first movable comb-teeth electrode and the second movable comb-teeth electrode; the first elastic support part elastically supports the first movable part to enable the first movable part to be displaced by sliding in a direction in which respective insertion amounts of the first and second movable comb-teeth electrode to the first and second stationary comb-teeth electrodes change; the electret has a first electret provided in at least one of the first stationary comb-teeth electrode and the first movable comb-teeth electrode and a second electret provided in at least one of the second stationary comb-teeth electrode and the second movable comb-teeth electrode; the plurality of stable positions being set include: a first stable position, which is a stable position, at which the first movable comb-teeth electrode is drawn by the first stationary comb-teeth electrode to a position at which an insertion amount of the second movable comb-teeth electrode becomes zero and a first electrostatic force generated by the first electret matches with an elastic force exerted by the first elastic support part, or a stable position set near such stable position; and a second stable position, which is a stable position, at which the second movable comb-teeth electrode is drawn by the second stationary comb-teeth electrode to a position at which an insertion amount of the first movable comb-teeth electrode becomes zero and a second electrostatic force generated by the second electret matches with an elastic force exerted by the first elastic support part, or a stable position set near such stable position; the drive control unit applies a first voltage to weaken the first electrostatic force to the first comb-teeth actuation unit to displace the first movable part from the first stable position to the second stable position; and the drive control unit applies a second voltage to weaken the second electrostatic force to the second comb-teeth actuation unit to displace the first movable part from the second stable position to the first stable position.

According to a fourth aspect of the present invention, in the actuator according to the second aspect, it is preferable that the electrostatic actuation mechanism further includes: a stationary electrode plate provided on a side opposite to the stationary comb-teeth electrode in a sliding direction of the first movable part, so that the first movable part is sandwiched by the stationary comb-teeth electrode and the stationary electrode plate; and a movable electrode plate arranged to face the stationary electrode plate and is provided at the first movable part, wherein: the electret includes a first electret provided in at least one of the stationary comb-teeth electrode and the movable comb-teeth electrode and a second electret provided in at least one of the stationary electrode plate and the movable electrode plate which are disposed to face each other; the plurality of stable positions being set includes: a first stable position, which is a stable position, at which the movable comb-teeth electrode is drawn by the stationary comb-teeth electrode so as to be inserted into the stationary comb-teeth electrode to make a first electrostatic force generated by the first electret match with an elastic force exerted by the first elastic support part, or a stable position set near such stable position; and a second stable position, which is a stable position, at which the movable electrode plate is drawn toward the stationary electrode plate to a position at which an insertion amount of the movable comb-teeth electrode with respect to the stationary comb-teeth electrode becomes zero and a second electrostatic force generated by the second electret matches with an elastic force exerted by the first elastic support part, or a stable position set near such stable position; the drive control unit applies a first voltage to weaken the first electrostatic force to between the stationary comb-teeth electrode and the movable comb-teeth electrode to displace the first movable part from the first stable position to the second stable position; and the drive control unit applies a second voltage to weaken the second electrostatic force to between the stationary electrode plate and the movable electrode plate to displace the first movable part from the second stable position to the first stable position.

According to a fifth aspect of the present invention, in the actuator according to the second aspect, it is preferable that the electret is provided in at least one of the stationary comb-teeth electrode and the movable comb-teeth electrode; the plurality of stable positions being set includes: a first stable position, which is a stable position, at which the insertion amount is positive and an electrostatic force generated by the electret matches with an elastic force exerted by the first elastic support part, or a stable position set near such stable position; and a second stable position, which is a stable position, at which the insertion amount is zero, an electrostatic attraction force generated by a fringe electric field of the stationary comb-teeth electrode generated by the electret matches with the elastic force, and an electrostatic force generated by a fringe electric field when the second voltage is applied is greater than the elastic force, or a stable position set near such stable position; and the drive control unit applies a first voltage to weaken an electrostatic force exerted by the comb-teeth actuation unit to drive the first movable part from the first stable position to the second stable position, and applies a second voltage to strengthen an electrostatic force of the comb-teeth actuation unit to drive the first movable part from the second stable position to the first stable position.

According to a sixth aspect of the present invention, in the actuator according to the third aspect, it is preferable that the first stationary comb-teeth electrode or the first movable comb-teeth electrode has a comb-teeth shape such that magnitude of the first electrostatic force changes in a plurality of steps according to an insertion amount of the first movable comb-teeth electrode to enable a plurality of first intermediate stable positions to be set, at which the first and second electrostatic forces match with an elastic force exerted by the first elastic support part, between the first stable position and the second stable position; and the drive control unit controls an applied voltage to at least one of the first comb-teeth actuation unit and the second comb-teeth actuation unit to displace the first movable part to any one of the first stable position, the second stable position, and the plurality of first intermediate stable positions.

According to a seventh aspect of the present invention, in the actuator according to the fourth aspect, it is preferable that the stationary comb-teeth electrode or the movable comb-teeth electrode has a comb-teeth shape such that magnitude of the first electrostatic force changes in a plurality of steps according to an insertion amount of the movable comb-teeth electrode to enable a plurality of intermediate stable positions to be set, at which the first and second electrostatic forces match with an elastic force exerted by the first elastic support part, between the first stable position and the second stable position; and the drive control unit is configured to be able to apply a plurality of voltages to the comb-teeth actuation unit to drive the first movable part to the plurality of intermediate stable positions, respectively.

According to an eighth aspect of the present invention, in the actuator according to the fifth aspect, it is preferable that the stationary comb-teeth electrode or the movable comb-teeth electrode has a comb-teeth shape such that magnitude of an electrostatic force generated by the electret changes in a plurality of steps according to an insertion amount of the movable comb-teeth electrode to enable a plurality of intermediate stable positions to be set, at which an electrostatic force generated by the electret matches with an elastic force exerted by the first elastic support part, between the first stable position and the second stable position; and the drive control unit is configured to be able to apply a plurality of voltages to the comb-teeth actuation unit to drive the first movable part to the plurality of intermediate stable positions, respectively.

According to a ninth aspect, it is preferable that the actuator according to the second aspect, it is preferable that the electrostatic actuation mechanism includes a first comb-teeth actuation unit that has a first stationary comb-teeth electrode and a first movable comb-teeth electrode, and a second comb-teeth actuation unit that has a second stationary comb-teeth electrode and a second movable comb-teeth electrode; the first stationary comb-teeth electrode and the second stationary comb-teeth electrode are arranged opposite to and spaced apart from each other; the first movable part is arranged between the first stationary comb-teeth electrode and the second stationary comb-teeth electrode, and is provided with the first movable comb-teeth electrode so as to disengageably interdigitate with the first stationary comb-teeth electrode, and the second movable comb-teeth electrode so as to disengageably interdigitate with the second stationary comb-teeth electrode; the first elastic support part elastically supports the first movable part so that the first movable part is displaceable by sliding in directions in which respective insertion amounts of the first and second movable comb-teeth electrodes change; the electret includes a first electret provided in at least one of the first stationary comb-teeth electrode and the first movable comb-teeth electrode and a second electret provided in at least one of the second stationary comb-teeth electrode and the second movable comb-teeth electrode; to enable a plurality of stable positions to be set, at which a first electrostatic force generated by the first electret and a second electrostatic force generated by the second electret match with an elastic force exerted by the first elastic support part as the plurality of stable positions, the first stationary comb-teeth electrode or the first movable comb-teeth electrode is configured to have a comb-teeth shape that allows magnitude of the first electrostatic force to change in a plurality of steps according to an insertion amount of the first movable electrode; and the drive control unit controls an applied voltage applied to at least one of the first comb-teeth actuation unit and the second comb-teeth actuation unit to displace the first movable part to any one of the plurality of stable positions.

According to a tenth aspect of the present invention, in the actuator according to the sixth or ninth aspect, it is preferable that the first stationary comb-teeth electrode or the first movable comb-teeth electrode includes a plurality of kinds of comb-tooth groups differing in length or a plurality of kinds of comb-tooth groups differing in width in a direction of arrangement of the comb teeth.

According to an 11th aspect of the present invention, in the actuator according to the seventh or eighth aspect, it is preferable that the stationary comb-teeth electrode or the movable comb-teeth electrode includes a plurality of kinds of comb-tooth groups differing in length or a plurality of kinds of comb-tooth groups differing in width in a direction of arrangement of the comb teeth.

According to a 12th aspect of the present invention, in the actuator according to any one of the first to 11th aspect, it is preferable that the electrostatic actuation mechanism, the first movable part, and the first elastic support part are formed by processing a single silicon substrate.

According to a 13th aspect of the present invention, in the actuator according to the third aspect, it is preferable to further comprise: a third stationary comb-teeth electrode and a fourth stationary comb-teeth electrode, each being provided at the first movable part and arranged opposite to and spaced apart from each other in a direction that crosses a direction of displacement of the first movable part; a second movable part arranged between the third stationary comb-teeth electrode and the fourth stationary comb-teeth electrode and provided with a third movable comb-teeth electrode that disengageably interdigitates with the third stationary comb-teeth electrode and with a fourth movable comb-teeth electrode that disengageably interdigitates with the fourth stationary comb-teeth electrode; and a second elastic support part that elastically supports the second movable part to enable the second movable part to be displaced by sliding with respect to the first movable part in the crossing direction, wherein: the electret further includes a third electret provided in at least one of the third stationary comb-teeth electrode and the third movable comb-teeth electrode and a fourth electret provided in at least one of the fourth stationary comb-teeth electrode and the fourth movable comb-teeth electrode; the plurality of stable positions being set further includes: a third stable position, which is a stable position, at which the third movable comb-teeth electrode is drawn by the third stationary comb-teeth electrode to a position at which an insertion amount of the fourth movable comb-teeth electrode with respect to the fourth stationary comb-teeth electrode becomes zero and a third electrostatic force generated by the third electret matches with an elastic force exerted by the second elastic support part, or a stable position set near such stable position; and a fourth stable position, which is a stable position, at which the fourth movable comb-teeth electrode is drawn by the fourth stationary comb-teeth electrode to a position at which an insertion amount of the third movable comb-teeth electrode with respect to the third stationary comb-teeth electrode becomes zero and a fourth electrostatic force generated by the fourth electret matches with an elastic force exerted by the second elastic support part, or a stable position set near such stable position; the drive control unit applies a third voltage to weaken the third electrostatic force to between the third stationary comb-teeth electrode and the third movable comb-teeth electrode to displace the second movable part from the third stable position to the fourth stable position; and the drive control unit applies a fourth voltage to weaken the fourth electrostatic force to between the fourth stationary comb-teeth electrode and the fourth movable comb-teeth electrode to displace the second movable part from the fourth stable position to the third stable position.

According to a 14th aspect of the present invention, in the actuator according to the ninth aspect, it is preferable to further comprise: a third stationary comb-teeth electrode and a fourth stationary comb-teeth electrode, each being provided at the first movable part and arranged opposite to and spaced apart from each other in a direction that crosses a direction in which the first movable part is displaced; a second movable part arranged between the third stationary comb-teeth electrode and the fourth stationary comb-teeth electrode and provided with a third movable comb-teeth electrode that disengageably interdigitates with the third stationary comb-teeth electrode and with a fourth movable comb-teeth electrode that disengageably interdigitates with the fourth stationary comb-teeth electrode; and a second elastic support part that elastically supports the second movable part with respect to the first movable part to enable the second movable part to be displaced in the crossing direction, wherein: the electret further includes a third electret provided in at least one of the third stationary comb-teeth electrode and the third movable comb-teeth electrode and a fourth electret provided in at least one of the fourth stationary comb-teeth electrode and the fourth movable comb-teeth electrode; to enable a plurality of second stable positions to be set, at which a third electrostatic force generated by the third electret and a fourth electrostatic force generated by the fourth electret match with an elastic force exerted by the second elastic support part as the plurality of stable positions, the third stationary comb-teeth electrode or the third movable comb-teeth electrode is configured to have a comb-teeth shape such that magnitude of the third electrostatic force changes in a plurality of steps according to an insertion amount of the third movable electrode; and the drive control unit controls at least one of an applied voltage applied to between the third stationary comb-teeth electrode and the third movable comb-teeth electrode and an applied voltage applied to between the fourth stationary comb-teeth electrode and the fourth movable comb-teeth electrode to displace the second movable part to any one of the plurality of second stable positions.

A shutter device according to a 15th aspect of the present invention comprises: the actuator according to any one of the first to third aspect; and a shutter member that is displaced integrally with the first movable part of the actuator to be inserted in or removed from a light path to switch light from a light source to one of a transmissive state and a non-transmissive state, wherein when the first movable part is displaced to a first stable position among the plurality of stable positions, the shutter member is in the transmissive state and when the first movable part is displaced to a second stable position other than the first stable position, the shutter member is in the non-transmissive state.

A shutter device according to a 16th aspect of the present invention comprises: the actuator according to the sixth or ninth aspect; and a shield member that is displaced integrally with the first movable part of the actuator to be inserted in and removed from a light path, a light path shielding ratio of the shield member differing according to which one of the plurality of stable positions the first movable part is displaced to, wherein the applied voltage is controlled by the drive control unit to displace the first movable part to any of the plurality of stable positions to control an amount of transmitted light.

A fluid control device according to a 17th aspect of the present invention comprises: the actuator according to any one of the first to third aspect; a flow channel-formed body in which a flow channel is formed; and a valve element that is displaced integrally with the first movable part of the actuator to open and close the flow channel, wherein the valve element opens the flow channel when the first movable part is displaced to a first stable position among the plurality of stable positions and closes the flow channel when the first movable part is displace to a second stable position other than the first stable position.

A fluid control device according to a 18th aspect of the present invention comprises: a flow channel-formed body in which a plurality of flow channel is formed; the actuator according to any one of the first to third aspect, provided in each of the plurality of flow channels; and a valve element that is provided in each of the plurality of flow channels and is displaced integrally with the first movable part of the actuator corresponding to a flow channel to open and close the flow channel, wherein each of the plurality of valve elements opens the flow channel when the first movable part that is displaced integrally with the valve element is displaced to a first stable position among the plurality of stable positions and closes the flow channel when the first movable part is displaced to a second stable position other than the first stable position.

According to a 19th aspect of the present invention, in the fluid control device according to the 17th or 18th aspect, it is preferable that: the flow channel has a first flow channel on an inlet side of the flow channel and a second flow channel on an outlet side of the flow channel; and the valve element corresponding to the flow channel is provided with a communication part that communicates the first flow channel with the second flow channel and a shielding part that blocks one of the first flow channel and the second flow channel to establish a non-transmissive state.

A fluid control device according to a 20th aspect of the present invention comprises: a flow channel-formed body having a first flow channel and a plurality of second flow channels; the actuator according to any one of claims 1 to 3, provided in each of the plurality of second flow channels; and a valve element provided at each of the plurality of second flow channels that is displaced integrally with the first movable part of the actuator corresponding to a second flow channel to switch transmission and non-transmission of the second flow channel with respect to the first flow channel, wherein each of the plurality of valve elements causes a corresponding second flow channel and the first flow channel to be brought into a transmissive state with each other if the first movable part that is displaced integrally with the valve element is displaced to a first stable position among the plurality of stable positions, and causes the corresponding second flow channel and the first flow channel to be brought into a non-transmissive state if the first movable part that is displaced integrally with the valve element is displaced to a second stable position among the plurality of stable positions other than the first stable position.

A switch according to a 21st aspect of the present invention comprises: the actuator according to any one of the first to third aspect; a first contact point to which a signal line for inputting a high-frequency signal is connected; a second contact point to which a signal line for outputting the input high-frequency signal is connected; and a movable contact point that is displaced integrally with the first movable part of the actuator to switch over continuity and discontinuity between the first contact point and the second contact point, wherein the movable contact point causes continuity to be established between the first contact point and the second contact point if the first movable part is displaced to a first stable position among the plurality of stable positions, and causes discontinuity to be established between the first contact point and the second contact point if the first movable part is displaced to a second stable position among the plurality of stable positions other than the first stable position.

A switch according to a 22nd aspect of the present invention comprises: the actuator according to any one of the first to third aspect; a first contact point and a second contact point to which a first signal line for inputting a high-frequency signal is connected; a third contact point to which a second signal line for outputting the input high-frequency signal is connected; a fourth contact point to which a third signal line for outputting the input high-frequency signal is connected; a first movable contact point that is displaced integrally with the first movable part of the actuator to switch over continuity and discontinuity between the first contact point and the third contact point; and a second movable contact point that is displaced integrally with the first movable part of the actuator to switch over continuity and discontinuity between the second contact point and the fourth contact point, wherein: if the first movable part is displaced to a first stable position among the plurality of stable positions, continuity is established between the first contact point and the third contact point and discontinuity is established between the second contact point and the fourth contact point; and if the first movable part is displaced to a second stable position other than the first stable position, continuity is established between the second contact point and the fourth contact point and discontinuity is established between the first contact point and the third contact point.

A two-dimensional scanning sensor device according to a 23rd aspect of the present invention comprises: the actuator according to the 13th or 14th aspect; and a sensor that is displaced integrally with the second movable part of the actuator to detect a physical quantity within a range of displacement of the second movable part, wherein the sensor is configured to detect the physical quantity by displacing at least one of the first movable part and the second movable part to a corresponding stable position to displace the sensor two-dimensionally.

Advantageous Effects of Invention

According to the present invention, the movable part is maintained at any of a plurality of stable positions due to an electrostatic force of the electret and is displaced from one to another of the stable positions by application of voltage to change the electrostatic force of the electret. In the electrostatic actuation mechanism, the movable electrode is displaced by sliding in a plane with respect to the stationary electrode. As a result, an actuator, a shutter device, a fluid control device, a high-frequency switch, and a two-dimensional scanning sensor device, which are power-saving and low profile, can be provided.

BRIEF DESCRIPTION OF DRAWINGS

FIG. 22 shows diagrams showing a valve element 202 and a flow channel structure 204.
FIG. 23 shows diagrams showing a variation example of the second embodiment.

FIG. 57 shows diagrams illustrating the displacement of the actuator 110A among the stable positions.
FIG. 58 shows diagrams showing an actuator 110B.

DESCRIPTION OF EMBODIMENTS

Hereafter, explanation is made on embodiments achieving the present invention with reference to the attached drawings.

First Embodiment

Figure 1:
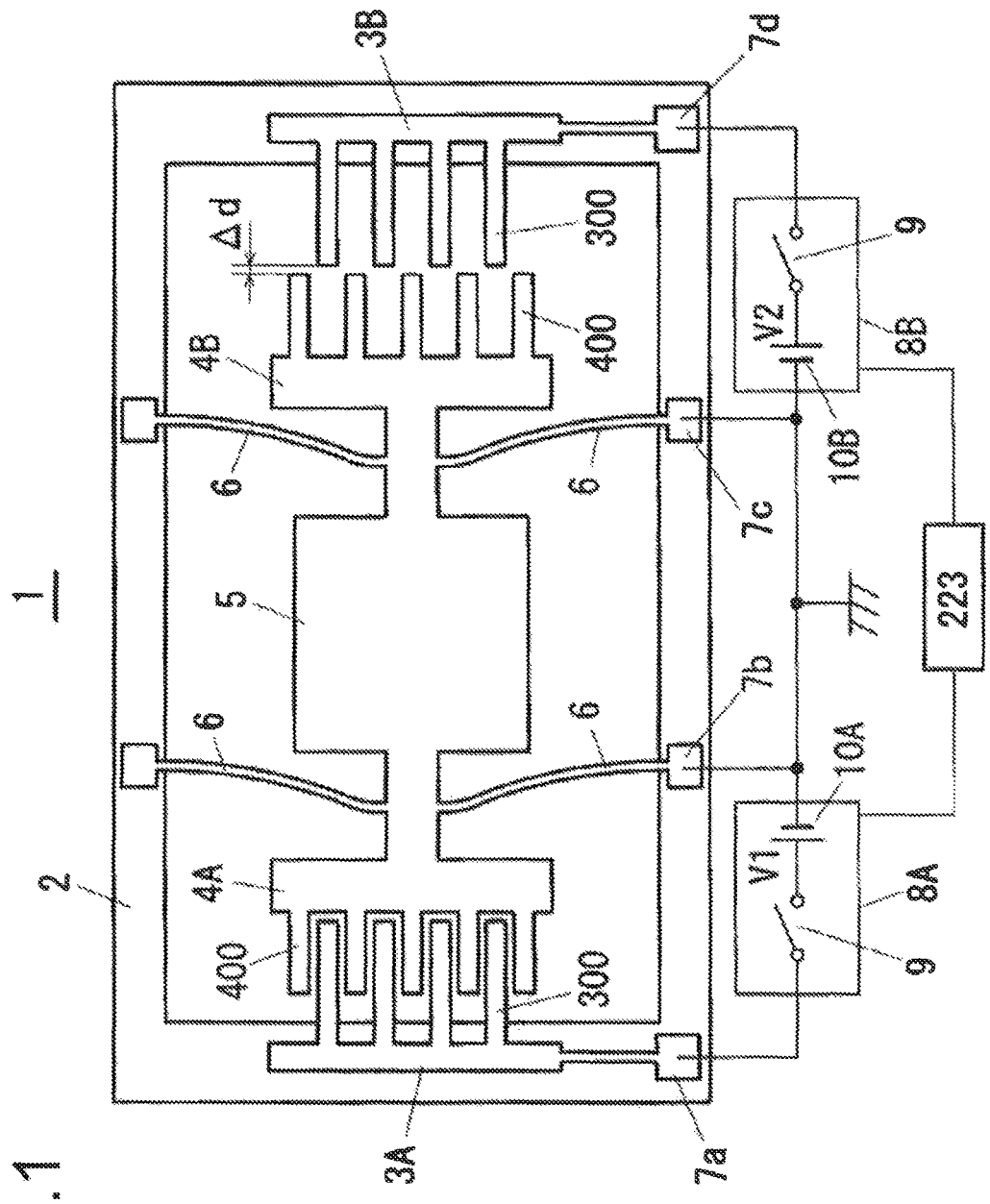
FIG. 1 is a drawing showing a first embodiment of an actuator according to the present invention.

FIG. 1 is a diagram showing a first embodiment of an actuator according to the present invention, schematically showing an outline arrangement of the actuator. An actuator 1 includes a base 2, a first stationary electrode 3A, a second stationary electrode 3B, a first movable electrode 4A, a second movable electrode 4B, a movable part 5, an elastic support part 6, connection pad parts 7a, 7b, 7c, and 7d, a first actuation unit 8A, a second actuation unit 8B, and a control unit 223.

The base 2 has a shape of a rectangular frame. However, the shape of the base 2 is not limited to the rectangular frame. The first stationary electrode 3A is provided on the left edge part of the base 2 in the figure. On the other hand, the second stationary electrode 3B is provided on an edge part on the right side of the base 2 in the figure, so that it is arranged opposite to the first stationary electrode 3A. The first movable electrode 4A is provided on the left end of the movable part 5 and the second movable electrode 4B is provided on the right end of the movable part 5. The movable part 5, which is provided with the first movable electrode 4A and the second movable electrode 4B, is elastically supported by the elastic support part 6. The other end of each elastic support part 6 is fixed to the base 2.

As shown in FIG. 1, the first stationary electrode 3A and the first movable electrode 4A have comb-teeth structures. The first stationary electrode 3A is provided with a plurality of comb teeth 300 and the first movable electrode 4A is provided with a plurality of comb teeth 400. The first stationary electrode 3A and the first movable electrode 4A are arranged so that the comb teeth 300 and the comb teeth 400 interdigitate with each other. Similarly, the second stationary electrode 3B is provided with a plurality of comb teeth 300 and the second movable electrode 4B is provided with a plurality of comb teeth 400. The second stationary electrode 3B and the second movable electrode 4B are arranged so that the comb teeth 300 and the comb teeth 400 interdigitate with each other.

Thus, the first stationary electrode 3A and the first movable electrode 4A form together a comb-teeth actuation unit and also the second stationary electrode 3B and the second movable electrode 4B together form a comb-teeth actuation unit. The two comb-teeth actuation units constitute an electrostatic actuation mechanism at the actuator 1. In each comb-teeth actuation unit, the first stationary electrode 3A or the second stationary electrode 3B constitutes a stationary comb-teeth electrode and the first movable electrode 4A or the second movable electrode 4B constitutes a movable comb-teeth electrode. The comb-teeth electrode includes the plurality of comb teeth 300 and 400 arranged in parallel as in the first stationary electrode 3A and the first movable electrode 4A shown in FIG. 1. In this embodiment, the comb-teeth actuation unit with the smallest number of comb teeth corresponds to a configuration including one of the stationary comb-teeth electrode and the movable comb-teeth electrode that is provided with two comb teeth and the other of the electrodes that is provided with one comb tooth so as to be inserted between the two comb teeth. This configuration enables an actuator having the functions described below to be made.

The movable part 5, which is elastically supported, is able to slide integrally with a pair of the movable electrodes 4A and 4B in a horizontal direction in the figure. Although illustration is omitted in FIG. 1, an electret is formed in at least one of the interdigitating comb teeth 300 and 400 near the surface of the comb teeth. Consequently, if the movable electrode and the stationary electrode interdigitate with each other, that is, if a state in which each of the comb teeth 400 is inserted between adjacent two of the comb teeth 300 is established, the movable electrode is drawn toward the stationary electrode side due to electrostatic force.

Figure 2:
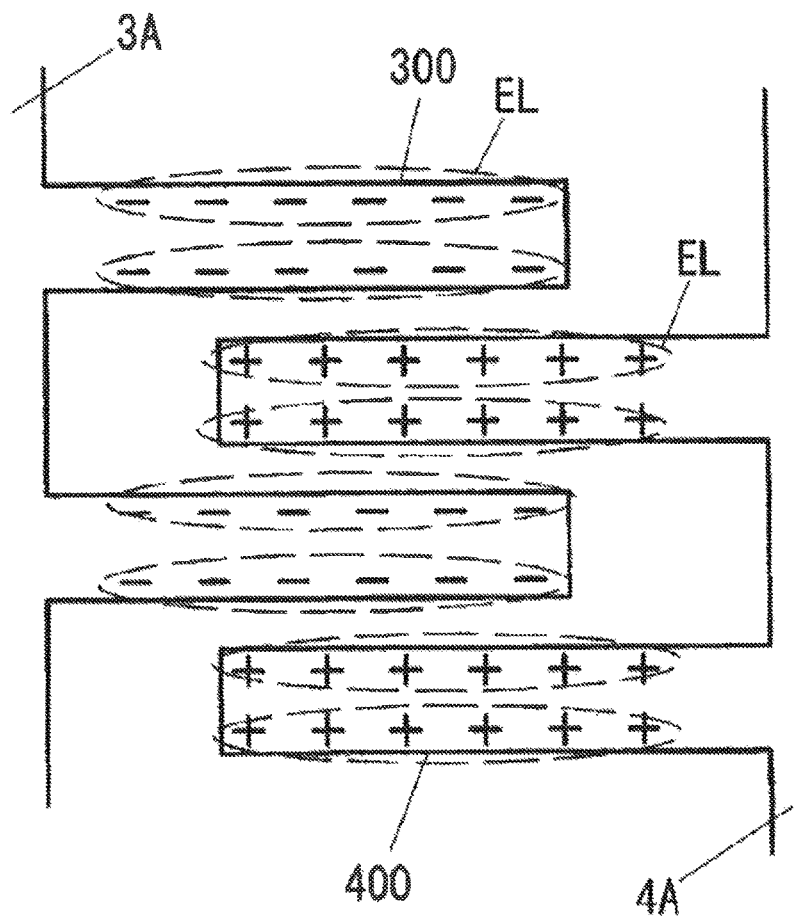
FIG. 2 is a drawing schematically showing a charged state of comb teeth 300 and 400.

FIG. 2 is a diagram schematically showing a charged state of the comb teeth 300 and 400. FIG. 2 shows a case in which respective electrets EL of the comb teeth 400 are positively charged and respective electrets EL of the comb teeth 300 are negatively charged. In case electrets EL are formed in only one of the comb teeth arrays, charges of an opposite polarity are induced in the other of the interdigitated comb teeth arrays.

FIG. 1 shows a state in which the first movable electrode 4A is drawn in by the first stationary electrode 3A. Any tip of comb teeth 400 of the second movable electrode 4B on the other side is completely out of the comb teeth 300 of the second stationary electrode 3B. In this state, the size of a gap between the tips of the comb teeth 300 and the tips of the comb teeth 400 is Δd. As described later, the movable part 5 of the actuator 1 as shown in FIG. 1 is displaced by sliding between two stable positions. FIG. 1 shows the first stable position. The second stable position corresponds to a state in which the second movable electrode 4B is drawn in by the second stationary electrode 3B. In this state, any tip of comb teeth 400 of the first movable electrode 4A is completely out of the comb teeth 300.

The first actuation unit 8A is a device in which voltage is applied to between the first stationary electrode 3A and the first movable electrode 4A and which includes a switch 9 and a direct current power source 10A that are series-connected to each other. As shown in FIG. 2, the electret provided in at least one of the first stationary electrode 3A and the first movable electrode 4A is charged so that the first movable electrode 4A is at a potential higher than the potential of the first stationary electrode 3A. The positive side of the first actuation unit 8A is connected to a connection pad part 7a of the first stationary electrode 3A and the negative side of the first actuation unit 8A is connected to the connection pad part 7b of the first movable electrode 4A.

The second actuation unit 8B is a device with which voltage is applied to between the second stationary electrode 3B and the second movable electrode 4B and which includes a switch 9 and a direct-current power source 10B that are series-connected with each other. The electret provided in at least one of the second stationary electrode 3B and the second movable electrode 4B is charged so that the second movable electrode 4B is at a potential higher than that of the second stationary electrode 3B. The positive side of the second actuation unit 8B is connected to the connection pad part 7d of the second stationary electrode 3B and the negative side of the second actuation unit 8B is connected to the connection pad part 7c of the second movable electrode 4B. The first actuation unit 8A and the second actuation unit 8B turn the switches 9 on/off and adjust direct-current voltages V1 and V2, respectively, based on a command from the control unit 223.

Figure 3:
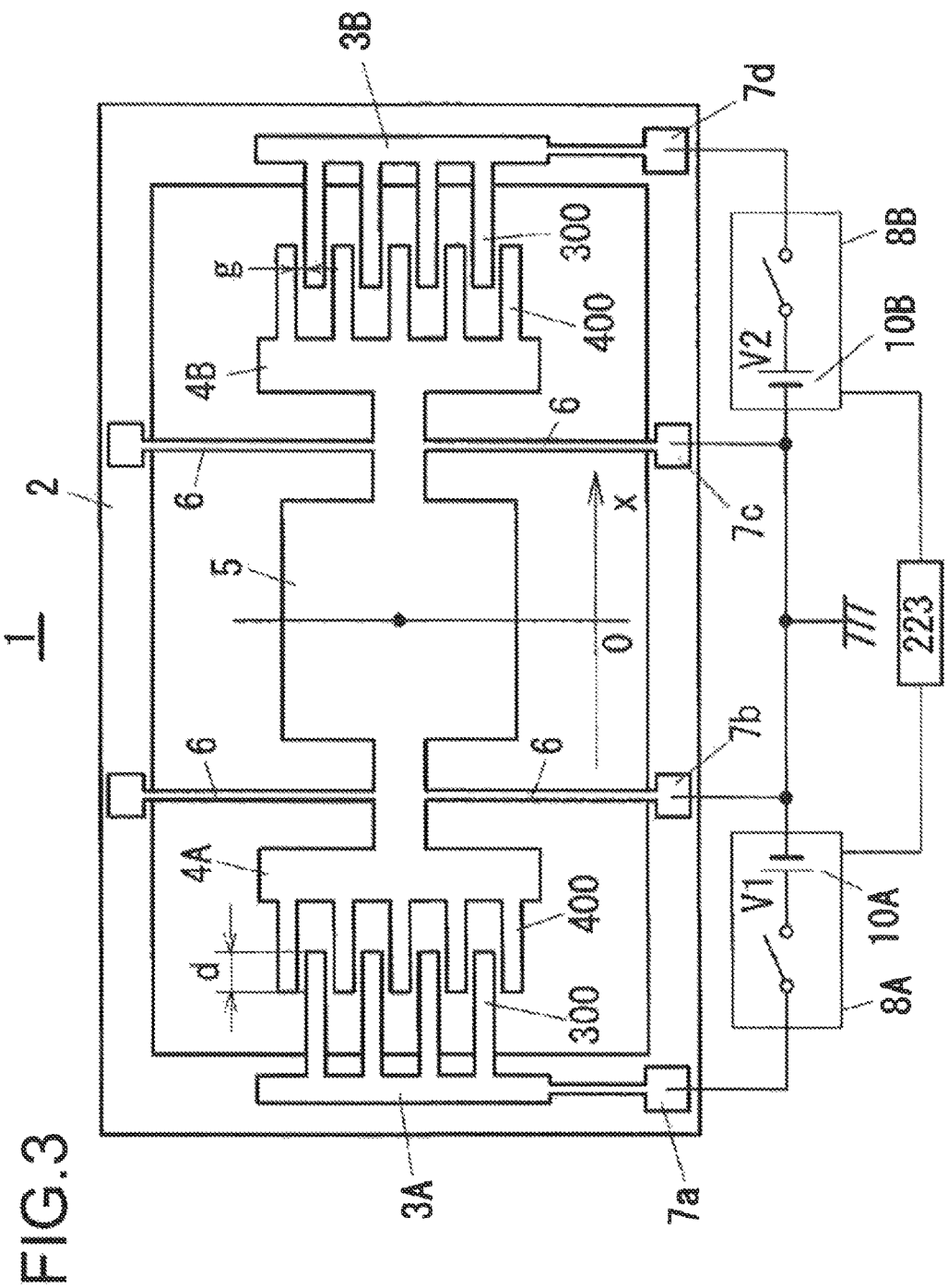
FIG. 3 is a drawing showing a state in which displacement x=0.

Next, the operation of the actuator 1 is explained. FIG. 1 shows the actuator 1 that is at the first stable position whereas FIG. 3 shows the state in which the displacement x of the movable part 5 is zero, i.e., x=0. The actuator 1 in which a semiconductor substrate is fabricated by using an MEMS fabrication technique as described later, ideally, is maintained in a state as shown in FIG. 3 where the elastic support parts 6 are arranged in a linear manner. Hereafter, the displacement x is defined to be positive if the movable part 5 is displaced to a position rightward in the figure from x=0.

It is assumed that at the displacement x=0, the elastic support parts 6 are undeformed horizontally in the figure and the elastic force f exerted by the elastic support parts 6 in the horizontal direction in the figure is f=0. Also, assuming that the elastic force is expressed as a function f(x) of the displacement, f(0)=0, f(x)<0 for x>0, and f(x)>0 for x<0. With respect to whether the force is positive or negative, the force is defined to be positive if the direction of the force is in the positive direction of x-axis. Hereafter, explanation is made based on the assumption that the elastic force f(x) may be approximated be f(x)=−kx. In the above equation formula, k represents a spring constant.

As shown in FIG. 3, at the displacement x=0, the comb teeth 300 of the first stationary electrode 3A and the comb teeth 400 of the first movable electrode 4A interdigitate with each other and also the comb teeth 300 of the second stationary electrode 3B and the comb teeth 400 of the second movable electrode 4B interdigitate with each other. It is assumed that at x=0, the depth of insertion d (hereafter, d being referred to as insertion amount) in which the comb teeth 300 and the comb teeth 400 are mutually inserted is set equally for the electrodes 3A and 3B side and for the electrodes 4A and 4B side. In case that the comb teeth 300 and the comb teeth 400 are in a mutually inserted state, the electrostatic force FL(V1) on the side of the electrodes 3A and 4A and the electrostatic force FR(V2) on the side of the electrodes 3B and 4B are represented by the expressions (1) and (2) below, respectively. V1 represents an applied voltage applied by the first actuation unit 8A and V2 represents an applied voltage applied by the second actuation unit 8B. Symbol ε0 represents the dielectric constant of vacuum, g represents a gap between a comb tooth 300 and a comb tooth 400 adjacent to each other, b represents a thickness of each comb tooth (i.e., size in the direction perpendicular to the plane of paper of (FIG. 3), and Ve represents voltage between comb teeth generated by the electret EL. Here, it is assumed that the voltage between comb teeth generated by the electret on the side of the electrodes 3A and 4A is identical with the voltage between comb teeth generated by the electret on the side of the electrodes 3B and 4B. N represents the number of sets of electrode comb teeth on the side of electrodes 3A and 4A or on the side of the electrodes 3B and 4B. The force in the positive direction in x-axis is defined to be positive and the thickness of the comb teeth 300 is assumed to be the same as the thickness of the comb teeth 400.

$$FL(V1)=-N\varepsilon_0 b(Ve-V1)^2/g \quad (1)$$

$$FR(V2)=N\varepsilon_0 b(Ve-V2)^2/g \quad (2)$$

The electrostatic forces FL(V1), FR(V2) act in the direction in which the movable electrode is drawn in toward the stationary electrode and is constant regardless of the insertion amount d provided that voltage differences (Ve−V1), (Ve−V2) are constant. Consequently, if V1=V2=0, that is, if none of the first and second power sources 8A and 8B applies a voltage, the electrostatic force acting on the stationary electrode 3A side is equal to the electrostatic force acting on the second stationary electrode side in the state shown in FIG. 3. This generates a state of equilibrium at a neutral position (x=0) at which the electrostatic force matches with the elastic force.

Figure 4:
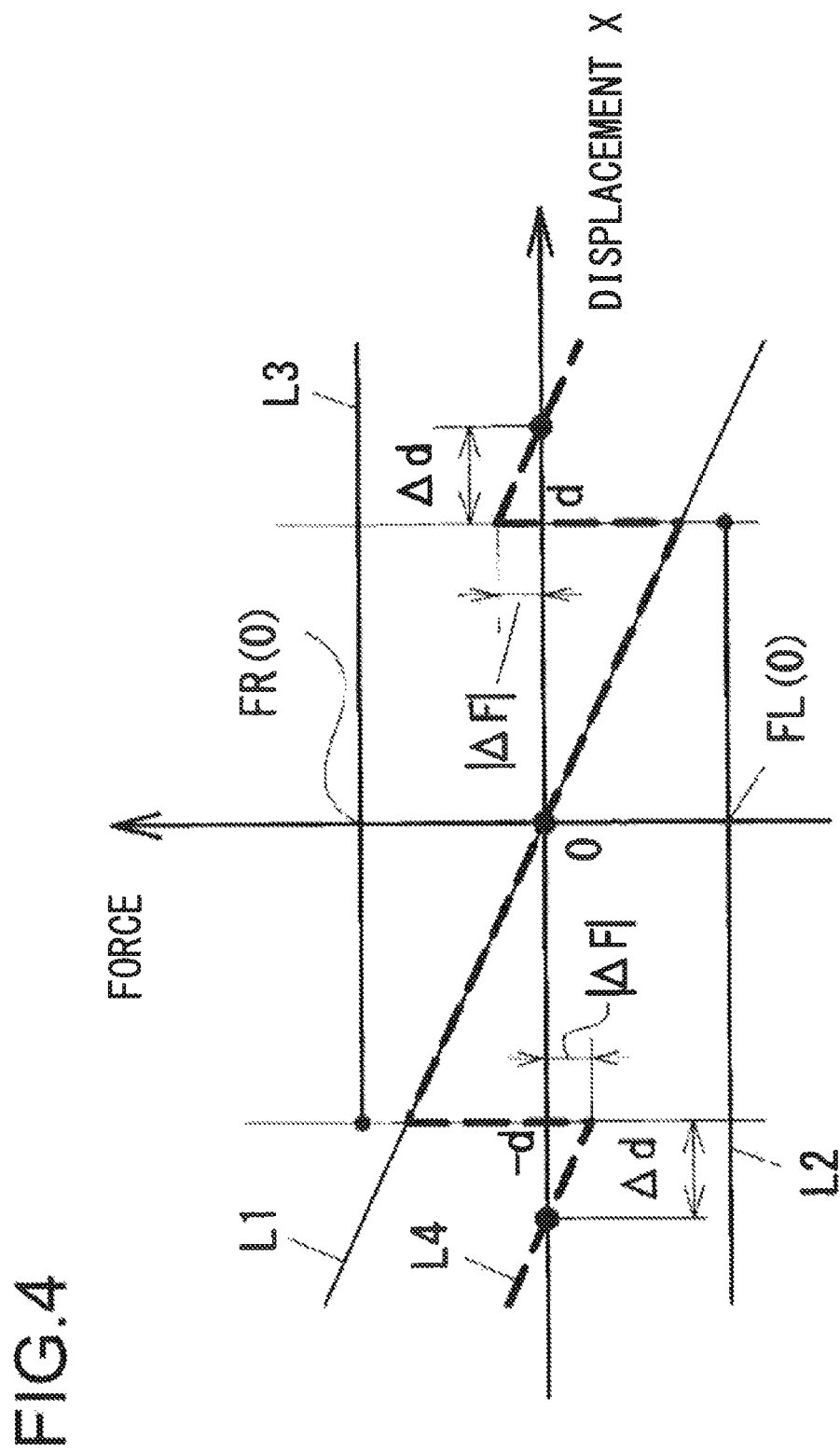
FIG. 4 is a drawing showing a relationship between displacement x and the force exerted on the movable part 5.

FIG. 4 is a diagram illustrating the relationship between the displacement x of the movable part 5 and the force exerted on the movable part 5 at V1=V2=0. The vertical axis represents force and the horizontal axis represents displacement x. In FIG. 4, a line L1 indicates an elastic force f exerted by the elastic support part 6. As described above, f(x)=−kx. A line L2 indicates an electrostatic force FL(0) generated by an electret voltage Ve of the electrodes 3A and 4A. Since the insertion amount of the electrodes 3A and 4A at the neutral position (x=0) is d, the electrostatic force FL(0) is generated when the displacement x is in the range of x<d. In the range of x≤d, the electrostatic force exerted by the electrodes 3A and 4A is zero. A line L3 indicates an electrostatic force FR(0) generated by the electret voltage Ve of the electrodes 3B and 4B. Since the insertion amount of the electrodes 3B and 4B at the neutral position (x=0) is d, the electrostatic force FR(0) is generated in the range of x>−d. In the range of x≤−d, the electrostatic force generated by the electrodes 3B and 4B is zero (0).

The total force acting on the movable part 5 is a combination of the electrostatic force and the elastic force, which is indicated by a line L4 in broken line. In the example shown in FIG. 4, the electrostatic forces FR(0) and FL(0) are set FR(0)=−FL(0). Hence, in the range of −d<x<d, the electrostatic force FR(0) in the positive direction and the electrostatic force FL(0) in the negative direction cancels each other, so that the total force is equal to the elastic force. Consequently, the displacement x=0 is a balanced position.

In the range of the displacement x being x≤−d, the comb teeth 400 of the second movable electrode 4B are out from between the comb teeth 300 of the second stationary electrode 3B and the insertion amount becomes zero (0). Accordingly, a force which is the combination of the electrostatic force FL(0) and the elastic force f(x)=−kx acts on the movable part 5. As a result, in the range of x≤−d, the line L4 corresponds to a line that passes a point with coordinates (−d, ΔF) having a slope of −k. ΔF is represented by the expression (3) below, which provides a negative value at x=−d.

$$\Delta F=-f(-d)+FL(0) \quad (3)$$

In the example shown in FIG. 4, the total force is set such that at x=−d, "(magnitude of elastic force)<(magnitude of electrostatic force)" is established, so that the line L4 crosses the horizontal axis at x=−d−Δd. That is, at x=−d−Δd, the elastic force and the electrostatic force generated by the electrodes 3A and 4A match with each other so that at the displacement x=−d−Δd, a stable state is established. Hereafter, the displacement x=−d−Δd is called a first stable position. If the total force is set such that at x=−d, "(magnitude of elastic force) (magnitude of electrostatic force)", the line L4 does not cross the horizontal axis at x<0, so that at x<0, no stable state occurs.

On the other hand, in the range of the displacement x being x≤d, the comb teeth 400 of the first movable electrode 4A are out from between the comb teeth 300 of the first stationary electrode 3A, so that the insertion amount becomes zero (0). As a result, a force of a combination of the electrostatic force FR(0) and the elastic force f(x)=−kx acts on the movable part 5. In the range of x≤d, the line L4 corresponds to a line that passes at a point with coordinates (d, ΔF) having a slope of −k. ΔF is represented by the expression (4) below.

$$\Delta F=-f(d)+FR(0) \quad (4)$$

The line L4 crosses the horizontal axis at $x=d+\Delta d$. That is, at $x=d+\Delta d$, the elastic force matches with the electrostatic force generated by the electrodes 3B and 4B to establish a stable state at the displacement $x=d+\Delta d$. Hereafter, the displacement $x=d+\Delta d$ is called a second stable position. If the total force is set such that "(magnitude of elastic force) (magnitude of electrostatic force)", then at $x>0$, the line L4 does not cross the horizontal axis, so that at $x>0$, no stable state occurs.

Figure 5:
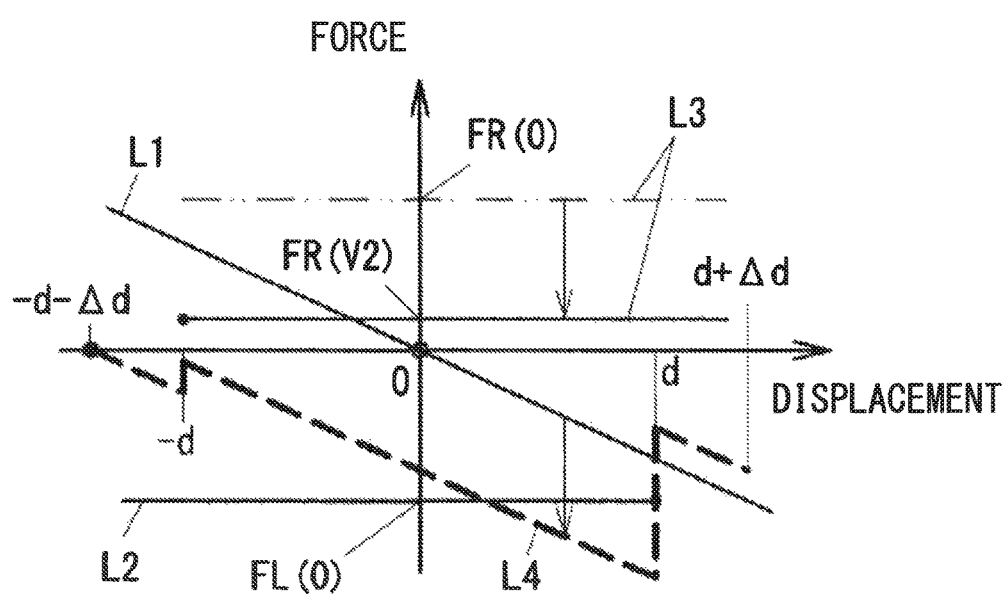
FIG. 5 is a drawing explaining a motion of the movable part 5 when it is displaced from the displacement x=0 to a first stable position.

In this embodiment, the movable part 5 is displaced between the first stable position and the second stable position. To achieve this, as an initial state, the movable part 5 needs to be displaced from the neutral position ($x=0$) as shown in FIG. 3 to the first stable position or the second stable position in advance. FIG. 5 is a diagram illustrating the motion of the movable part 5 when it is displaced from the neutral position ($x=0$) as shown in FIG. 3 to the first stable position. In this case, the applied voltage V2 is applied to the right side electrodes 3B and 4B from the direct-current power source 10B to make the total force at $-d-\Delta d<x\le 0$ negative as shown in FIG. 5. The voltage V2 of the direct-current power source 10B is set such that $V20<V2\le Ve$. The voltage V20 is a voltage which has a reverse polarity with respect to the voltage Ve generated by the electret and which satisfies "$FL(0)+FR(V20)-kd=0$". Application of the voltage V2 causes the lines L3, L4 in the range of $x>-d$ to be displaced downward by an amount of $FR(0)-FR(V2)$. As a result, the balanced position is changed to $x=-d-\Delta d$ and the movable part 5 is displaced from $x=0$ to $x=-d-\Delta d$ (first stable position). Subsequently, when the application of the voltage V2 is stopped, the line L4 representing the total force returns to the state shown in FIG. 4. That is, the actuator 1 is in the state shown in FIG. 1.

Figure 6:
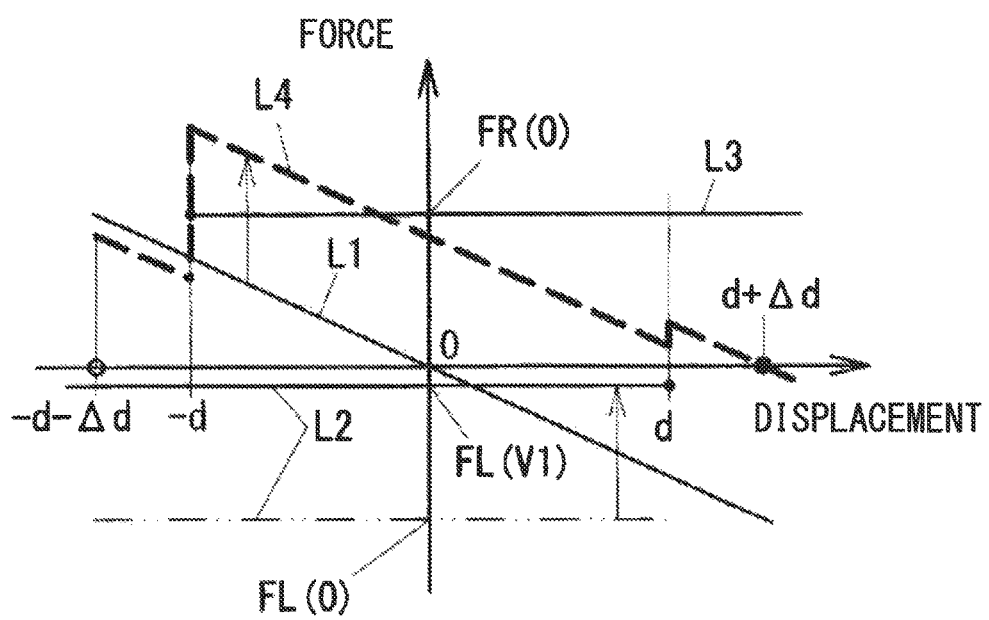
FIG. 6 is a drawing explaining displacement of the movable part 5 from a first stable position to a second stable position.

Then, explanation is made on the case in which displacement of the actuator 1 from the first stable position shown in FIG. 4 ($x=-d-\Delta d$) to the second stable position at $x=d+\Delta d$. In this case, the external voltage V1 from the direct-current power source 10A is applied to the electrodes 3A and 4A to make the total force (line L4) positive in the range of $-d-\Delta d\le x\le d+\Delta d$. The voltage V1 is a voltage having a reverse polarity with respect to the voltage Ve generated by the electret and is set such that $V10<V1\le Ve$. The voltage V10 satisfies "$FL(V10)+FR(0)-kd=0$". Application of the voltage V1 causes the line L4 representing the total force to be displaced upward as shown in FIG. 6 and the movable part 5 is displaced from $x=-d-\Delta d$ to $x=d+\Delta d$. Subsequently, when V1 is set to $V1=0$, the line L4 representing the total force returns to the state as shown in FIG. 4.

In the above, explanation is made on the example in which the elastic force of the elastic support part 6 is expressed by $f(x)=-kx$. However, if the actuator 1 is fabricated by processing a semiconductor substrate by MEMS fabrication technology as described later, internal stress occurs in the elastic support part 6. This sometimes makes it impossible to treat the deformation involved as simple elastic deformation. Specifically, compression stress occurs and a so-called buckled state appears. Accordingly, in a state in which no electrostatic force after the processing is present, the elastic support parts 6 are bent due to buckling and the movable part 5 is biased to some extent from the state of displacement $x=0$ as shown in FIG. 3 by an amount of xz rightward or by an amount of $-xz$ leftward. xz, $-xz$ indicate each displacement due to buckling.

Figure 7:
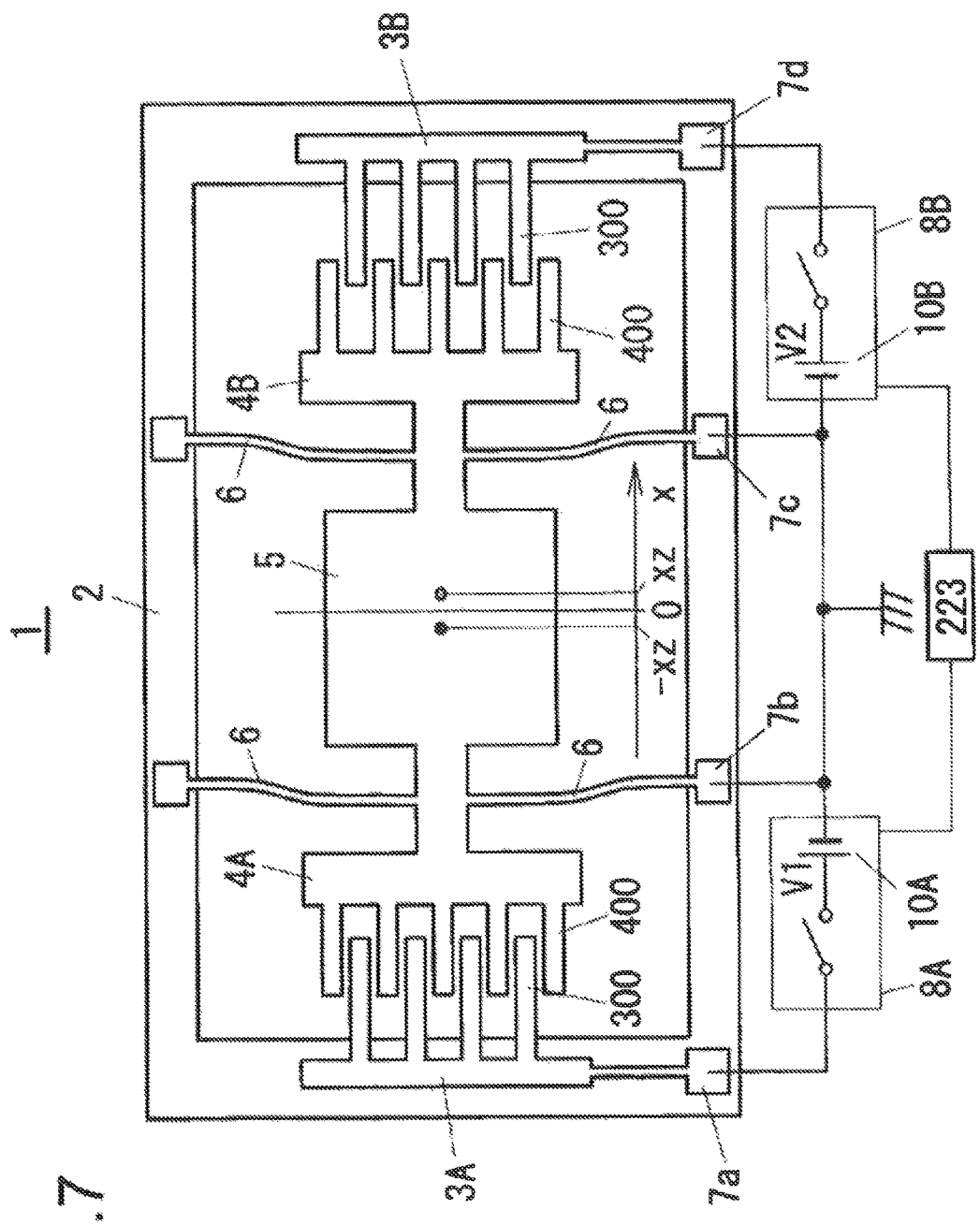
FIG. 7 is a drawing showing a state in which an elastic support part 6 is bent due to buckling.
Figure 8:
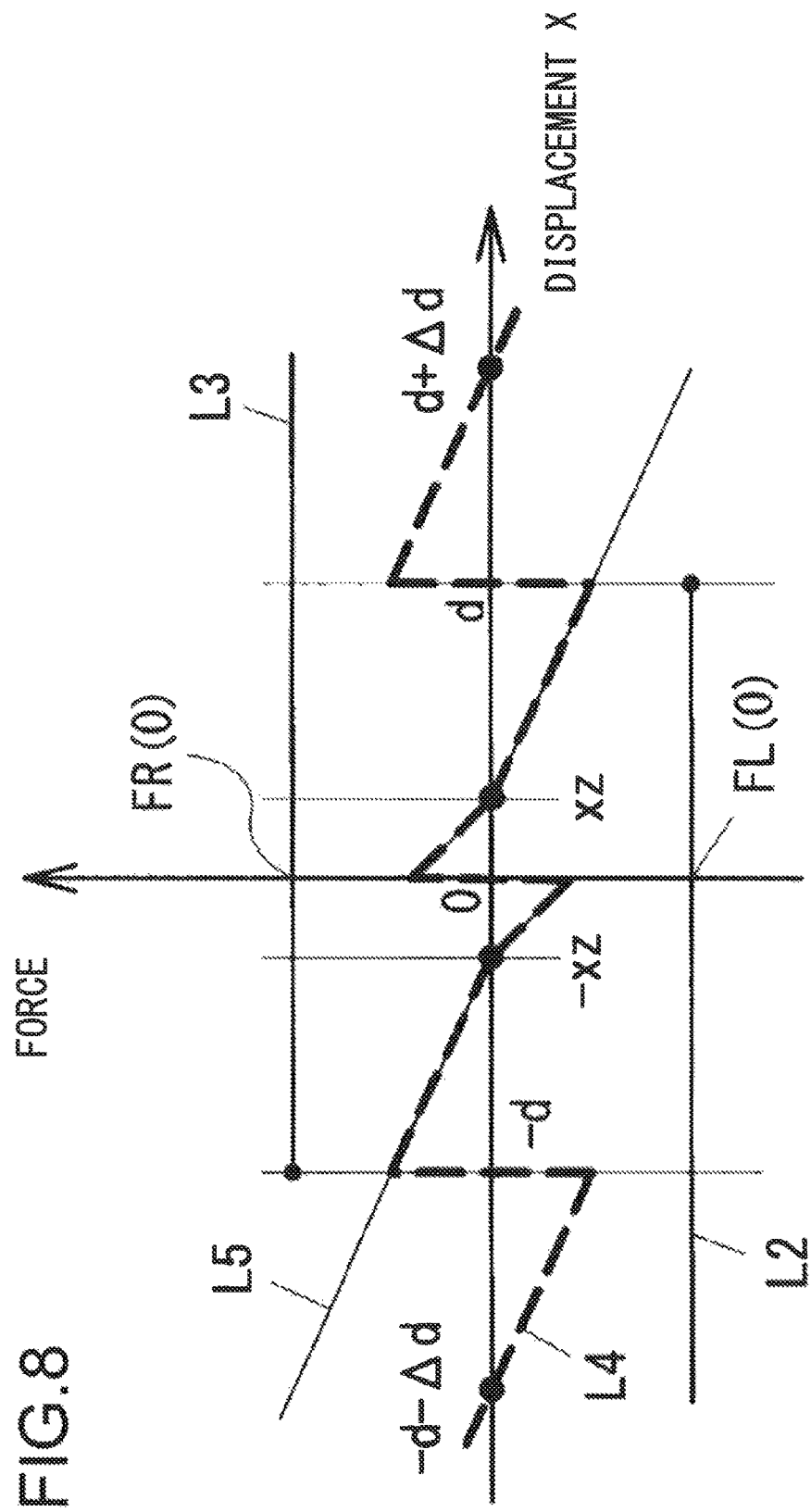
FIG. 8 is a drawing showing the relationship between the displacement and force when buckling occurs.

FIG. 7 shows a state in which the elastic support parts 6 are bent due to buckling. It is assumed that in this state too, the left side electrodes 3A and 4A and the right side electrodes 3B and 4B are still in a state in which they are mutually inserted. As stated above, the force $f(x)$ exerted by the elastic support part 6 when the buckling occurs is complicated. On the assumption that simply, in the ranges of $x>xz$ and $x<-xz$, the force $f(x)$ is proportional to displacement, the change of force in the buckling-occurring range $-xz\le x\le xz$ may be represented by a straight line like a line L5 as shown in FIG. 8. As a result, the total force becomes like the line L4 and if none of the voltages V1 and V2 is applied, balance is established at the positions indicated with filled circles (four positions).

To displace the movable part 5 from the buckling state as shown in FIG. 7 to the first stable position as shown in FIG. 1, the voltage V2 is applied to the right side electrodes 3B and 4B. For instance, if $V2=Ve$, then $FR(V2)=0$ and the movable part 5 is displaced to leftward due to the electrostatic force $FL(0)$. Since the electrostatic force $FL(0)$ is set so that the displacement at $x=-d$ satisfies $-FL(0)>f(-d)$, the movable part 5 is still displaced leftward after the insertion amount of the right side electrodes 3B and 4B reaches zero. As shown in FIG. 1, the electrostatic force and the elastic force match with each other at $x=-d-\Delta d$. This state is maintained, even if the switch 9 is turned off to set the applied voltage back to zero.

To displace the movable part 5 from the first stable position as shown in FIG. 1 to the second stable position, a voltage $V1=Ve$ is applied to the left side electrodes 3A and 4A. As a result, the electrostatic force that draws the movable part 5 leftward changes to $FL(V1)=0$ and the movable part 5 is displaced rightward due to the elastic force.

The force exerted by the elastic support part 6 acts in the positive direction (rightward direction) in the range of $x<-xz$. In the range from the buckling state in FIG. 7 (displacement $x=-xz$) to the displacement $x=0$, a force in the negative direction acts due to buckling. In the range from the displacement $x=0$ to the buckling state rightward (displacement=xz), a force in the positive direction acts due to buckling. Upon further displacement from the displacement $x=xz$ to rightward, a force in the negative direction acts.

When the movable part 5 is displaced rightward from the first stable position, the right side electrodes 3B and 4B are brought into an inserted state before buckling occurs. Accordingly, before the displacement x becomes $x=-xz$, the electrostatic force $FR(0)$ in the positive direction acts. Here, the electrostatic force $FR(0)$ in the positive direction is set to a value that is greater than that of the buckling force in the negative direction in the range of $-xz<x<0$ and the movable part 5 is displaced against the buckling force to the position $x=0$. At the moment when the displacement exceeds $x=0$, the movable part 5 is displaced to the position of displacement=xz due to the buckling of the elastic support part 6 rightward at once. Subsequently, the movable part 5 is further displaced rightward to a position at which the elastic force exerted by the elastic support part 6 matches with the electrostatic force $FR(0)$. Although explanation on details is omitted, further displacement from the second stable position to the first stable position is achieved by applying the voltage V2 to the right side electrodes 3B and 4B contrary to what is explained above.

As shown in FIG. 4, if the elastic force f exerted by the elastic support part 6 is expressed by $f=-kx$, the displacement $x=0$ is a stable position. However, if buckling occurs, four stable positions are present as shown in FIG. 8. In the above explanation, even in such a case, the movable part 5 is displaced between outer stable positions ($x=d+\Delta d$ and $x=-d-\Delta d$). However, the movable part 5 may be displaced between inner stable positions (x=xz and x=−xz). Upon fabricating the actuator 1 by the MEMS fabrication technology, it may be formed in the shape as shown in FIG. 7 from the beginning. In this case, buckling is present without fail.

(Method for Fabricating the Actuator 1)

Explanation is made on an example of the method for fabricating the actuator 1 with reference to FIGS. 9 to 16. FIGS. 9 to 16 show approximately a left half of the actuator 1 shown in FIG. 1. The actuator 1 shown in FIG. 1 is fabricated by using an SOI (Silicon on Insulator) substrate according to a conventional MEMS fabrication technology. The SOI substrate includes an upper Si layer 33, a $SiO_2$ layer 32, and a lower Si layer 31. The SOI substrate is fabricated by forming a SiO2 on one of the two Si monocrystal plates and bonding the layers so that the $SiO_2$ layer is sandwiched by the Si layers. In some cases, the Si substrate that is doped as necessary is used to increase the adhesion of a portion of the Si substrate, which will form a connection pad part, to metal or to improve the conductivity of such portion. Either P-type or N-type doping may be used in the present invention without any problem.

Figure 9:
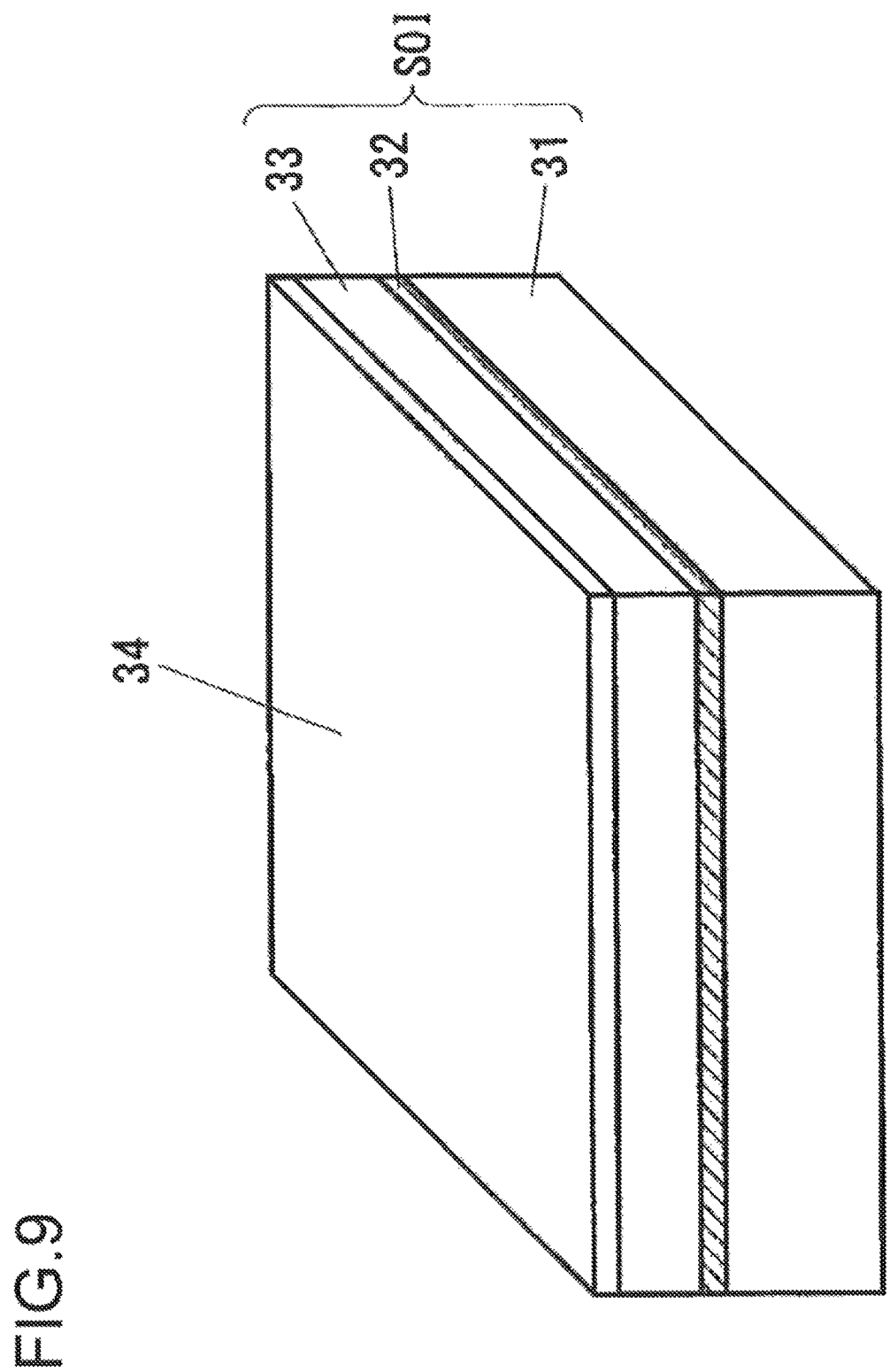
FIG. 9 is a diagram illustrating a first step of a formation method.
Figure 10:
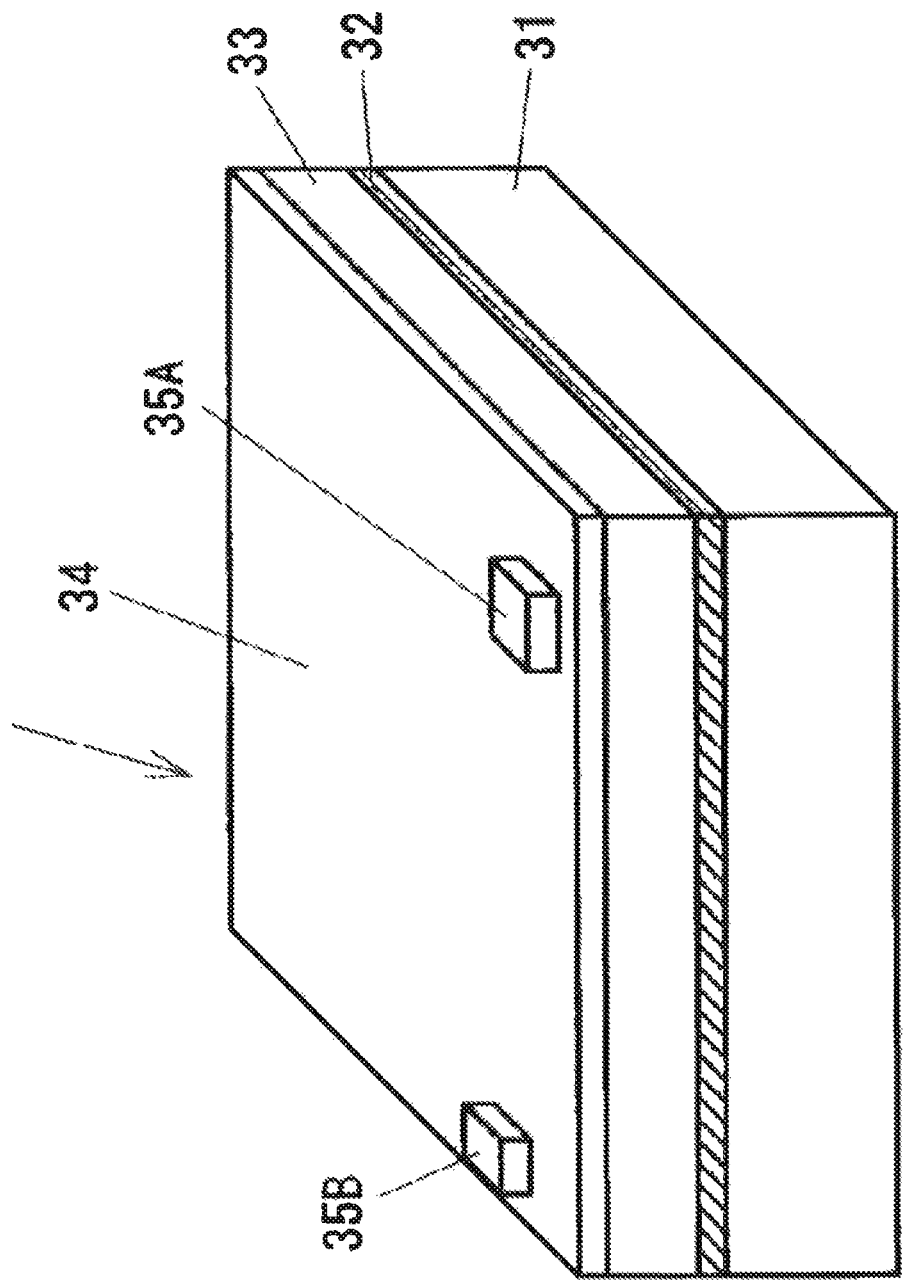
FIG. 10 is a diagram illustrating a second step of the formation method.

In the first step shown in FIG. 9, a nitride film ($Si_3N_4$) 34 is formed on the Si layer 33 by using chemical vapor deposition (CVD). In the second step shown in FIG. 10, a resist is coated on the nitride film 34 and resist patterns 35A and 35B for forming connection pad parts 7a and 7b of the electrodes 3A and 4A are formed by using photolithography. Then, in the third step, the substrate is etched from the front side by using RIE (for instance, ICP-RIE) or the like to remove a portion of the nitride film 34 other than the portion at which the resist patterns 35A and 35B are formed (FIG. 11).

Figure 11:
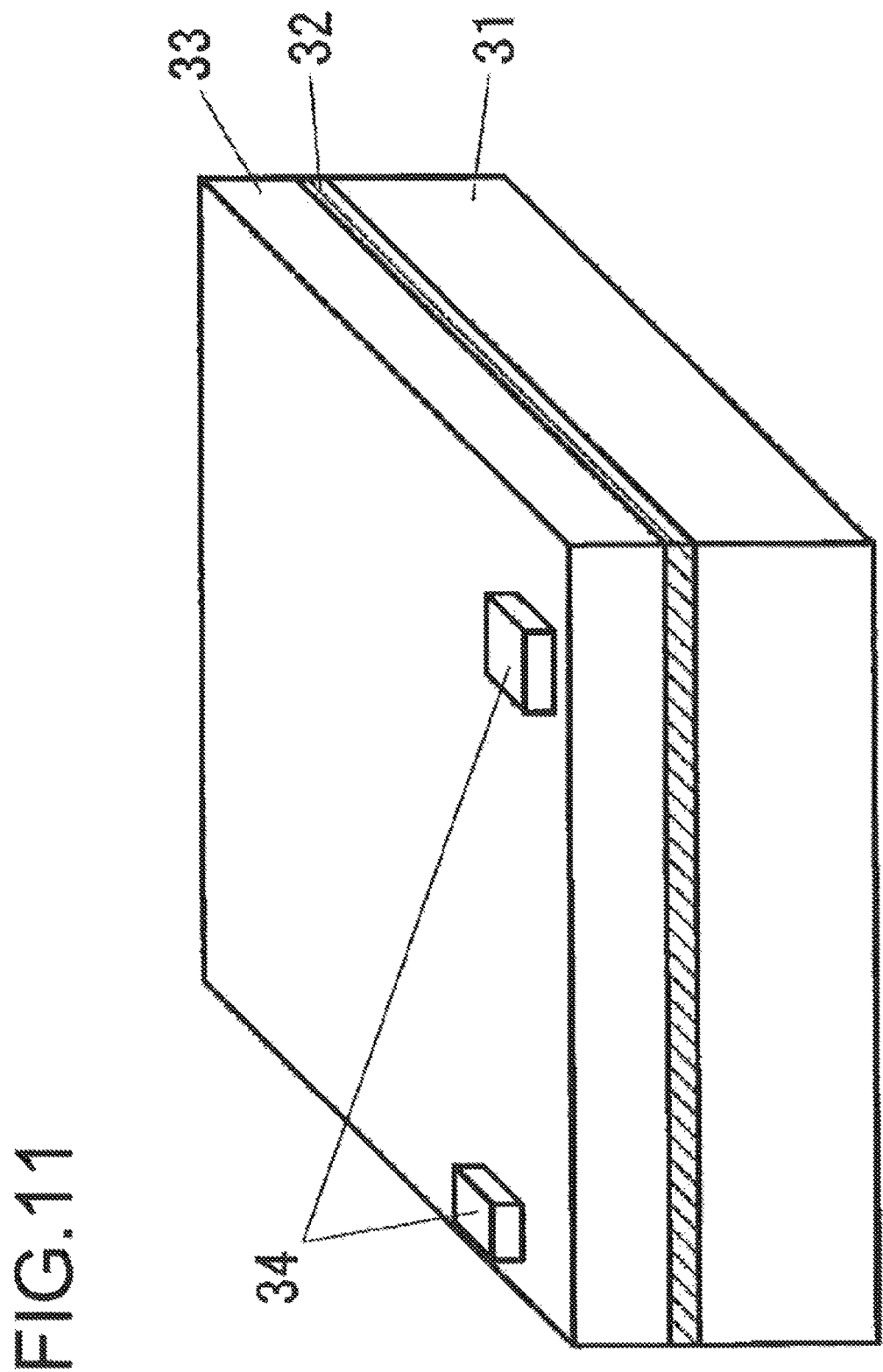
FIG. 11 is a diagram illustrating a third step of the formation method.
Figure 12:
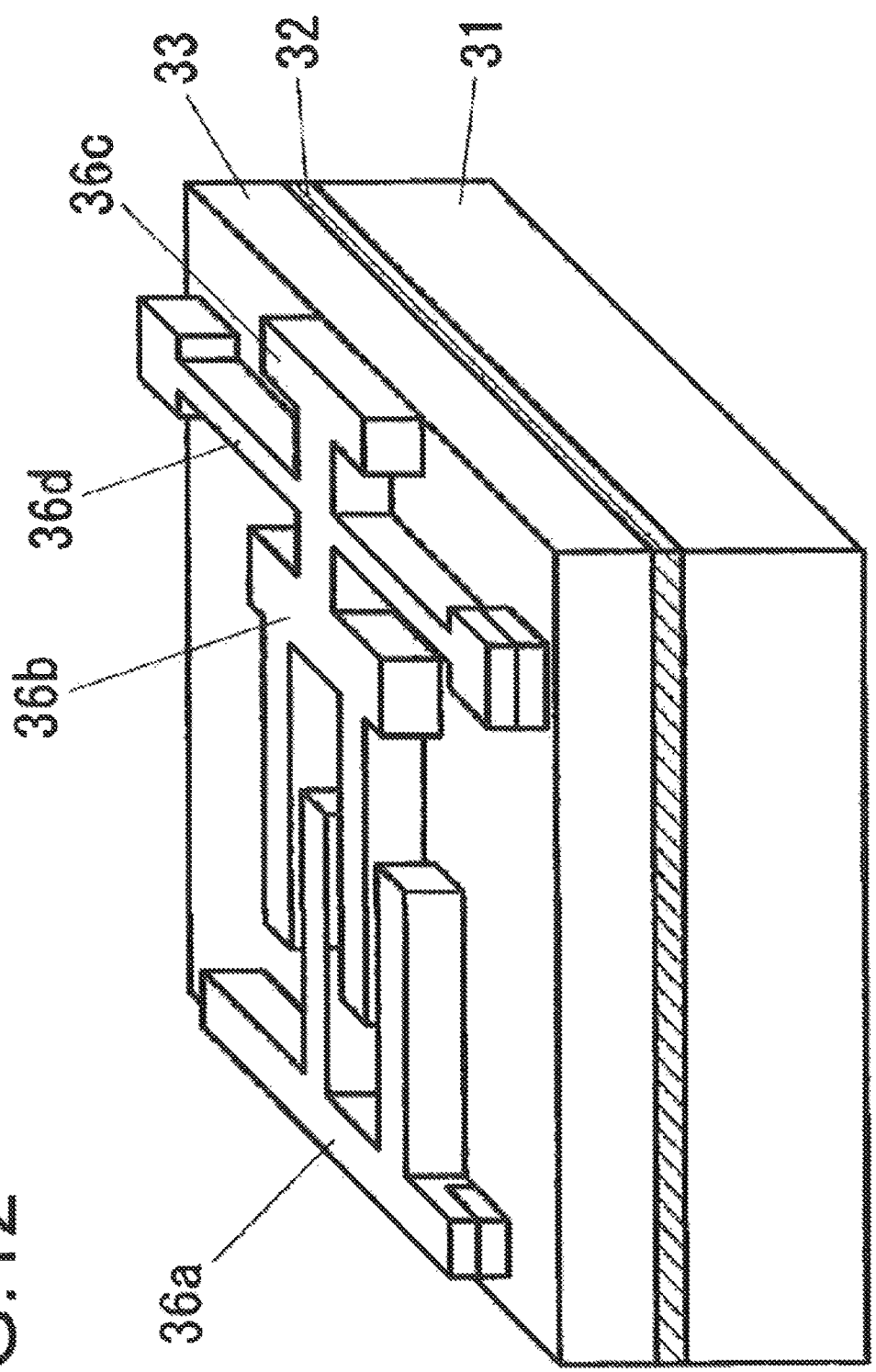
FIG. 12 is a diagram illustrating a fourth step of the formation method.

In the fourth step shown in FIG. 12, a resist is coated on the substrate shown in FIG. 11 and resist patterns 36a, 36b, 36c, and 36d for forming the electrodes 3A and 4A, the movable part 5, and the elastic support part 6 are formed by using photolithography.

Figure 13:
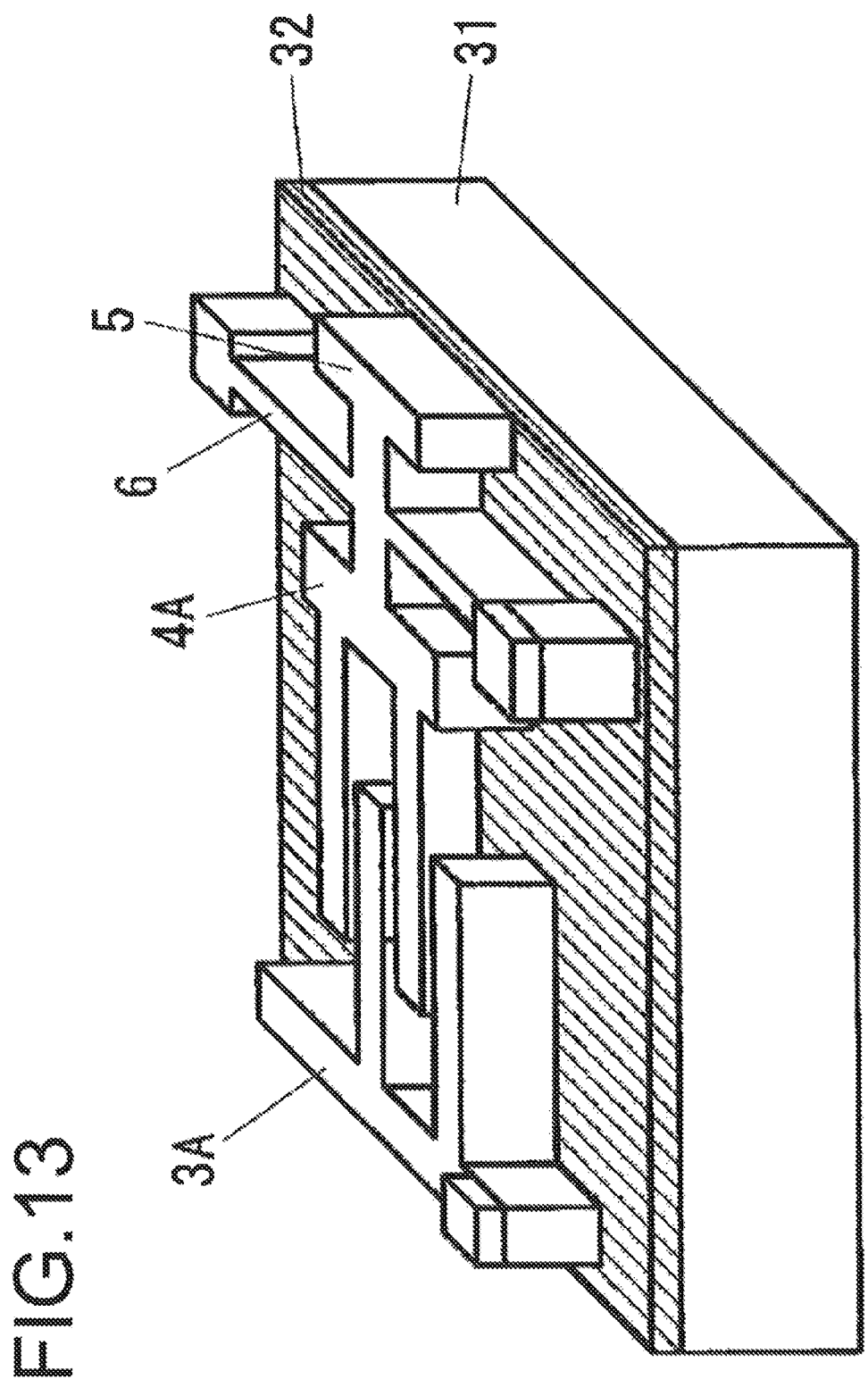
FIG. 13 is a diagram illustrating a fifth step of the formation method.

In the fifth 5 step shown in FIG. 13, the Si layer 33 is etched by using RIE or the like and subsequently, the resist pattern 36a to 36d are removed. As a result, the electrodes 3A and 4A, the movable part 5, and the elastic support part 6 are formed on the $SiO_2$ layer 32.

Figure 14:
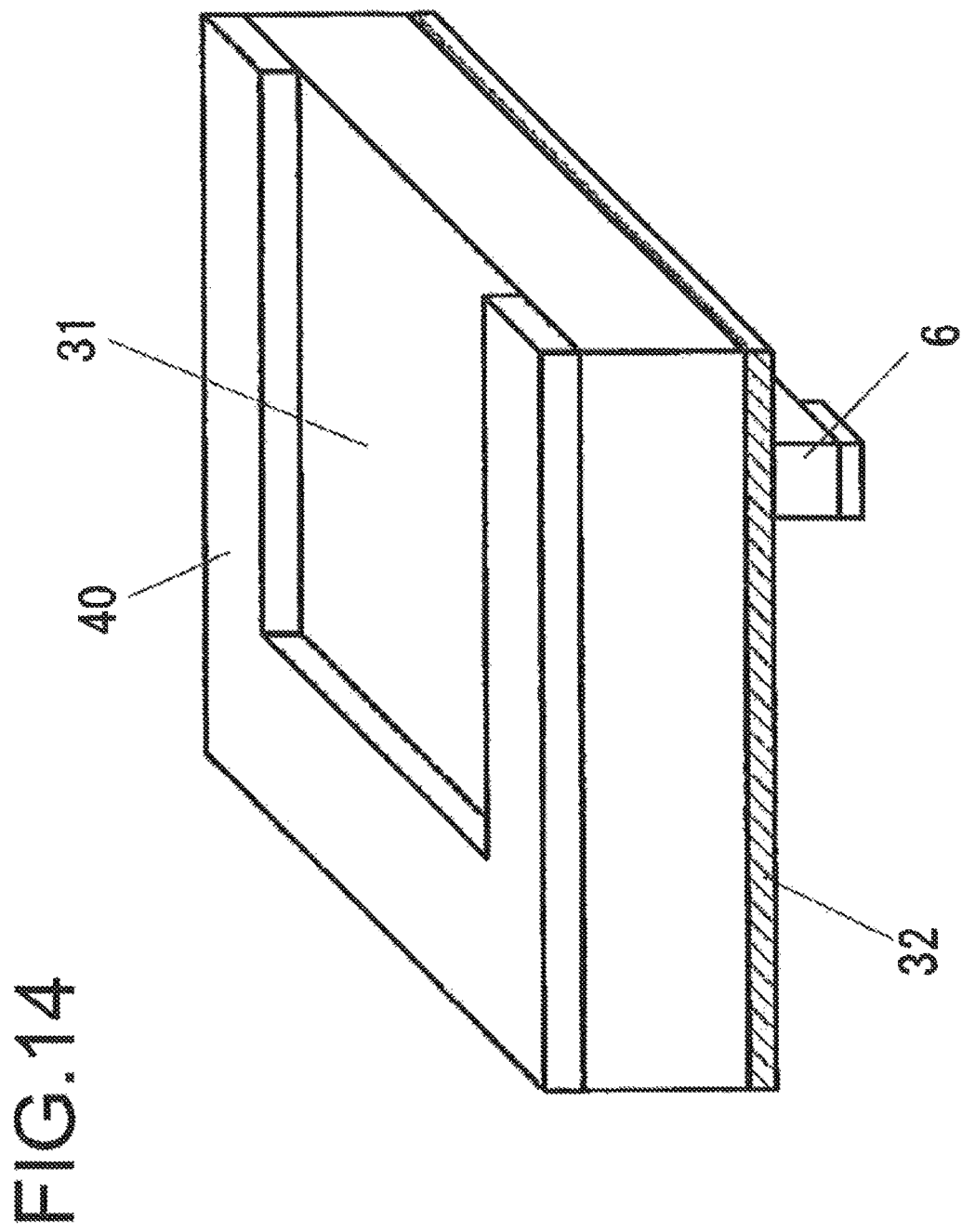
FIG. 14 is a diagram illustrating a sixth step of the formation method.
Figure 15:
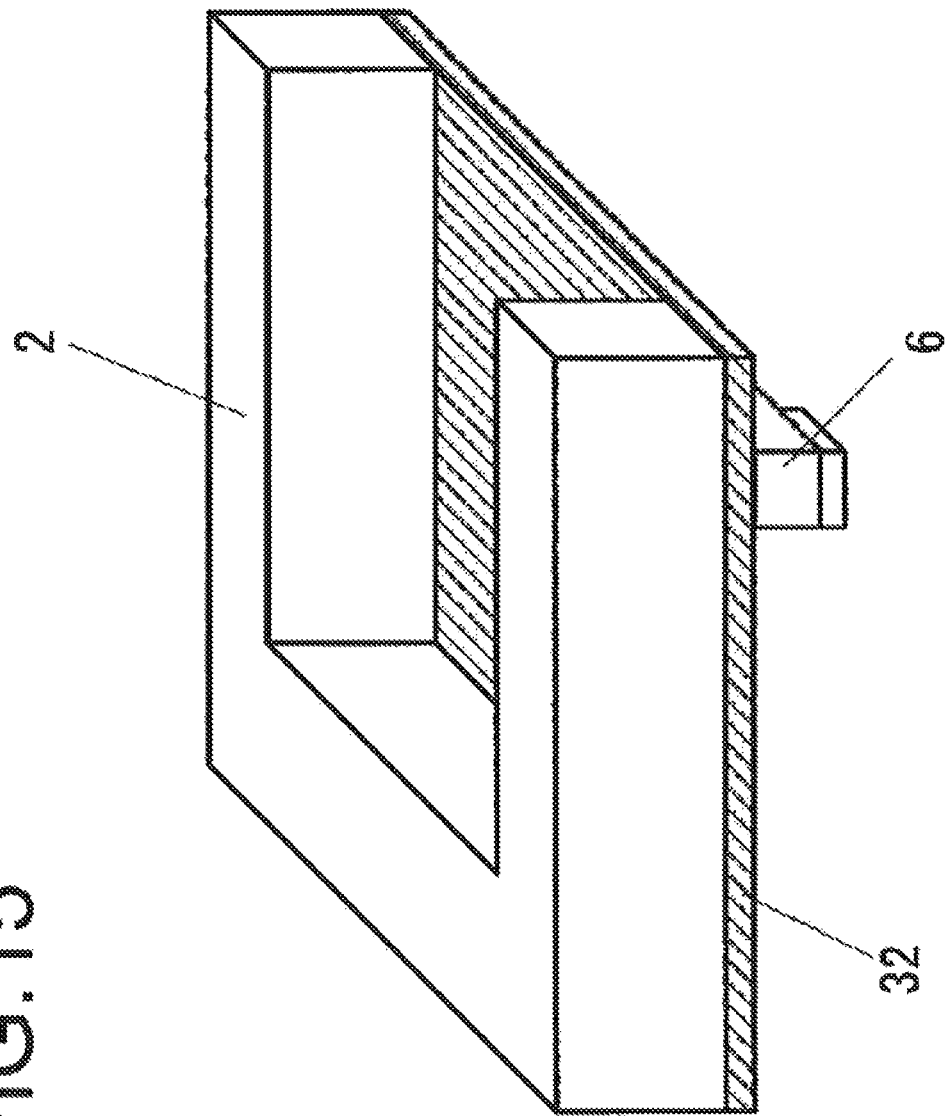
FIG. 15 is a diagram illustrating a seventh step of the formation method.
Figure 16:
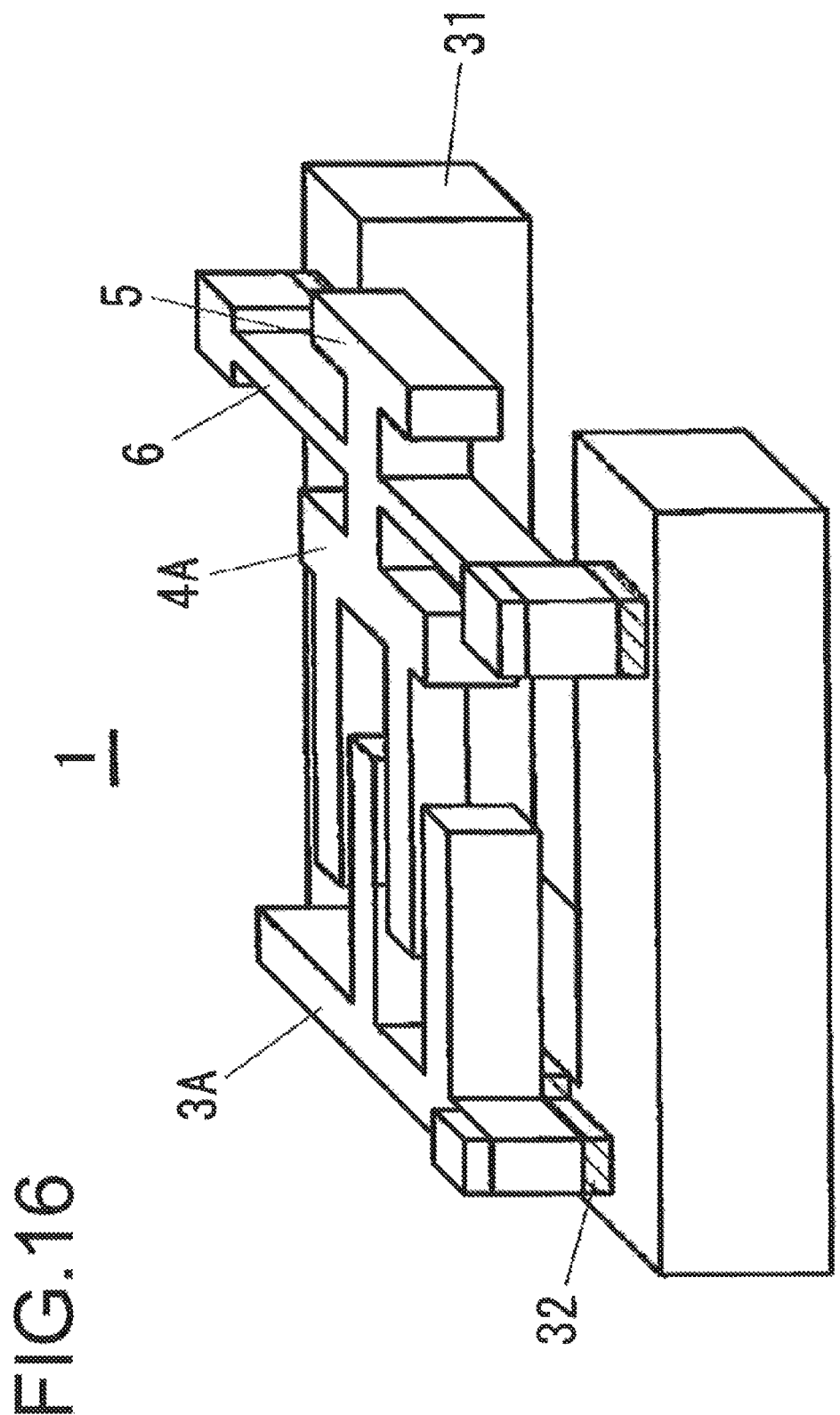
FIG. 16 is a perspective view showing an actuator 1.

In the sixth 6 step as shown in FIG. 14, on the rear side of the substrate, that is, on the Si layer 31, is formed a resist pattern 40 for forming a base part. Subsequently, in the seventh step shown in FIG. 15, the Si layer 31 is etched by using RIE or the like to form the base 2. Then, the exposed $SiO_2$ layer 32 is etched with a buffered hydrogen fluoride solution to complete the actuator 1 as shown in FIG. 16.

(Method for Forming an Electret)

Figure 17:
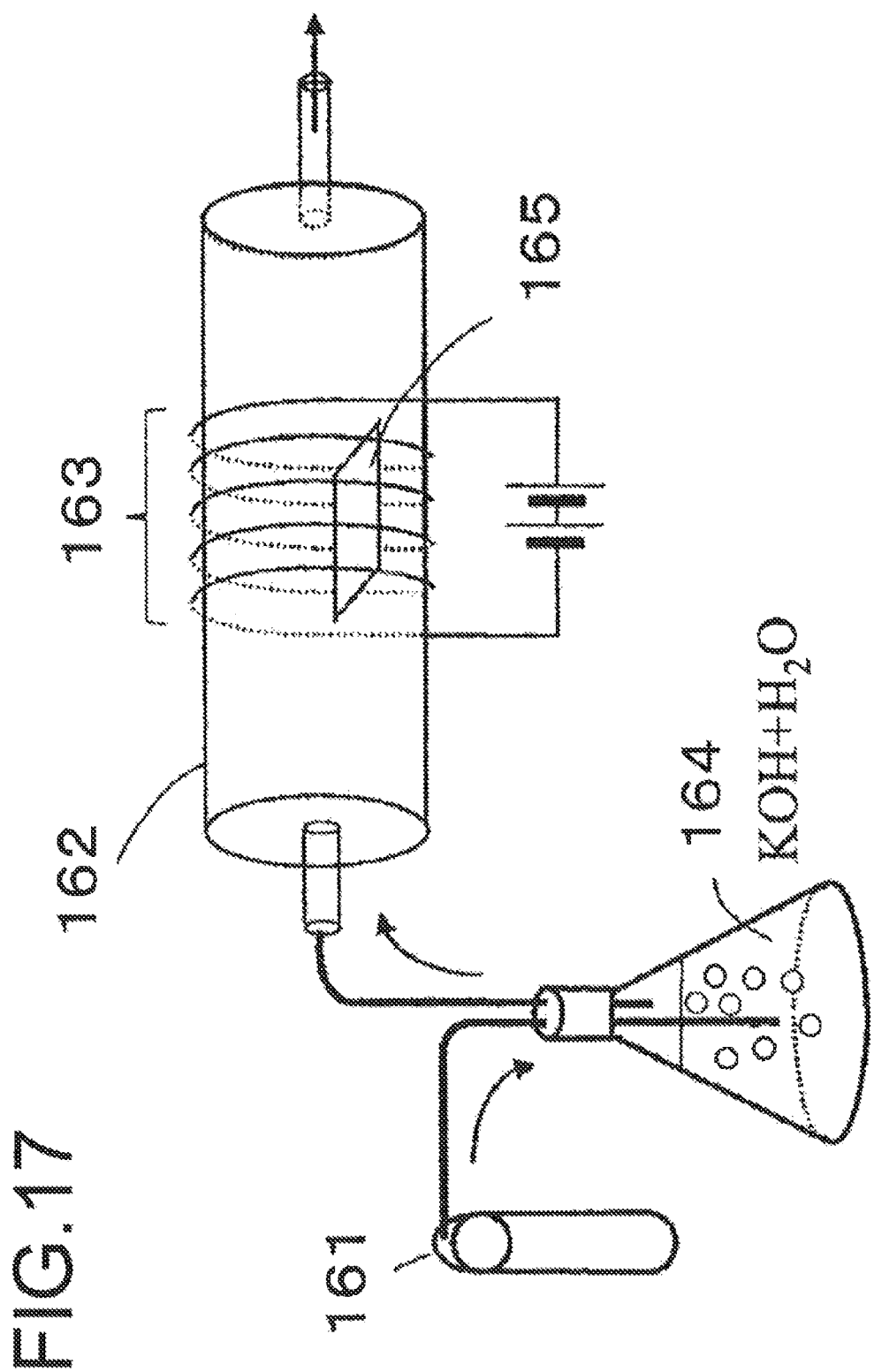
FIG. 17 is a diagram illustrating the method for forming an electret on the comb teeth 300 and 400.
Figure 18:
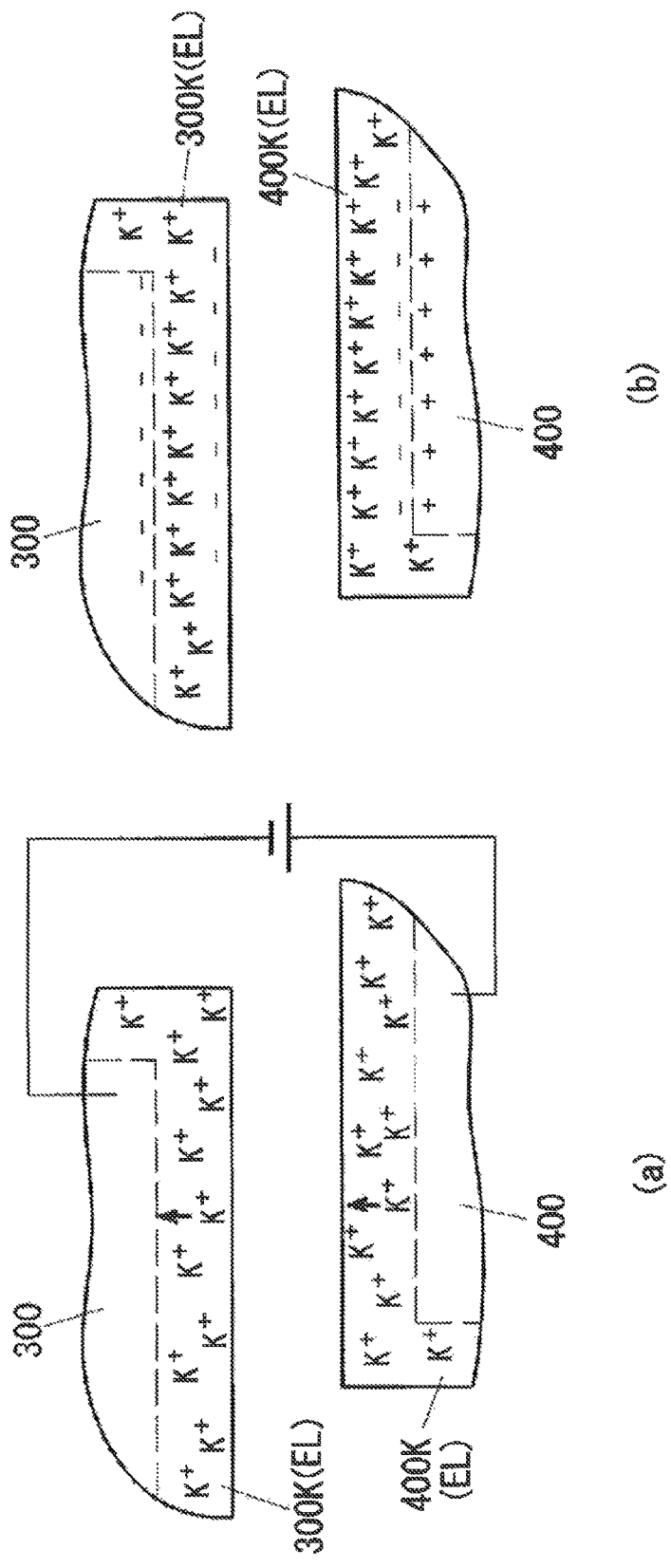
FIG. 18 shows diagrams illustrating charging processing.

To form electrets at the comb teeth 300 and 400, for instance, the method described in JP 2013-13256 A, i.e., (Bias-Temperature method: B-T method) may be used. FIGS. 17 and 18 are each a diagram illustrating the method for forming an electret on each of the comb teeth 300 and 400. Here, a silicon oxide film ($SiO_2$) containing K$^+$ ions is formed on the surfaces of the comb teeth 300 and 400 made of the Si layer 33 and the formed silicon oxide film is charged for use as an electret.

In FIG. 17, a sample 165 is a substrate at which the actuator 1 is formed. In an oxidation furnace 162 in which the sample 165 is accommodated is supplied with nitrogen gas containing vapor of an aqueous KOH solution. The nitrogen gas containing the vapor of the aqueous KOH solution is obtained by dissolving KOH in deionized water, warming the resultant solution on a hot bath, and bubbling nitrogen gas (carrier gas) 161 into the warmed aqueous KOH solution 164. When the sample 165 is heated by a heater 163, silicon is thermally oxidized to form a $SiO_2$ layer containing K$^+$ ions on the surface of the Si layer 31 that constitutes the comb teeth 300 and 400.

Subsequently, to positively charge the $SiO_2$ layer formed in the comb teeth 400, a voltage is applied to between the comb teeth 400 and the comb teeth 300 while heating the sample 165 at high temperatures. FIG. 18 is a diagram illustrating the charging processing, schematically showing a part of the comb teeth 300 and 400 upon the charging process. In the example shown in FIG. 18, the electret of the comb teeth 400 is positively charged, with the comb teeth 400 side being at a higher potential than the comb teeth 300 side.

Near the surface of the comb teeth 300 and 400 are formed $SiO_2$ layers 300K and 400K, respectively, containing K$^+$ ions made from the Si layer 33. K$^+$ ions distribute all over the formed $SiO_2$ layers 300K and 400K. In such a state, when the voltage is applied while heating as shown in FIG. 18, a force due to the electric field acts on the K$^+$ ions to displace them along the direction of the electric field. As a result, in the $SiO_2$ layer 400K of the comb teeth 400, the K$^+$ ions distribute near the surface of the $SiO_2$ layer 400K to make it to be charged positively. Conversely, the $SiO_2$ layer 300K of the comb teeth 300 is negatively charged near its surface.

Here, explanation is made on the example in which K$^+$ ions are used to form the electret, however, positive ions other than K$^+$ ions may also be used to form the electret structure according to the present invention. In particular, use of alkali ions (alkali metal ions, alkaline earth metals) having relatively large ion radii enables the formed electret to have less displacement of ions, thereby providing an electret having a relatively long surface potential retention time. An aqueous solution containing alkali ions other than K$^+$ ions is used instead of the aqueous potassium hydroxide solution in the above-explained wet oxidation.

As mentioned above, in this embodiment, the actuator 1 is configured as follows. That is, the first movable electrode 4A is drawn in by the first stationary electrode 3A to a position at which the insertion amount of the second movable electrode 4B with respect to the second stationary electrode 3B is 0 (zero) to make the electrostatic force generated by the electret of the electrodes 3A and 4A match with the elastic force exerted by the elastic support part 6, which position or point is set as a first stable position (x=−d−ΔM). The second movable electrode 4B is drawn in by the second stationary electrode 3B to a position at which the insertion amount of the first movable electrode 4A with respect to the first stationary electrode 3A is 0 (zero) to make the electrostatic force generated by the electret of the electrodes 3B and 4B match with the elastic force exerted by the elastic support part 6, which position or point is set as a second stable position (x=d+Δd). And, application of the voltage V1 to between the first stationary electrode 3A and the first movable electrode 4A by the first actuation unit 8A to weaken the electrostatic force causes the movable part 5 to be displaced from the first stable position to the second stable position. Conversely, application of a voltage V2 to between the second stationary electrode 3B and the second movable electrode 4B by the second actuation unit 8B to weaken the electrostatic force causes the movable part 5 to be displaced from the second stable position to the first stable position.

As mentioned above, the electrodes 3A, 3B, 4A and 4B are made of the upper Si layer 33 of the SOI substrate (see FIG. 9). As a result, the movable part 5 provided with these electrodes is displaced by the electrostatic force to slide in the x-axis direction in the same plane as the upper Si layer 33 (see, FIG. 1). This enables an actuator of a bistable structure to have a relatively small thickness regardless of the amount of displacement of the movable part 5. The actuator according to this embodiment can be fabricated with ease by the MEMS fabrication technology from one and the same substrate as explained with reference to FIGS. 9 to 16 because the movable part 5 has a structure that allows planar arrangement of the electrodes 3A, 3B, 4A and 4B. As a result, it is unnecessary to connect a plurality of substrates unlike the actuator described in the PTL 1.

Comb-teeth electrodes are configured such that the movable side comb teeth are displaced by sliding with respect to the stationary side comb teeth. From a perspective of the movement of the overall electrode constituted by a plurality of comb teeth, like the stationary electrode and the movable electrode, the x-axis direction in FIG. 1 is the displacement direction of the movable electrode and the distance between the electrodes 3A and 4A along this displacement direction is deemed to be an inter-electrode distance between the electrodes. For instance, the distance between the front face of the comb teeth 300 and the electrode 4A which is opposite to the front surface of the comb teeth 300 is defined to be an inter-electrode distance. That is, in the case of the comb-teeth electrodes, like the parallel plate electrodes, the movable electrode is displaced by sliding in a direction in which the inter-electrode distance changes.

In the parallel-plate electrostatic actuator, the electrodes move so that the inter-electrode distance is changed. In the comb teeth electrostatic actuator, the electrodes move so that the insertion amount of electrodes formed by side walls of the comb teeth (insertion amount of comb teeth) is changed; use of comb teeth having a larger teeth length to broaden the range in which the insertion amount changes enables an actuator with a larger stroke to be configured with ease. In addition, use of the comb-teeth structure enables an electrode area (area of any two adjacent comb teeth facing each other) to be increased in a small space and enables the comb-teeth electrostatic actuator to provide a larger electrostatic force than the parallel-plate electrostatic actuator or the like.

The electrostatic attraction force is generated by the electrets formed at least one of the array of the comb teeth 300 and the array of the comb teeth 400. The application of respective voltages by the first and second actuation units 8A and 8B has to be performed only when it is desired to displace the movable part 5 between two stable positions. That is, to retain the movable part 5 at the stable position, it is unnecessary to apply any voltage. This enables power to be saved as compared with the actuator that requires continuous application of voltage to maintain its displaced state (stable state).

Figure 55:
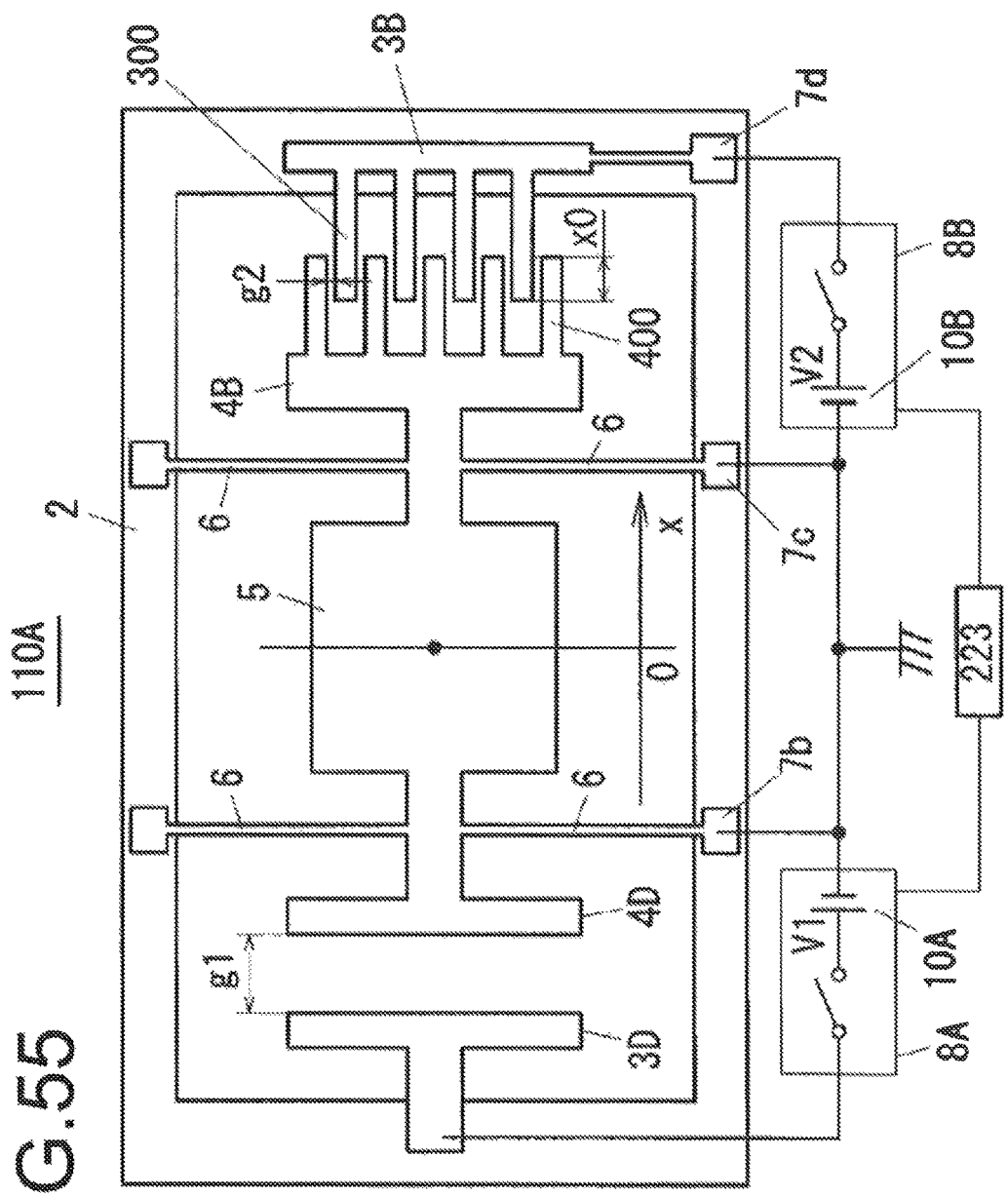
FIG. 55 is a diagram showing an actuator 110A that includes a comb-teeth type electrode and a flat plate type electrode.

In the above-mentioned embodiment, the electrodes 3A and 4A of an comb-teeth structure and the electrode 3B and 4B of an comb-teeth structure are provided on the both sides of the movable part 5 horizontally in the figure. However, like the actuator 110A as shown in FIG. 55, one of the comb-teeth electrodes may be replaced by parallel-plate electrodes to achieve a similar bistable structure. In FIG. 55, parallel-plate electrodes constituted by electrode plates 3D, 4D are provided on the left side of the movable part 5. The electrode plate 3D is fixed to the base 2 and is connected with the first actuation unit 8A. On the other hand, the electrode plate 4D is fixed to the movable part 5 and is displaced integrally with the movable part 5 in the horizontal direction in the figure by sliding. This changes a gap g1. In the areas of the electrode plates 3D and 4D facing each other are formed respective electrets. The electrets may be formed at only one of the electrode plates 3D and 4D. The electrodes 3B and 4B shown on the right side in the figure have respective structures similar to those of the electrodes 3B and 4B as shown in FIG. 1, with the insertion amount upon displacement at x=0 being set to x0.

Also, the electrode plates 3D, 4D as shown in FIG. 55 are formed from the upper Si layer 33 of the SOI substrate (see FIG. 9) in the same manner as that in the case of the electrodes 3B and 4B. This causes the movable part 5, which includes the movable electrode 3B and the electrode plate 3D, to be displaced by sliding by the electrostatic force in the x-axis direction in a plane same as the upper Si layer 33 (see FIG. 55).

Also, in the actuator 110A shown in FIG. 55, the elastic force exerted by the elastic support part 6 at the displacement x is approximated by −kx assuming that the spring constant is k. Upon the displacement (x<−x0) in which the insertion amount of the comb teeth 400 with respect to the comb teeth 300 is zero, the electrostatic force generated by the electrodes 3B and 4B is zero and only the electrostatic force generated by the electrode plates 3D and 4D, which are parallel-plate electrodes, acts. This electrostatic force is expressed by the following expression (5). In the expression (5), Ve1 represents a voltage generated by the electret. V1 represents a voltage applied by the first actuation unit 8A, which has a reverse polarity with respect to Ve1, serving to weaken the electrostatic force. Consequently, if the voltage V1 that has a value equal to that of Ve1 is applied, the numerator in the expression is equal to zero (=0) and the electrostatic force is 0 accordingly. A represents the area of sides of the electrode plates 3D and 4D facing each other (electrode area).

$$-\varepsilon_0 A(Ve1-V1)^2/2(g1+x)^2 \tag{5}$$

At the displacement (−x 0≤x), acts the electrostatic force generated by the electrodes 3B and 4B in addition to the electrostatic force generated by the electrode plates 3D, 4D expressed by the expression (5). Since the electrostatic force generated by the electrodes 3B and 4B are expressed similarly to the expression (2) above, upon the displacement (−x 0≤x) the electrostatic force represented by the following expression (6) acts.

$$N\varepsilon_0 b(Ve2-V2)^2/g2 - \varepsilon_0 A(Ve1-V1)^2/2(g1+x)^2 \tag{6}$$

Figure 56:
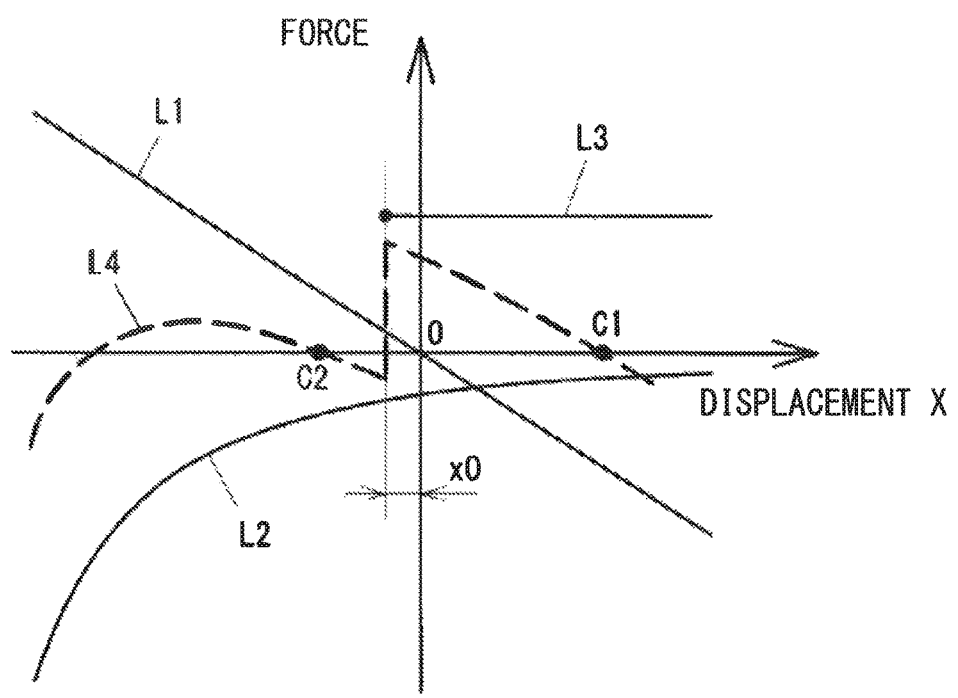
FIG. 56 is a diagram illustrating the elastic force, the electrostatic force exerted by electrode plates 3D and 4D, the electrostatic force exerted by electrodes 3B and 4B, and the total force at the actuator 110A.

FIG. 56 is a diagram illustrating the elastic force (line L1), the electrostatic force (line L2) generated by the electrode plates 3D and 4D, the electrostatic force (line L3) generated by the electrodes 3B and 4B, and the total force (line L4) for displacement x when the applied voltages V1 and V2 are each zero. The points C1 and C2 at which the line L4 crosses the horizontal axis are stable equilibrium points. That is, the actuator 110A as shown in FIG. 55 is an actuator having a bistable structure.

FIG. 57 shows diagrams illustrating the operation of displacement between the stable positions, with (a) illustrating the displacement of the movable part 5 from the stable position C2 to the stable position C1 and (b) illustrating the displacement of the movable part 5 from the stable position C1 to the stable position C2. When the movable part 5 is at the stable position C2, x<−x0 and thus the electrostatic force according to the expression (5) at V1=0 acts. This electrostatic force matches with the elastic force. From this, to cause the displacement from the stable position C2 to the stable position C1, the voltage V1=Ve1 is applied to the electrode plates 3D and 4D to make the electrostatic force represented by the expression (5) zero. As a result, the total electrostatic force (line L4) changes from a chain double dashed line as shown in FIG. 57 (a) to the line L4, which is a broken line. On the movable part 5 is exerted a force in the positive direction (the right direction in FIG. 55). Thus, the movable part 5 is displaced to a position indicated by an open circle at which the line L4 crosses the horizontal axis. Thereafter, when application of the voltage V1 is stopped, the total force changes to the line L4, which is a chain double dashed line, so that the movable part 5 is displaced from the position indicated by the open circle to the stable position C1.

On the other hand, when the movable part 5 is at the stable position C1, the electrostatic force according to the expression (6) at V1=V2=0 acts, so that the electrostatic force matches with the elastic force. To displace the movable part 5 from the stable position C1 to the stable position C2, the voltage V2=Ve2 is applied to the electrodes 3B and 4B. Then the first term in the expression (6) becomes zero, so that the total force becomes the sum of the elastic force and the electrostatic force generated by the electrets of the electrode plates 3D, 4D as shown by the line L4, which is a broken line, as shown in FIG. 57 (b). As a result, on the movable part 5 acts a force in the negative direction (the leftward direction in FIG. 55) to displace the movable part 5 to the stable position C2.

In the embodiment shown in FIG. 1, the movable part 5 is provided with the electrodes 3A and 4A of an comb-teeth structure and the electrodes 3B and 4B of a comb-teeth structure on the left and right sides, respectively, of the movable part 5 to enable displacement in the horizontal direction in the figure. However, even the structure that includes one set of comb-teeth electrodes (the first stationary electrode 3A and the first movable electrode 4A) may be configured to be an actuator 110B of a bistable structure as shown in FIG. 58.

FIG. 58 (a) illustrates the actuator 110B with its movable part 5 being located at a stable position (first stable position) on the left side in the figure. FIG. 58 (b) illustrates the actuator 110B with its movable part 5 being located at a stable position (second stable position) on the right side in the figure. In FIG. 58, the second actuation unit 8B is configured to apply a negative voltage (−V2) to the movable electrode 4A. In FIG. 58, illustration of the switches 9 in the first actuation unit 8A and in the second actuation unit 8B is omitted.

Figure 59:
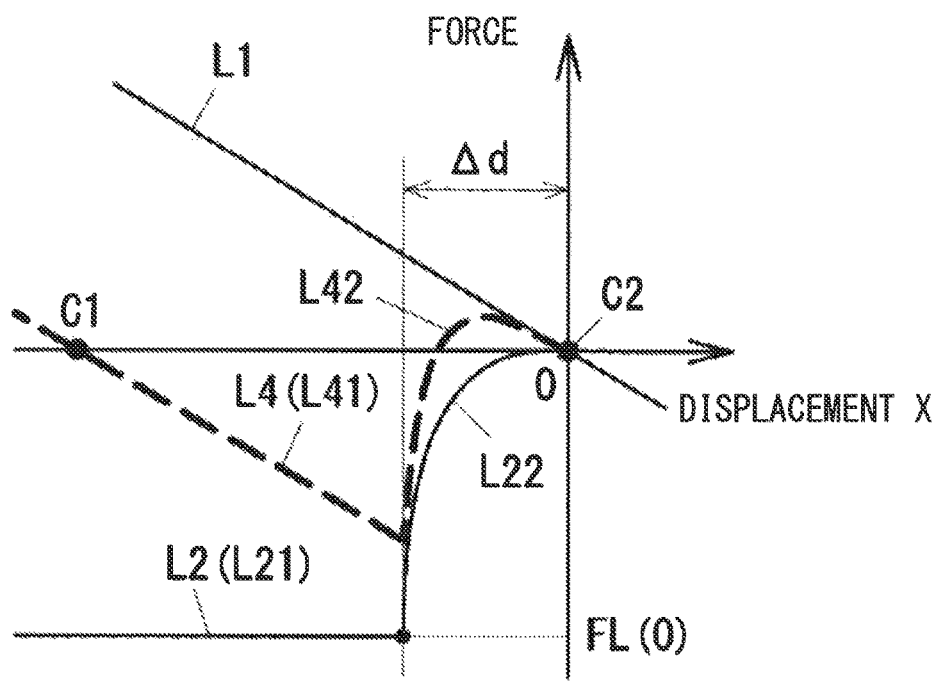
FIG. 59 is a diagram illustrating respective changes in the elastic force, the electrostatic force, and the total force at the actuator 110B.

FIG. 59 is a diagram illustrating changes in the elastic force (line L1) exerted by the elastic support part 6 at the displacement x, the electrostatic force (line L2) when the applied voltage V1 is zero, and the total force (line L4). Δd indicates a gap between the comb teeth 300 and the comb teeth 400 at the second stable position (see FIG. 58 (b)). The electrostatic force when the applied voltage V1 is zero, that is, the electrostatic force (line L2) generated by the electrets comprises a linear part L21 representing the electrostatic force when the comb teeth 300 and the comb teeth 400 overlap (that is, the comb teeth are in an inserted state) and a curve part L22 representing the electrostatic force in a state in which the comb teeth 400 are out from between the comb teeth 300.

Although explanation is omitted in the above-mentioned first embodiment, at the tip of the comb teeth 300, a fringe electric field as indicated by a fine line F in FIG. 58 (b) slightly leaks between the comb teeth 300. The fringe electric field F drastically decreases at a position farther away from the tip of the comb teeth 300. The electrostatic force L22 generated by the fringe electric field drastically decreases from the displacement x=−Δd to the displacement x=0. Consequently, when the movable part 5 is displaced in the negative direction from the displacement x=0, the elastic force is larger than the electrostatic force to make the total force positive. As the gap between the comb teeth 400 and the comb teeth 300 approaches zero (displacement x=−Δd), the total force changes from positive to negative. That is, electrostatic force that causes the comb teeth 400 to be drawn in between the comb teeth 300 is generated.

If the state is established in which the comb teeth 400 are drawn in between the comb teeth 300, the electrostatic force becomes constant, so that as the insertion amount grows, the total force increases linearly and the line representing the total force crosses the horizontal axis at the position C1. The line L4 representing the total force as shown in FIG. 59 crosses the horizontal axis at three points. The points C1, C2 with respective filled circles represent stable balanced or equilibrium positions (stable positions) while the intersection point of the line L42 with the horizontal axis represents an unstable or unequilibrium point. That is, FIG. 58 (a) shows the state of stable position C1 while FIG. 58 (b) shows the state of the stable position C2.

Figure 60:
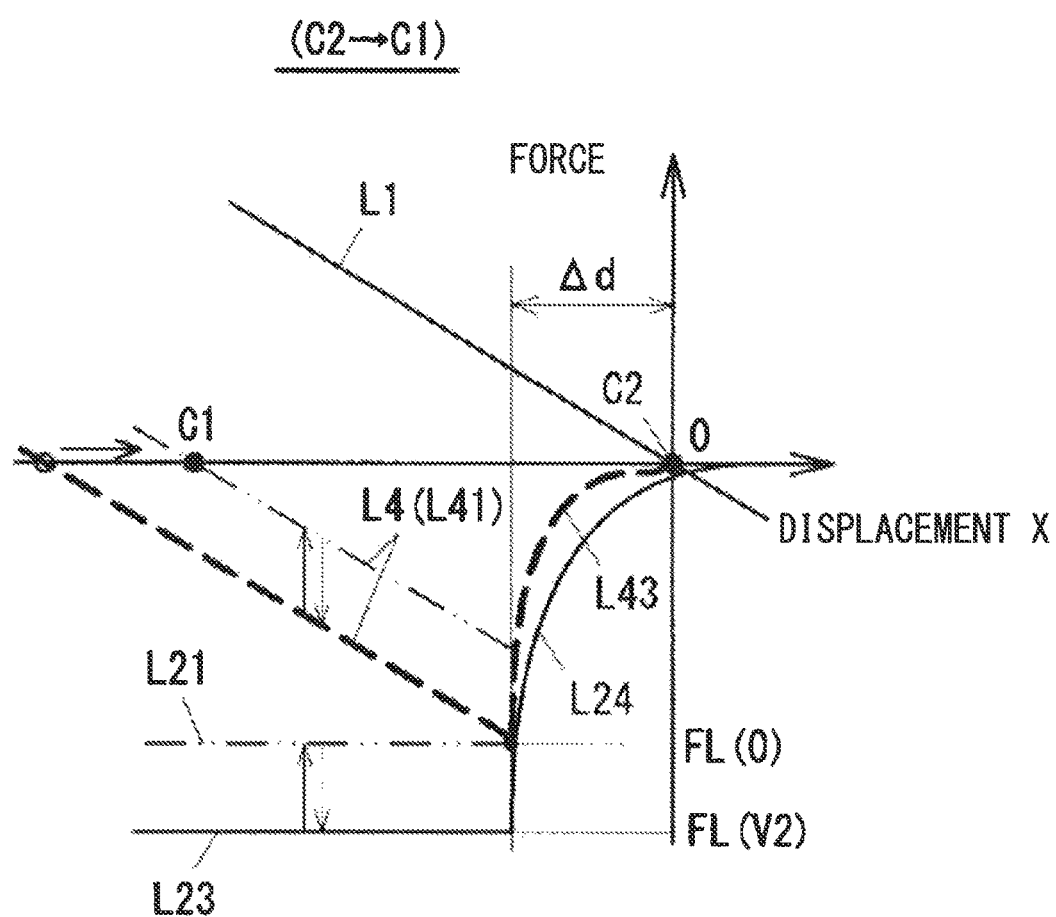
FIG. 60 is a diagram illustrating the operation of displacement of the movable part 5 from the stable position C2 to the stable position C1 at the actuator 110B.

FIG. 60 is a diagram illustrating the motion of the movable part 5 to be displaced from the stable position C2 to the stable position C1. First, the switch 9 (unshown) of the second actuation unit 8B is closed to apply a negative voltage (−V2) to the movable electrode 4A. This causes the inter-electrode voltage to have a value which is the sum of the voltage of the electrets and the voltage V2. Thus, the electrostatic force changes such that the line L21 and the line L22 shown in FIG. 59 change to the line L23 and the line L24, respectively. As a result, the line L4 representing the total force, as is indicated by a thick broken line, is negative in the range from the displacement x=0 to the displacement indicated by an open circle, so that the movable part 5 is displaced in the negative direction. This causes the comb teeth 400 to be inserted between the comb teeth 300. Subsequently, when the application of the voltage (−V2) is stopped, the lines L1, L2, and L4 return to the states shown in FIG. 59 and the movable part 5 is brought into a balanced state at the stable position C1.

Conversely, the displacement of the movable part 5 from the stable position C1 to the stable position C2 is achieved by closing the switch 9 (unshown) to apply the voltage V1 to the stationary electrode 3A. On this occasion, the voltage V1 has a reverse polarity with respect to the voltage of the electrets and the electrostatic force is reduced by applying the voltage V1. V1 is set so that the electrostatic force $FL(V1)$ satisfies d in "−f(Δd) FL(V1)<0".

As mentioned above, the electrostatic actuation mechanism according to this embodiment includes stationary comb-teeth electrodes (for instance, the first stationary electrode 3A and the second stationary electrode 3B) and the electrode plate 3D as the stationary electrodes. It also includes movable comb-teeth electrodes (the first movable electrode 4A and the second movable electrode 4B) and the electrode plate 4D as the movable electrodes. As mentioned above, the stationary electrode and the movable electrode are made of the same plate-like members (for instance, the upper Si layer 33 of the SOI substrate as shown in FIG. 9). The movable electrode is provided at the movable part 5 elastically supported by the first elastic support part and is displaced by the electrostatic force to slide in a plane with respect to the stationary electrode. In this embodiment, at least one of stationary electrode and the movable electrode is provided with electrets. This construction enables a plurality of stable states to be set to the actuator in which the movable part 5 is positioned at a stable position at which the electrostatic force generated by the electrets matches with the elastic force exerted by the first elastic support part or a stable position set near such stable position. Application of an appropriate voltage to the electrostatic actuation mechanism enables the movable part 5 to be displaced from any one of stable positions to another of the stable positions.

In this manner, the actuator according to this embodiment a voltage needs to be applied only when it is desired to displace the movable part 5 between the stable positions, so that power required for operating the electrostatic actuation mechanism can be saved. The movable electrode of the electrostatic actuation mechanism is displaced by sliding in the plane, which enables production of relatively thin actuators.

As shown in FIG. 1, the stationary electrodes 3A and 3B are fixed to the base 2 and the movable electrodes 4A and 4B are fixed to the base 2 via the elastic support parts 6. As shown in FIG. 16, the stationary electrode 3A and the elastic support part 6 are fixed to the base 2 via the SiO$_2$ layer 32, which is an insulation layer. Consequently, the elastic support part 6 and the base 2 are electrically insulated from each other and the stationary electrode 3A and the base 2 are electrically insulated from each other.

Like the actuator 110B as shown in FIG. 58, the electrostatic actuation mechanism may be configured to include at least a comb-teeth actuation unit that includes the first stationary electrode 3A of a comb-teeth type and the first movable electrode 4A of a comb-teeth type. In this case, the direction in which the insertion amount of the first movable electrode 4A with respect to the first stationary electrode 3A changes corresponds to the direction in which the above-mentioned displacement by sliding occurs and at least one of the first stationary electrode 3A and the first movable electrode 4A is provided with electrets. In the comb-teeth actuation unit, the first movable electrode 4A is displaced by sliding in the direction in which the insertion amount changes and the electrostatic force generated is constant regardless of the sliding position, so that the stroke between the stable positions can be set relatively large.

In the actuator 110B as shown in FIG. 58, the electrets are provided in at least one of the stationary electrode 3A and the movable electrode 4A. In the actuator 110B, a first stable position and a second stable position can be set as follows: the first stable position is a stable position, at which the insertion amount is positive and the electrostatic force generated by the electrets matches with the elastic force exerted by the elastic support part 6, or a stable position set near such stable position; the second stable position is a stable position in which the insertion amount is zero and the electrostatic attraction force due to the fringe electric field of the stationary electrode 3A generated by the electrets matches with the elastic force and the electrostatic force due to the fringe electric field at the time of application of the voltage is greater than the elastic force, or a stable position set near such stable position. Application of a voltage that weakens the electrostatic force of the comb-teeth actuation unit causes the movable part 5 to be displaced from the first stable position to the second stable position. On the other hand, application of a voltage that strengthens the electrostatic force of the comb-teeth actuation unit causes the movable part 5 to be displaced from the second stable position to the first stable position.

As shown in FIG. 1, the electrostatic actuation mechanism may be configured to include a first comb-teeth actuation unit that has the first stationary electrode 3A and the first movable electrode 4A disengageably interdigitating with the first stationary electrode 3A and a second comb-teeth actuation unit that has the second stationary electrode 3B placed opposite to and at a distance from the first stationary electrode 3A and the second movable electrode 4B disengageably interdigitating with the second stationary electrode 3B. The first movable electrode 4A and the second movable electrode 4B are provided at the movable part 5. The movable part 5 is elastically supported by the elastic support part 6 so that it can be displaced by sliding in the direction in which the respective insertion amounts of the movable electrodes 4A and 4B with respect to the stationary electrode 3A and 3B are changed. At least one of the first stationary electrode 3A and the first movable electrode 4A is provided with electrets and at least one of the second stationary electrode 3B and the second movable electrode 4B is provided with electrets. As a result, the actuator has a first stable position and a second stable position. Here, the first stable position is a stable position at which the first movable electrode 4A is drawn by the first stationary electrode 3A to a position at which the insertion amount of the second movable electrode 4B becomes 0 (zero) to make the electrostatic force generated by the electrets matches with the elastic force exerted by the elastic support part 6, or a stable position set near such stable position. The second stable position is a stable position at which the second movable electrode 4B is drawn in by the second stationary electrode 3B to a position at which the insertion amount of the first movable electrode 4A becomes 0 (zero) to make the electrostatic force generated by the electrets matches with the elastic force exerted by the elastic support part 6 or, a stable position set near such stable position.

As shown in FIG. 55, the electrostatic actuation mechanism may be configured to include a stationary side electrode plate 3D, which is provided on a side opposite to the side of the stationary electrode 3B in a direction in which the movable part 5 slides such that the stationary side electrode plate 3D and the stationary electrode 3B sandwich the movable part 5, and a movable side electrode plate 4D provided at the movable part 5 arranged opposite to the electrode plate 3D. The electrets are provided in at least one of the stationary electrode 3B and the movable electrode 4B. Also, the electrets are provided in at least one of the oppositely arranged electrode plates 3D and 4D. This configuration enables actuator to have a first stable position which is a stable position in which the movable electrode 4B is drawn by the stationary electrode 3B so as to be inserted in the stationary electrode 3B to make the electrostatic force generated by the electret matches with the elastic force exerted by the elastic support part, 6 or a stable position set near such stable position and to have a second stable position which is a stable position in which electrode plate 4D is drawn toward the electrode plate 3D to a position at which the insertion amount of the movable electrode 4B in the stationary electrode 3B becomes 0 (zero) to make the electrostatic force generated by the electret matches with the elastic force exerted by the elastic support part 6 or a stable position set near such stable position.

Hereafter, explanation is made on an embodiment in which the actuator 1 mentioned above is used. Instead of the actuator 1, the actuator 110A as shown in FIG. 55 or the actuator 110B as shown in FIG. 58 may be used.

First Example

Figure 19:
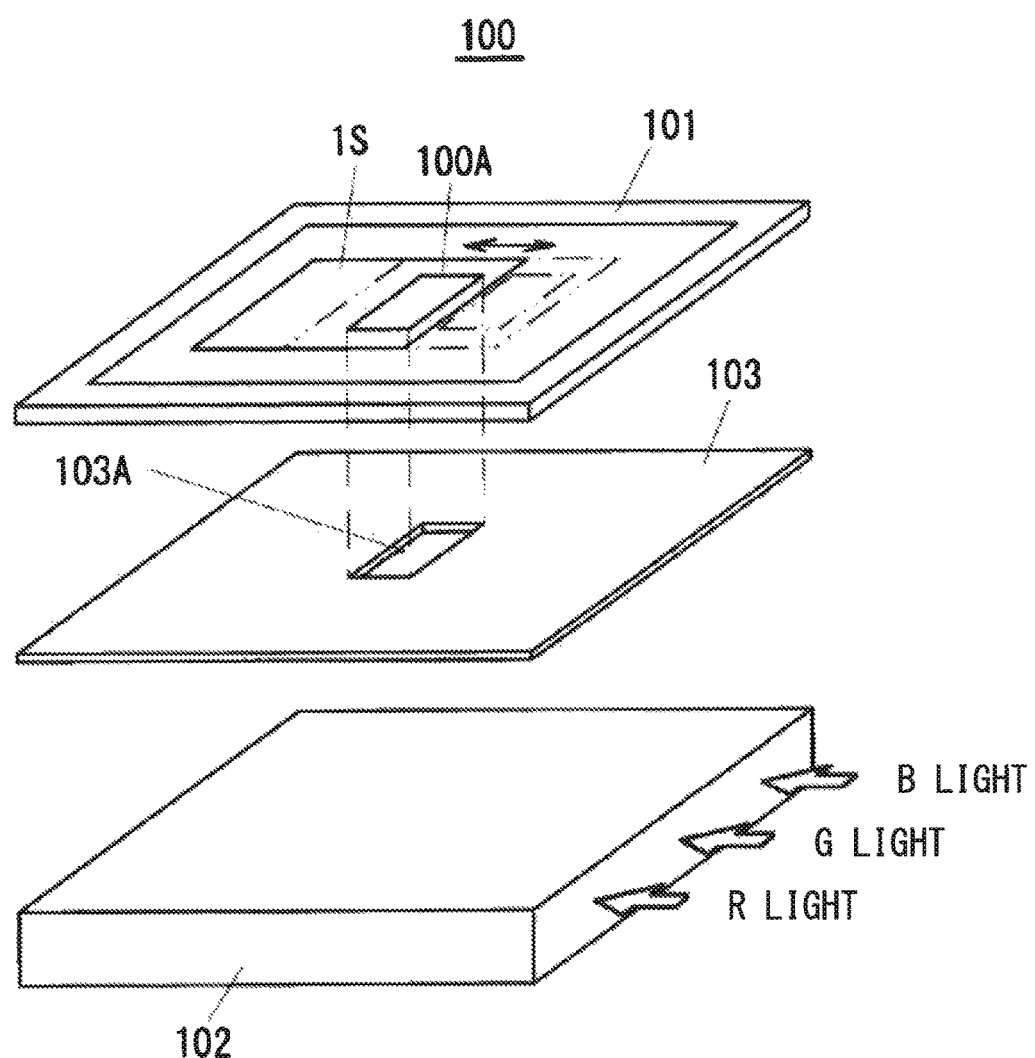
FIG. 19 is a diagram showing an optical shutter.

FIG. 19 shows a case in which the actuator 1 is adopted as a drive mechanism in an optical shutter. FIG. 19 is an exploded perspective view showing an outline arrangement of one pixel of a display according to a field sequential color (FSC) method. Each pixel 100 includes an optical shutter 101, a backlight 102, and a light shield plate 103 having an opening 103A.

In the optical shutter 101, the movable part 5 of the actuator 1 as shown in FIG. 1 is employed to serve as a shutter plate 1S. Other structures are the same as those in the configuration shown in FIG. 1. The optical shutter 101 is arranged such that the optical shutter 101 and the backlight 102 are on the oppose sides of the light shield plate 103 to sandwich the light shield plate 103. The shutter plate 1S has an opening 100A. Driving two sets of electrodes, i.e., the electrodes 3A and 4A and the electrodes 3B and 4B (omitted in FIG. 19) provided at the actuator 1 enables the shutter plate 1S to be displaced in the horizontal direction in the figure (the direction indicated by the arrow). The actuator 1 may be either one of the actuators shown in FIGS. 1 and 7. The shutter plate 1S can be displaced to the first stable position indicated by a solid line and to the second stable position indicated by a chain double dashed line.

If the shutter plate 1S is positioned at the first stable position, the opening 100A faces the opening 103A of the light shield plate 103. On the other hand, if the shutter plate 15 is displaced to the second stable position as indicated in the chain double dashed line, the non-opened part of the shutter plate 1S faces the opening 103A. R (red) light, G (green) light, and B (blue) light are incident into the backlight 102 from respective LEDs (not shown). If the shutter plate 1S is driven to the first stable position, the optical shutter is brought into an open state whereas if the shutter plate 1S is driven to the second stable position, the optical shutter is brought into a closed state. In the FSC method, R, and B LEDs sequentially emit respective lights and in synchronization with this the shutter plate 15 performs its switching operation. For instance, if the shutter plate 1S is opened at a timing when R light is emitted, red (R) light is displayed at the pixel. On the contrary, if the shutter plate 1S is closed, then the pixel is brought into a non-displaying state (which corresponds to displaying black).

Figure 20:
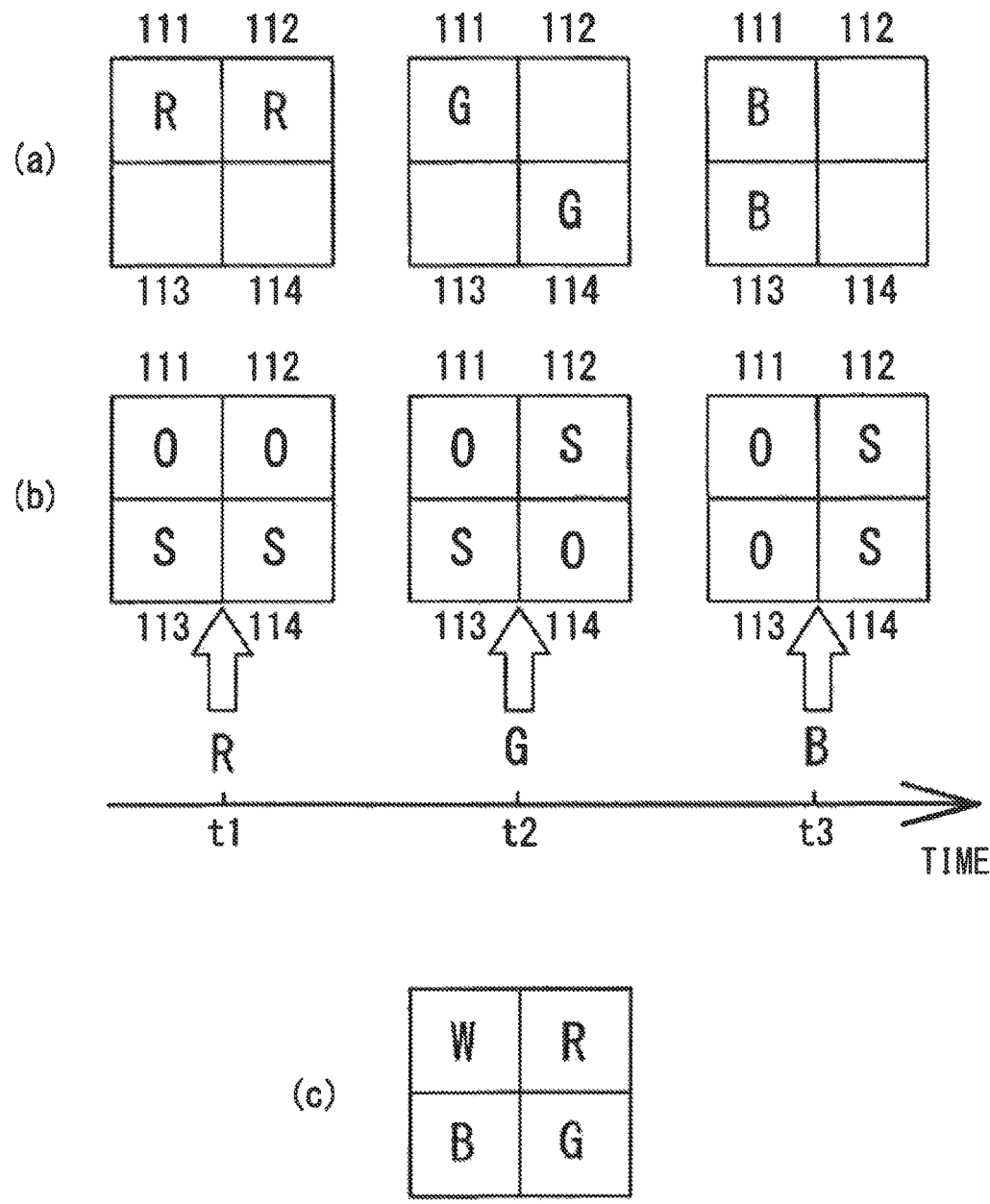
FIG. 20 shows diagrams illustrating a concept of colorization in an FSC method.

FIG. 20 shows diagrams illustrating the concept of colorization in the FSC method. FIG. 20 shows four pixels 111 to 114. (b) shows respective shutter-switching states of pixels 111 to 114 at respective times t1, t2, and t3. Symbol O represents an open state and symbol S represents a closed state. (a) shows respective display states corresponding to the shutter-switching states at times t1 to t3. (c) shows color images reproduced in a chronological order.

At time t1, R light is incident to the backlight 102 and the shutter plates 1S of the pixels 111 and 112 are brought into an open state. As a result, the pixels 111 and 112 display each red color (R). On the other hand, the shutter plates 1S of other pixels 113 and 114 are brought into a closed state to bring the pixels into a non-displayed state. At time t2, G light is incident to the backlight 102 and the shutter plates 15 of the pixels 111 and 114 are brought into an open state. As a result, the pixels 111 and 114 display each green color (G). At time t3, B light is incident to the backlight 102 and the shutter plates 1S of the pixels 111 and 113 are brought into an open state. As a result, the pixels 111 and 113 display each blue color (B).

If such display is performed in a short time, a color image as shown in FIG. 20(*c*) is observed due to afterimage. That is, the pixel 111 is observed as displaying white color (W). The pixels 112, 113 and 114 are observed as displaying red color (R), green color (G), and blue color (B), respectively.

As mentioned above, in the shutter device according to this embodiment, the shutter plate 1S as the movable part is displaced between two stable positions by the actuator 1 to be inserted to or retracted from the opening 103A, which is a light path. As a result, the shutter plate 1S switches the light from the backlight 102 either to a transmissive state or to a non-transmissive state. As mentioned above, the actuator that drives the shutter plate 1S can be made relatively thin, the size in thickness of the optical shutter and of a display device that includes such an optical shutter can be controlled. The actuator 1 for use in driving a shutter is configured to apply voltage only in an instant when the shutter is opened or closed. This enables fabrication of an optical shutter that uses much less power.

Second Example

Figure 21:
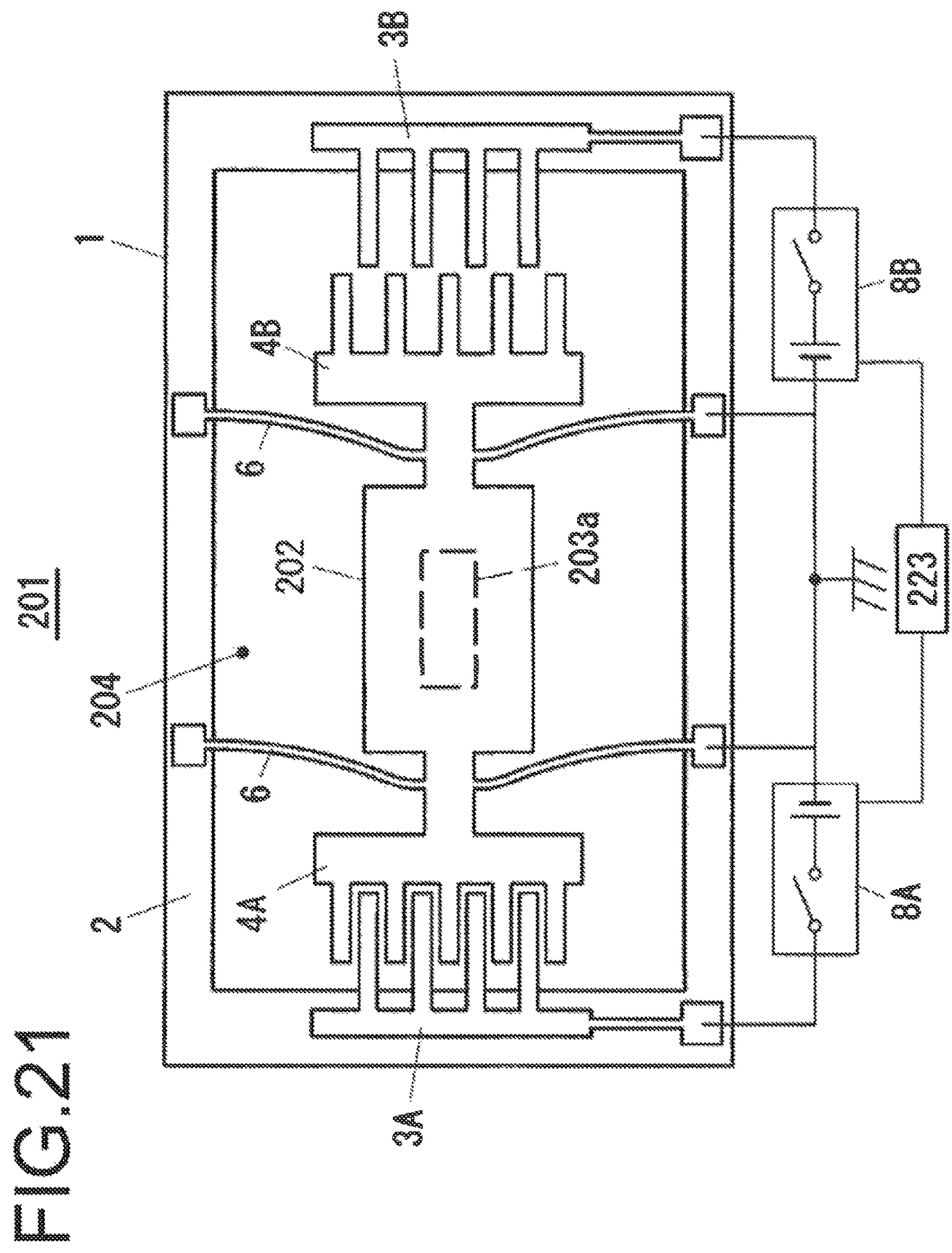
FIG. 21 is a diagram illustrating a second embodiment.

FIG. 21 is a diagram illustrating a second example of this embodiment. FIG. 21 is a diagram showing an outline arrangement of a flow channel switch valve for use in a small fluid apparatus. The flow channel switch valve 201 as shown in FIG. 21 includes the actuator 1 as shown in FIG. 1 with the movable part 5 being provided with a valve element 202. The other components are the same as those of the actuator 1 as shown in FIG. 1. On the rear side of the valve element 202 is formed a groove 203a that has a shape as indicated by a broken line. On the lower part of the valve element 202 is arranged a flow channel structure 204. The base 2 of the actuator 1 is fixed on the upper side of the flow channel structure 204. As shown in FIG. 21, if the valve element 202 is displaced to the first stable position mentioned above, the valve element 202 is positioned at a closed position. Conversely, if the valve element 202 is displaced to the second stable position mentioned above, the valve element 202 is positioned at an open position (see FIG. 22).

FIG. 22 shows diagrams showing the valve element 202 and the flow channel structure 204, with (a) being a plan view and (b) and (c) each being an A-A cross-sectional view. In (a), the solid line indicates the case in which the valve element 202 is in an open position whereas the chain double dashed line indicates the case in which the valve element 202 is in a closed position. (b) is a cross-sectional view showing the case in which the valve element 202 is in an open position and (c) is a cross-sectional view showing the case in which the valve element 202 is in a closed position. The flow channel structure 204 is provided with two flow channels 205 and 206, which are independent of each other. The flow channel 205 communicates with an opening 205a formed on the upper side of the flow channel structure 204. The flow channel 206 communicates with an opening 206a that is formed on the upper side of the flow channel structure 204. The arrow in (b) indicates the flow of a fluid.

The flow channel structure 204 is formed from, for instance, silicon and although not shown, an insulation coating treatment (for instance, oxide film formation) is applied on the upper surface of the flow channel structure 204. To eliminate leakage of the fluid from a gap between the flow channel structure 204 and the valve element 202, a voltage is applied to the flow channel structure 204. The electrostatic force generated by the application of voltage causes the valve element 202 to be drawn toward the flow channel structure 204.

As mentioned above, on the rear side of the valve element 202 (the side facing the flow channel structure 204) is formed the groove 203a that constitutes a communication channel. As indicated by the solid line in FIG. 22(*a*), if the valve element 202 is displaced by the actuator 1 to an open position, the groove 203a is positioned above the openings 205a and 206a as indicated by the solid lines (see FIG. 22(b)) to cause the flow channel 205 and the flow channel 206 to communicate with each other to establish a continuity state. On the other hand, as shown in FIG. 22(c), if the valve element 202 is positioned at a closed position, the opening 206a of the flow channel 206 is blocked with a lower side 203b of the valve element 202 to establish a discontinuity state. As a result, the flow channel 205 and the flow channel 206 are blocked from each other by the valve element 202. In the example as shown in FIG. 22, a configuration in which the opening 206a is blocked in a discontinuity state is adopted. However, a configuration in which the opening 205a instead of the opening 206a is blocked may be adopted.

FIG. 23 shows diagrams illustrating a variation example of the second example. In the example as shown in FIG. 22, the flow channel structure 204 is provided with two flow channels 205 and 206 and the flow channels 205 and 206 are switched between a continuity state in which communication is established through the groove 203a of the valve element 202 and a discontinuity state in which communication is blocked with the lower side 203b of the valve element 202. On the other hand, in the variation example as shown in FIG. 23, only the flow channel 205 that passes through the flow channel structure 204 is formed and the valve element 202 has no groove 203a. As shown in FIG. 23(b), the valve element 202 is displaced to the second stable position to cause the opening 205a on the inlet side of the flow channel 205 to be blocked by the lower side 203b of the valve element 202, thereby establishing a discontinuity state. On the other hand, as shown in FIG. 23(a), the valve element 202 is displaced to the first stable position to let the opening 205a released, thereby establishing a continuity state. Of course, a configuration in which the outlet side of the flow channel 205 is closed or opened may be adopted.

As mentioned above, according to this example, the valve and the valve drive mechanism can be made relatively thin, which enables the switch valve to have a reduced overall size. In particular, since the valve and the drive mechanism can be made from a semiconductor substrate in a lump, this example is suitable for a relatively small fluid apparatus.

Third Example

Figure 24:
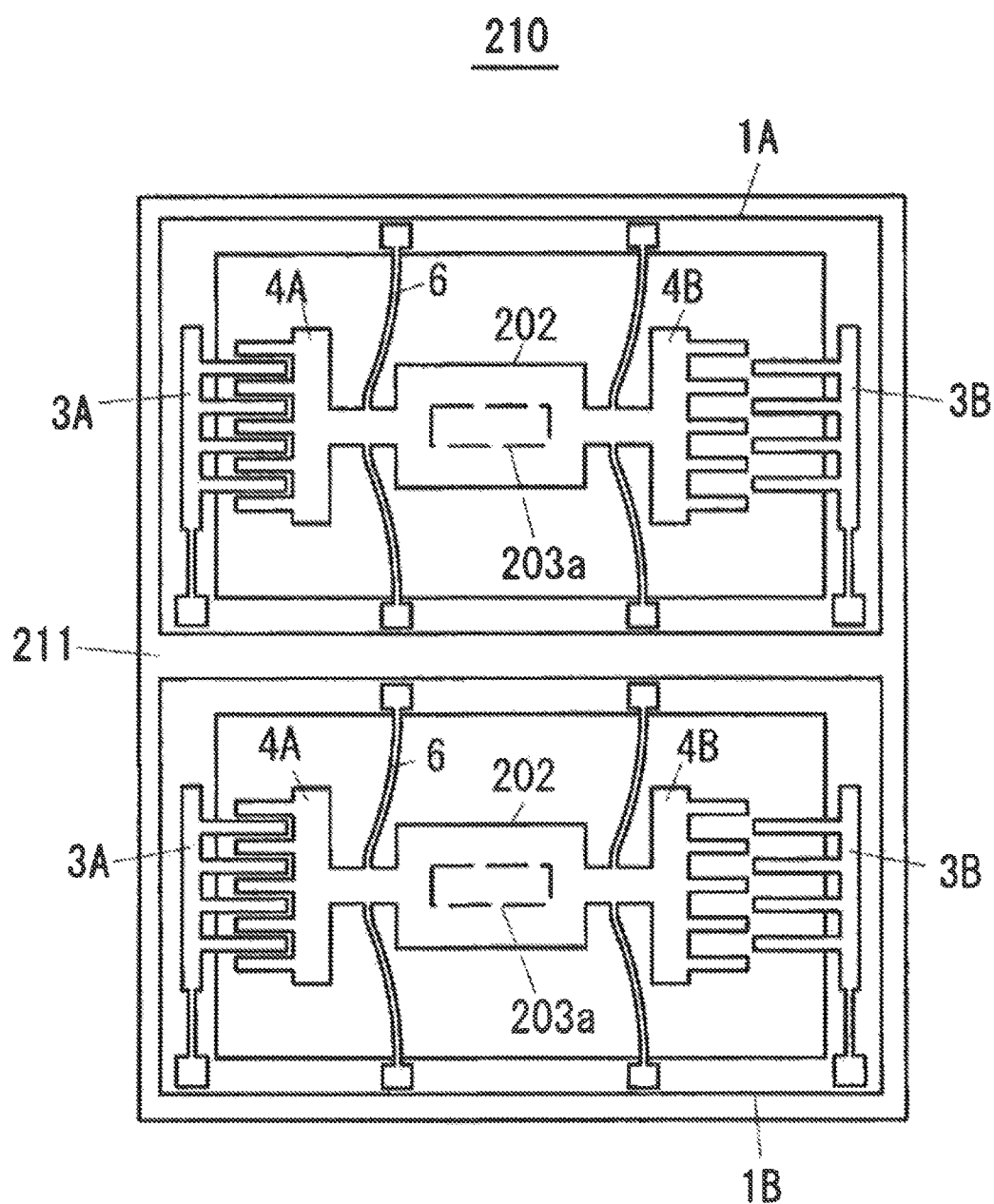
FIG. 24 is a plan view showing a three-way switch valve 210.
Figure 25:
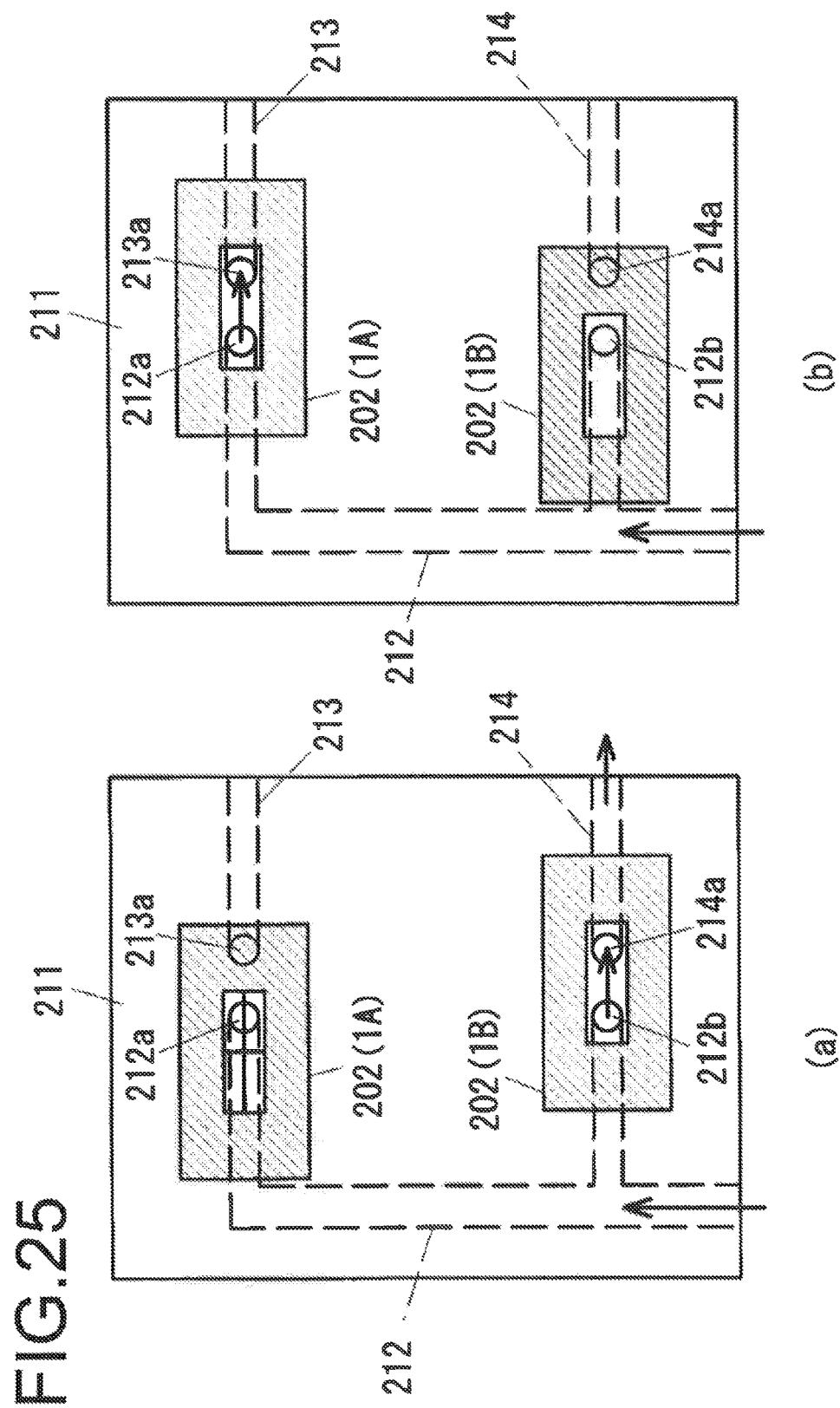
FIG. 25 shows diagrams illustrating switching operation of the three-way switch valve 210.

The flow channel switch valve according to the second example mentioned above is a so-called switch valve or on-off valve. However, according to a third example, a three-way switch valve is achieved by using two sets of actuators. FIGS. 24 and 25 are each a diagram illustrating the case in which the actuator 1 is adopted in a three-way switch valve. FIG. 24 is a plan view showing a three-way switch valve 210. The three-way switch valve 210 includes two sets of actuators 1A and 1B provided on the flow channel structure 211. The actuation units 8A and 8B and the control unit 223 are not shown in FIG. 24. Also, in the case of the three-way switch valve 210, if the actuators 1A and 1B are displaced to the first stable position, the respective valves 202 are each positioned at a closed position whereas if the actuators 1A and 1B are displaced to the second stable position, the respective valves 202 are each positioned at an open position. In FIG. 24, each of the valves 202 is positioned at a closed position.

FIG. 25 shows diagrams illustrating the switching operation of the three-way switch valve 210, showing the flow channel structure 211 and the two valves 202. The flow channel structure 211 has three flow channels 212, 213, and 214, which are independent of each other. The flow channel 212 is branched into two flow channels and an end of each branch flow channel communicates with openings 212a, 212b provided on a surface of the flow channel structure 211. Also, the other flow channels 213 and 214 communicate with the openings 213a and 214a, respectively, formed on the surface of the flow channel structure 211.

FIG. 25(a) shows the case in which the valve element 202 of the actuator 1A is positioned at a closed position and the valve element 202 of the actuator 1B is positioned at an open position. In this case, the flow channel 212 communicates with the flow channel 214. The flow channel 212 and the flow channel 213 are blocked therebetween. In the example shown in FIG. 25(b), the valve element 202 of the actuator 1A is positioned at an open position and the valve element 202 of the actuator 1B is positioned at a closed position. As a result, the flow channel 212 and the flow channel 213 communicate with each other and the flow channel 212 and the flow channel 214 are blocked therebetween.

Figure 54:
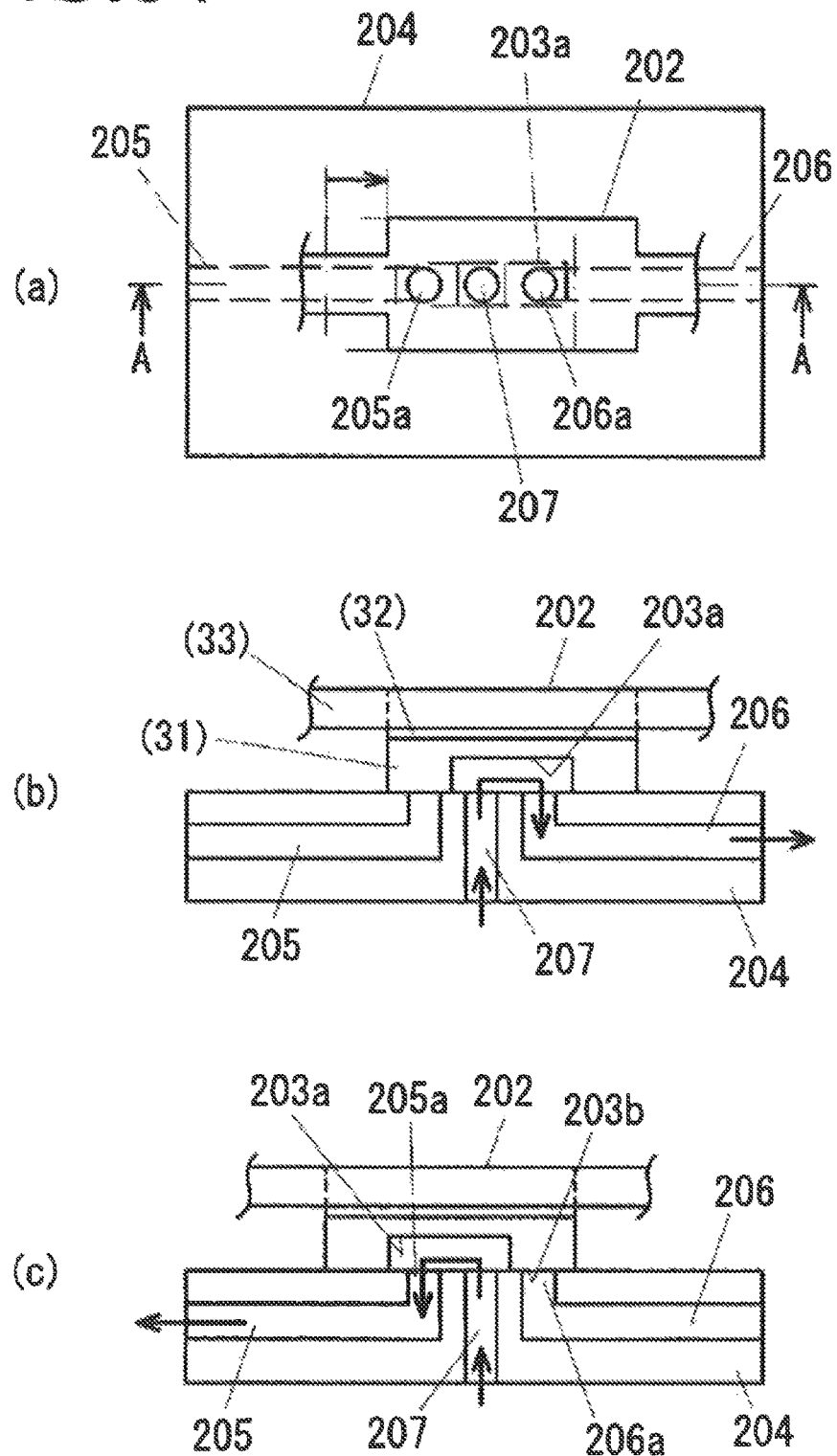
FIG. 54 shows diagrams showing another example of the three-way switch valve.

In the above-mentioned example, the two valves 202 are driven by the two actuators 1A and 1B, respectively, to perform three-way switching. However, switching may be performed by using a set of the actuator 1 and the valve element 202 as shown in FIG. 54. If the valve element 202 is displaced to the stable position on the right side as shown in FIG. 54(b), a flow channel 207 and the flow channel 206 communicate through the groove 203a of the valve element 202 and the opening 205a of the flow channel 205 is blocked with the lower side 203b of the valve element 202. As a result, the fluid flows from the flow channel 207 to the flow channel 206. Conversely, as shown in FIG. 54(c), if the valve element 202 is displaced toward the stable position on the left side, the flow channel 207 and the flow channel 205 communicate with each other through the groove 203a to allow the fluid to flow from the flow channel 207 to the flow channel 205.

In the configuration as shown in FIGS. 24 and 25, three or more flow channels may be branched from the flow channel 212 and each of the branch flow channels may be provided with the actuator 1 and the valve element 202. This configuration enables switching of a number of flow channels. In FIG. 24, the actuators each provided with the valve element 202 are arranged separately. However, a plurality of sets of the actuator and the valve may be formed on a single substrate, so that a valve structure including a plurality of sets of the actuator and the valve can be formed in a lump.

Fourth Example

Figure 26:
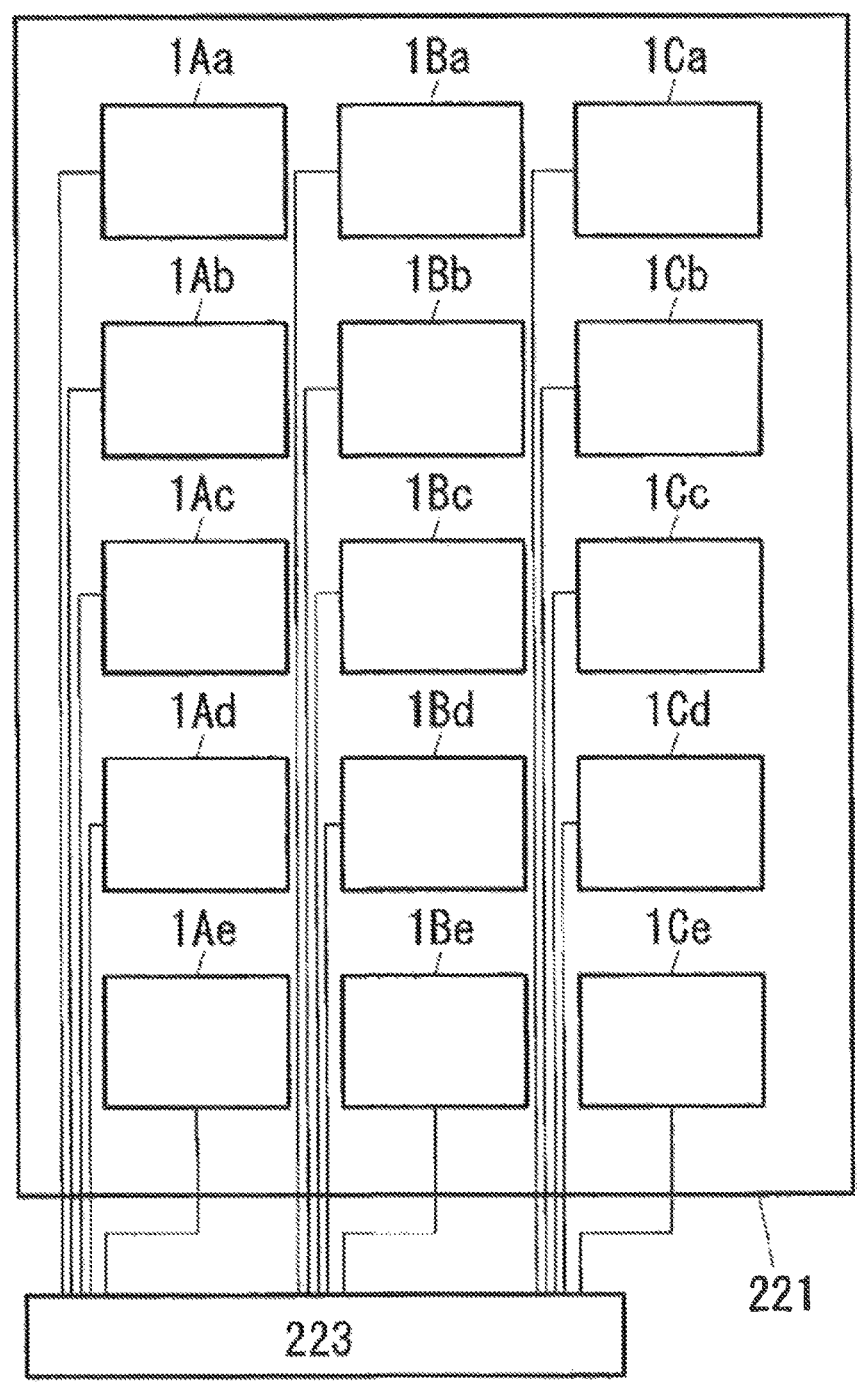
FIG. 26 is a diagram showing a front side of a flow control valve 220.
Figure 27:
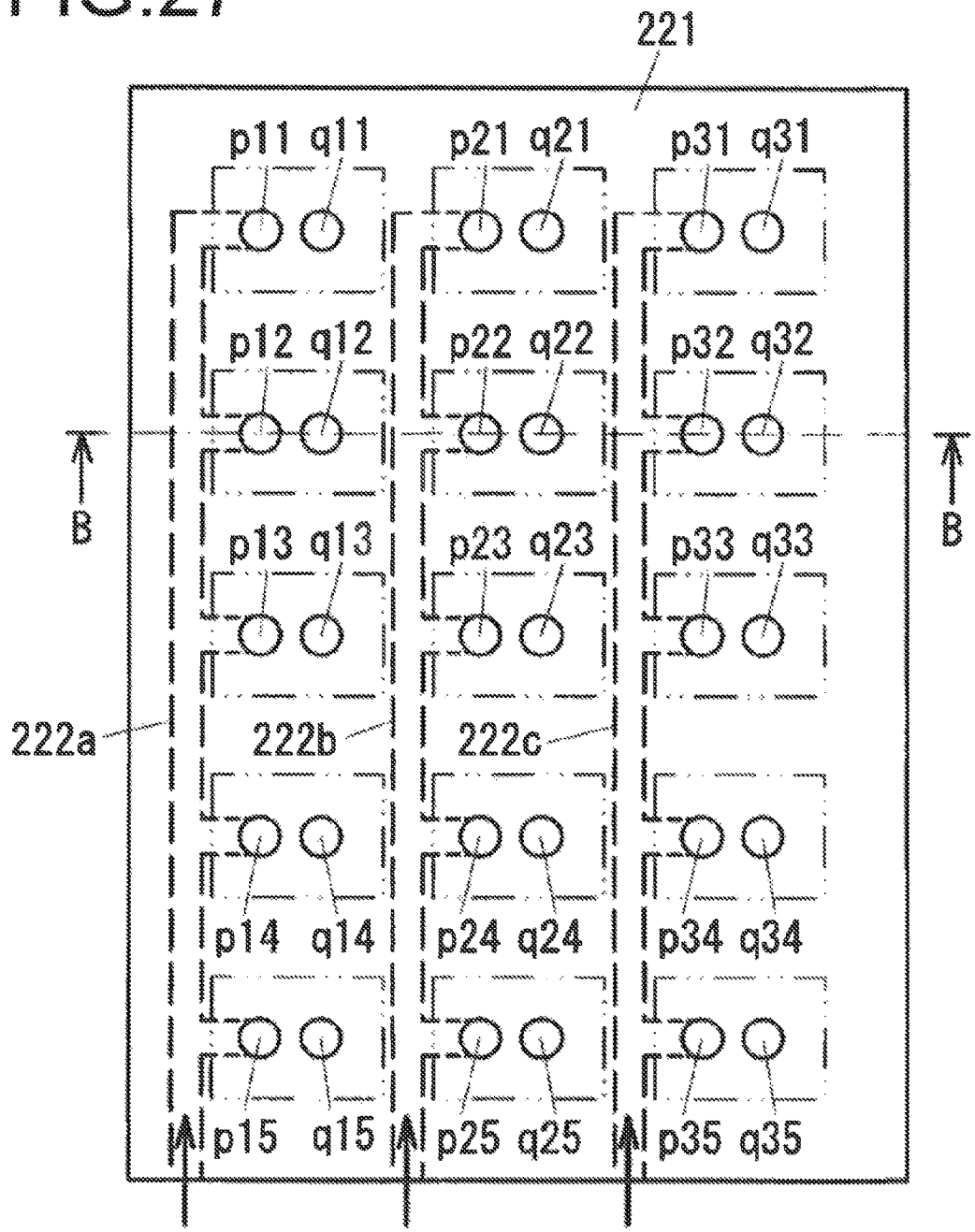
FIG. 27 is a diagram showing a surface side of a flow channel structure 221.
Figure 28:
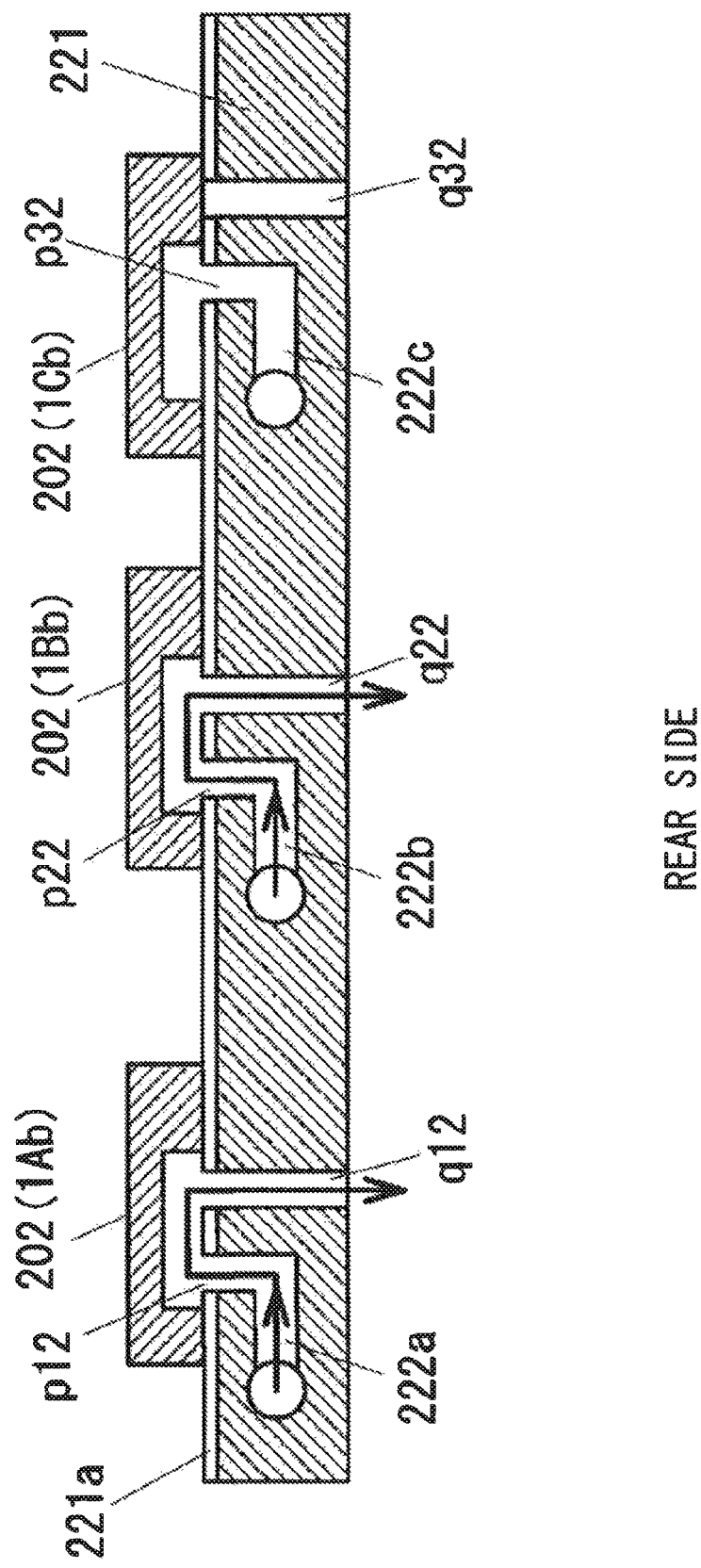
FIG. 28 is a diagram showing a B-B cross-section.

FIGS. 26 to 28 are each a drawing showing an outline arrangement of an example of a flow control valve 220 including a plurality of actuators. FIG. 26 is a drawing showing the front side of the flow control valve 220. On the front surface side of a flow channel structure 221 is arranged a plurality of actuators 1Aa to 1Ce in the form of a matrix. Respective first and second actuation units 8A and 8B provided on actuators 1Aa to 1C are controlled by a control unit 223.

FIG. 27 is a drawing showing the front surface side of the flow channel structure 221, showing the position of each of the actuator 1Aa to 1Ce in chain double dashed lines. The flow channel structure 221 includes three flow channels 222a to 222c in which a fluid is supplied. The flow channel 222a branches into five flow channels corresponding to five actuators 1Aa to 1Ae lined up in the longitudinal direction. The respective flow channels communicate with openings p11 to p15 formed on the front surface side of the flow channel structure 221. Adjacent to the openings p11 to p15 are formed through-holes q 11 to q15. The flow channel 222b is branched into five flow channels corresponding to five actuators 1Ba to 1Be lined up in the longitudinal direction. The respective flow channels communicate with openings p21 to p25 formed on the front surface side of the flow channel structure 221. Adjacent to the openings p21 to p25 are formed through-holes q21 to q25, respectively. The flow channel 222c is branched into five flow channels corresponding to five actuators 1Ca to 1Ce lined up in the longitudinal direction. The respective flow channels communicate with openings p31 to p35 formed on the front surface side of the flow channel structure 221. Adjacent to the openings p31 to p35 are formed through-holes q31 to q35, respectively.

FIG. 28 shows a B-B cross-section of FIG. 27. The flow channel structure 221 is formed from silicon, on the front side of which is formed an oxide film (silicon oxide) 221a as an insulation coating treatment. In the example shown in FIG. 28, the valve elements 202 of the actuators 1Ab and 1Bb are each positioned at an open position and the valve element 202 of the actuator 1Cb is positioned at a closed position. As a result, the fluid supplied to the flow channel structure 221 flows out from the back side of the flow channel structure 221 through the through-holes q12 and q22.

Since the flow control valve 220 is provided with 15 sets of actuators as shown in FIG. 26, controlling switching of the 15 sets of actuators individually enables the flow rate of the fluid to be controlled in 15 levels from 1 unit to 15 units, assuming the flow rate obtained when one valve element 202 is at an open position is defined to be one unit. In addition, production of 15 sets of actuators and valve elements from a single substrate by the fabrication method as illustrated in FIGS. 9 to 16 enables a valve structure provided with a number of valves and actuators to be fabricated from a single sheet of substrate in a lump with ease.

In the flow rate control device according to this embodiment, the valve structure as shown in FIG. 23 may be used. In the case of such a configuration, the fluid flows from one side to the other side of the flow channel structure.

Fifth Example

Figure 29:
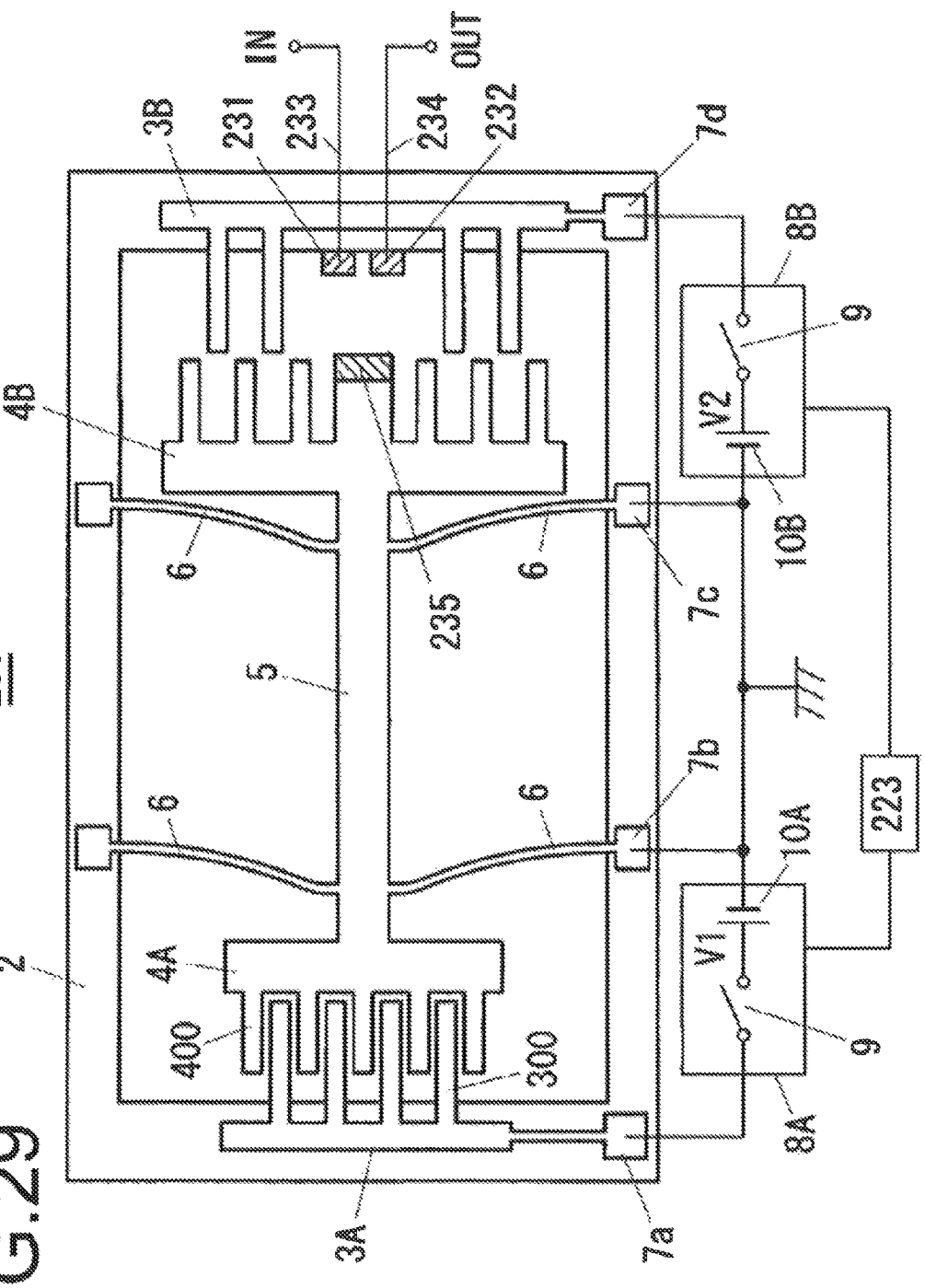
FIG. 29 is a diagram showing a fifth embodiment.

FIG. 29 is a drawing illustrating a fifth example, in which the above-mentioned actuator 1 is adopted in an RF switch for switching the path of high-frequency signals. FIG. 29 is a drawing illustrating that the actuator of this example is adopted as an RF switch of SPST (Single Pole Single Throw). Here, explanation is made on the case in which the actuator of this example is adopted in the RF switch. However, it may also be adopted in general switches and relays without limiting to RF switches.

Figure 30:
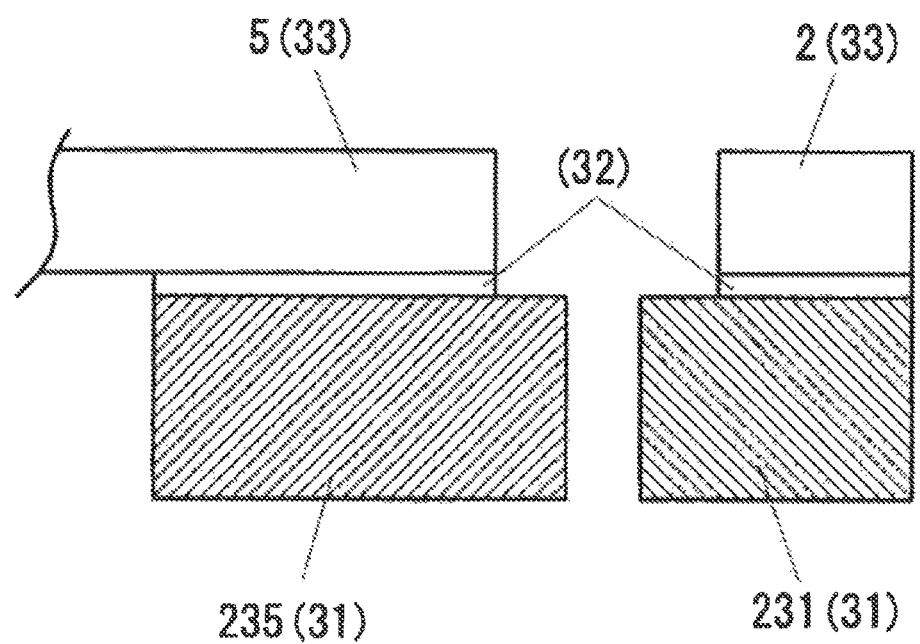
FIG. 30 is a cross-sectional view showing a portion of an RF switch 230.

In a RF switch 230 as shown in FIG. 29, the base 2 is provided with stationary contact points 231 and 232. To the stationary contact point 231 is connected an input side signal line 233. To the stationary contact point 232 is connected an output side signal line 234. On the other hand, the movable part 5 is provided with a movable contact point 235 at a position corresponding to the stationary contact points 231 and 232. The stationary contact points 231 and 232 and the base 2 are insulated from each other and the movable contact point 235 and the movable part 5 are insulated from each other. For instance, if the RF switch 230 is made from an SOI substrate, the stationary contact points 231 and 232 and the movable contact point 235 may be formed from the lower Si layer 31 of the SOI substrate as shown in FIG. 30.

In the state as shown in FIG. 29, the actuator is at the first stable position at which the first movable electrode 4A is drawn in by the first stationary electrode 3A. The RF switch 230 is in an open state (discontinuity state). This causes a signal input from the signal line 233 to be blocked, so that no signal is output from the output side signal line 234.

Figure 31:
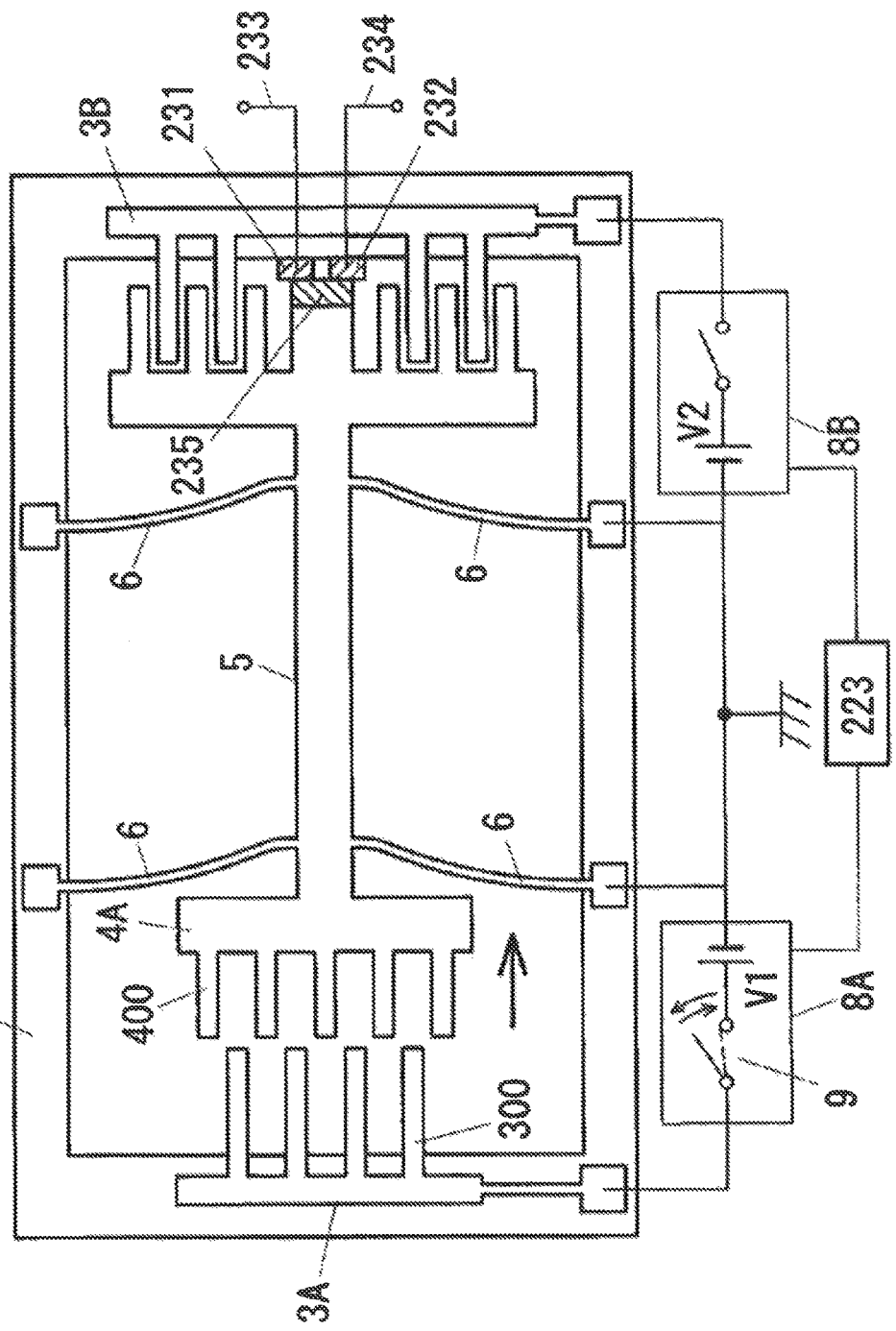
FIG. 31 is a diagram showing a continuity state of the RF switch 230.

On the other hand, if the switch 9 of the first actuation unit 8A is turned on to apply voltage V1 to between the electrodes 3A and 4A, the movable part 5 is displaced rightward to the second stable position as shown in FIG. 31. As a result, the movable contact point 235 contacts the stationary contact points 231 and 232 to allow the signal input to the signal line 233 to be output from the signal line 234. As mentioned above, if the state as illustrated in FIG. 31 is established, the application of the voltage V1 may be stopped. To bring the RF switch 230 into an open state again, it is only needed to apply the voltage V2 to the right side electrodes 3B and 4B.

Figure 32:
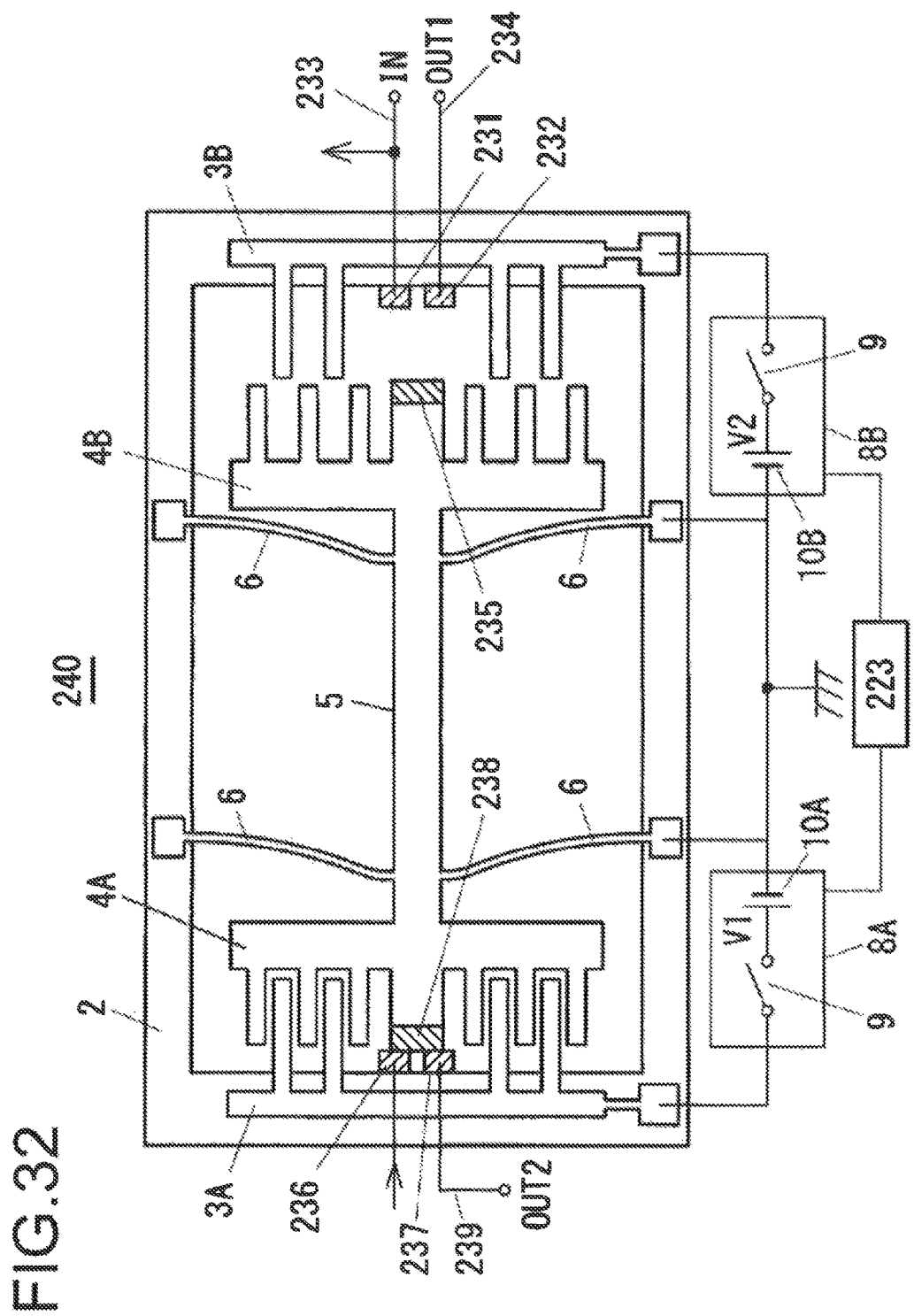
FIG. 32 is a diagram showing a construction of the RF switch 1 of a SPDT (Single Pole Double Throw) type.

FIG. 32 shows the configuration of a RF switch 240 of SPDT (Single Pole Double Throw). The RF switch 240 is provided with, in addition to the above-mentioned stationary contact points 231 and 232 and the movable contact point 235, stationary contact points 236 and 237 and a movable contact point 238 on the side of the electrodes 3A and 4A. The input side signal line 233 is connected to the stationary contact points 231 and 236. To the stationary contact point 237 is connected the signal line 239 for output. That is, the RF switch 240 is configured to selectively output the signal input from the signal line 233 via the signal line 234 or signal line 239.

In FIG. 32, the movable part 5 of the actuator is at the first stable position and the movable contact point 238 contacts the stationary contact points 236 and 237. The signal input to the signal line 233 is output from the signal line 239. In the state as shown in FIG. 32, if the voltage V1 is applied to the electrodes 3A and 4A, the movable part 5 is displaced rightward and positioned at the second stable position. As a result, the movable contact point 238 moves away from the stationary contact points 236 and 237 and the movable contact point 235 contacts the stationary contact points 231 and 232. This causes the output of signal via the signal line 239 to be stopped, so that the signal is output via the signal line 234. To return to the state shown in FIG. 32, it is only needed to apply the voltage V2 to the right side electrodes 3B and 4B.

Figure 33:
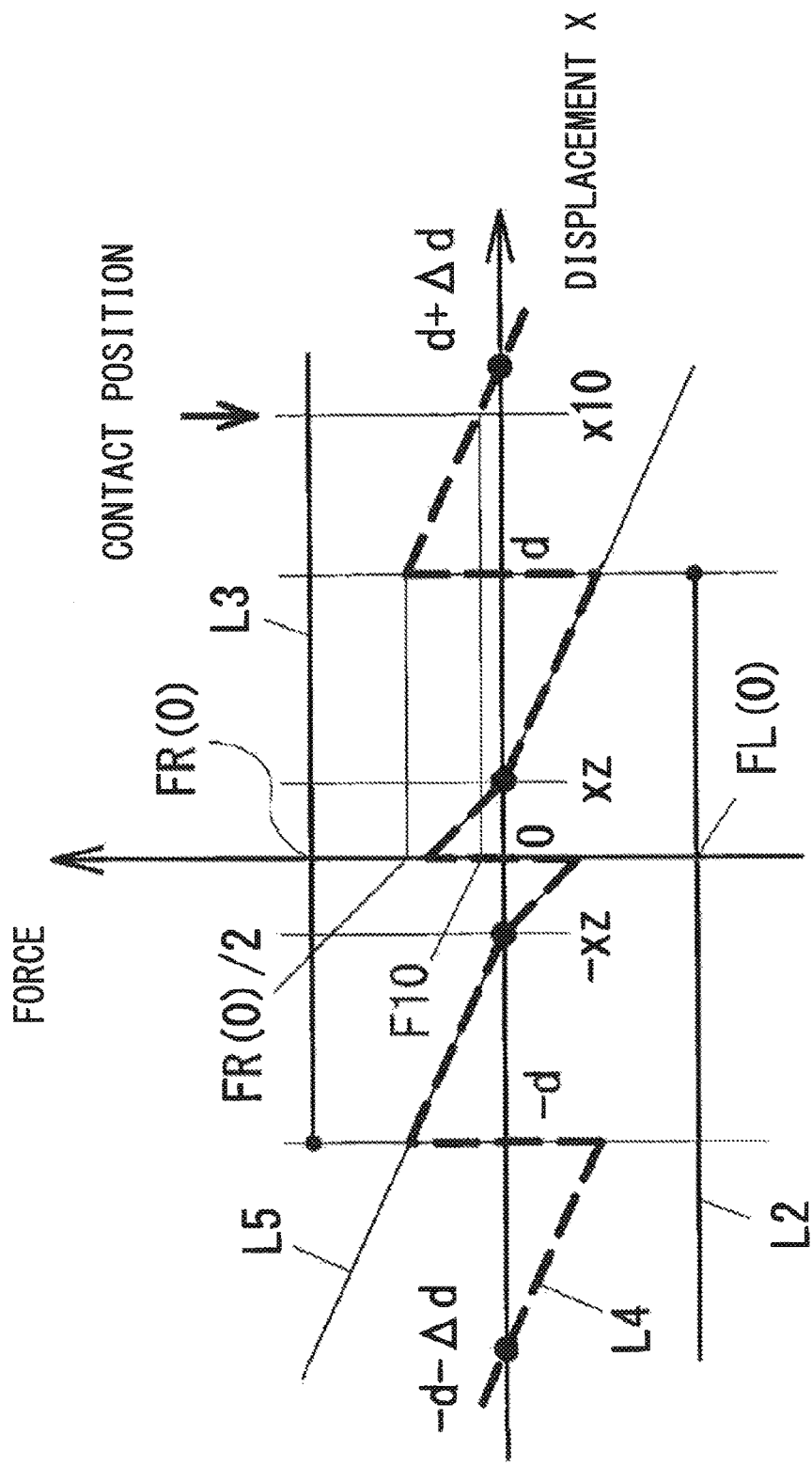
FIG. 33 is a diagram illustrating setting of a contact position.

In the configuration shown in FIG. 31, the position at which the movable contact point 235 contacts the stationary contact points 231 and 232 is set to the displacement x10 as shown in FIG. 33. This causes the movable contact point 235 to be pushed against the stationary contact points 231 and 232 with a force F10. This configuration allows displacement only up to the displacement x10 with respect to the displacement in the positive direction, that is, it is configured to allow the position to be maintained in a state in which none of the voltages V1 and voltage V2 is applied. Consequently, the displacement x10 can be deemed as a stable position (second stable position) on the right side. The stable position on the left side as shown in FIG. 32 can be set similarly.

As mentioned above, in the RF switches 230 and 240 that each include two sets of comb-teeth electrodes and are displaceable between two stable positions, it is only needed to apply voltage only when the switch is changed over. Also, the electrostatic force generated by the electrets makes the contact between the contact points reliable. A configuration with an increased stroke of the movable part 5 in the direction of mutual insertion of comb teeth enables the gap between the contact points to be increased.

Conventionally, RF switches that perform switching using electrostatic forces include one that uses a parallel-plate actuator. In such a configuration, to maintain the contact between the movable contact point and the stationary contact point, it is necessary to continue to apply a voltage of several tens volts (V) by using a booster circuit. On the other hand, in the above-mentioned RF switches 230 and 240, two stable positions created by the comb-teeth electrode structure provided with electrets are defined to be a switched-on state or a switched-off state. As a result, the voltages V1 and V2 may be applied only when the switching is performed.

The configuration as shown in FIG. 33 enables the magnitude of the voltages V1 and V2 that are necessary for the switching to be lower than the conventionally used applied voltage (several tens volts (V)). That is, use of the comb-teeth structure electrode enables an electrode area to be larger than that of the parallel-plate electrode in the same electrode space. This enables the electret voltage Ve to be made lower than the above-mentioned conventionally used applied voltage. In FIG. 33, the height of the line L4 at x=xz is FR(0)/2 and hence from the expression (2), it can be seen that the applied voltage V2 may be about 30% of the electret voltage Ve. That is, the magnitude of the voltages V1 and V2 can be decreased to 30% or less of the conventionally used applied voltage. As a result, a configuration that includes no booster circuit can be achieved.

The above-mentioned operation and advantageous effect, that a relatively large displacement distance is obtained with a relatively low applied voltage, can be achieved not only by the RF switches 230 and 240 but also by all the actuators described above and described later.

In the case of the conventionally used parallel-plate actuator, occurrence of sticking between contact points and of a change in contact resistance due to the change in force pushing the contact points are of concern. On the other hand, the actuator according to this example is configured such that the gap between the electrodes is constant and the comb teeth 400 are inserted in and removed from the comb teeth 300. In addition, the voltage V1 or V2 is applied to the opposite side electrode to perform switching and displacement by the electrostatic force generated by the opposite side electrode. This configuration causes the contact points to be separated by the electrostatic force generated by the electrets. This renders sticking between the contact points difficult to occur. If still sticking occurs, increasing the applied voltages V1 and V2 to Ve enables the force that separates the movable contact point from the stationary contact point to be increased. A force pressing the contact points is a difference between the electrostatic force at the electret voltage Ve and the elastic force so that the concern about the change in the pressing force is solved.

Second Embodiment

Figure 34:
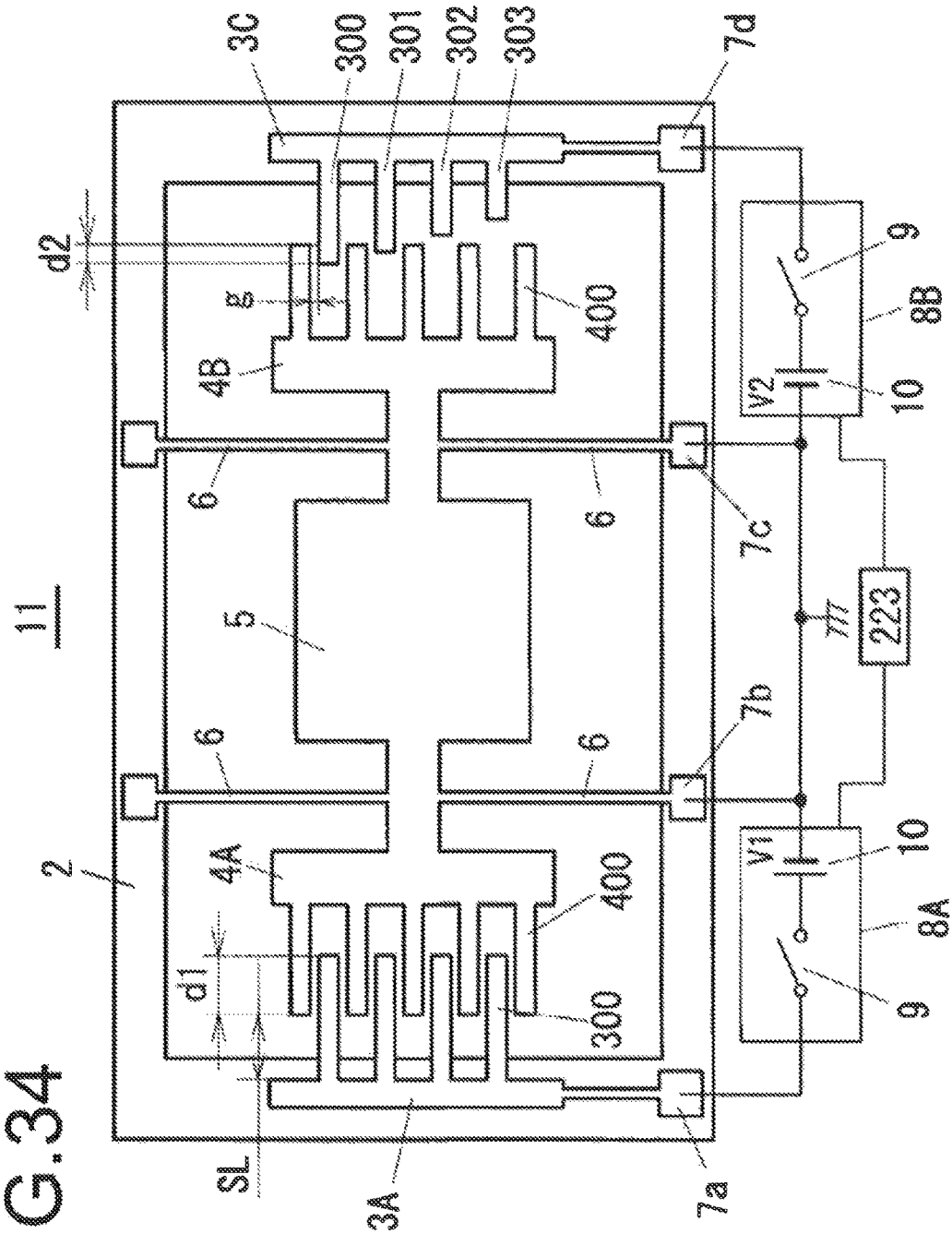
FIG. 34 is a diagram showing a second embodiment of the actuator according to the present invention.

FIG. 34 is a diagram illustrating a second embodiment of the actuator according to the present invention. The actuator 11 as shown in FIG. 34 is different from the actuator 1 in that the comb teeth 300 of a second stationary electrode 3C provided on the right side has a shape different from that of the corresponding component of the actuator 1 as shown in FIG. 1. The other components are the same as those of the actuator 1.

Figure 35:
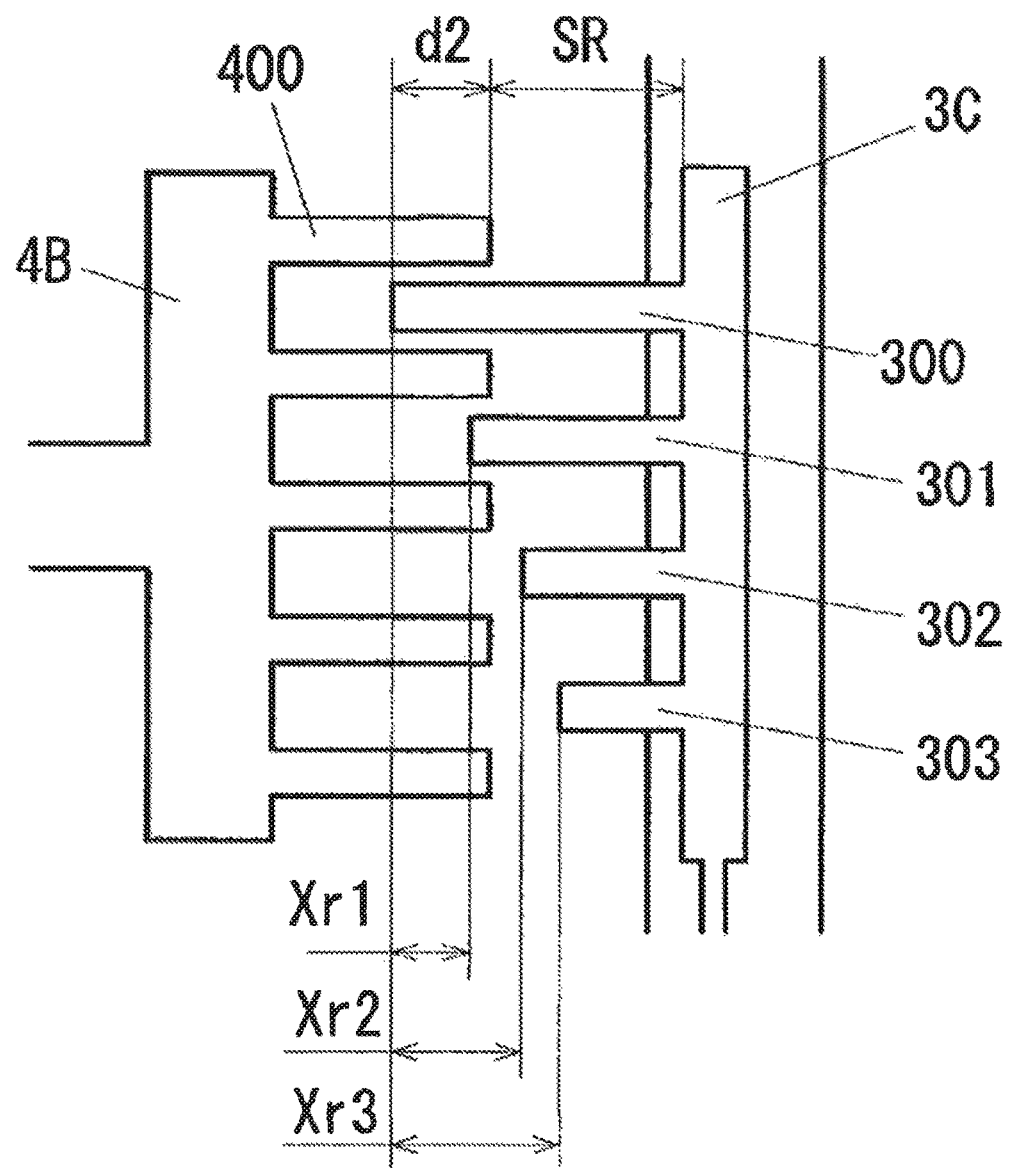
FIG. 35 is an enlarged view of the second stationary electrode 3C and the second movable electrode 4B.

FIG. 35 is an enlarged diagram showing the second stationary electrode 3C and the second movable electrode 4B. The comb teeth of the second stationary electrode 3C include four types of comb teeth 300 to 303 having different lengths. The first comb teeth 300 has an insertion amount of d2 at the displacement x=0. In contrast, the second comb teeth 301 are shorter than the first comb teeth 300 by Xr1. The third comb teeth 302 are shorter than the first comb teeth 300 by Xr2, and the fourth comb teeth 303 are shorter than the first comb teeth 300 by Xr3.

In FIGS. 34 and 35, to simplify illustration, for each of the comb teeth 300 to 303 is depicted only one comb tooth. Actually, however, each of the comb teeth 300 to 303 includes a plurality of comb teeth in numbers NR1, NR2, NR3, and NR4, respectively. In the same manner, the number of comb teeth 300 in the first stationary comb teeth 3A is assumed to be NL. Also, it is assumed that in the electrodes 3A and 4A and the electrodes 3C and 4B, the distance between the comb teeth 300 and the comb teeth 400 is g and the comb teeth 300 and 400 have each a thickness b as shown in FIG. 34. Further, it is assumed that the distance between the front edge of the comb teeth 400 and the stationary electrode at the displacement x=0 is SL for the first movable electrode 4A and SR for the second movable electrode 4B.

Figure 36:
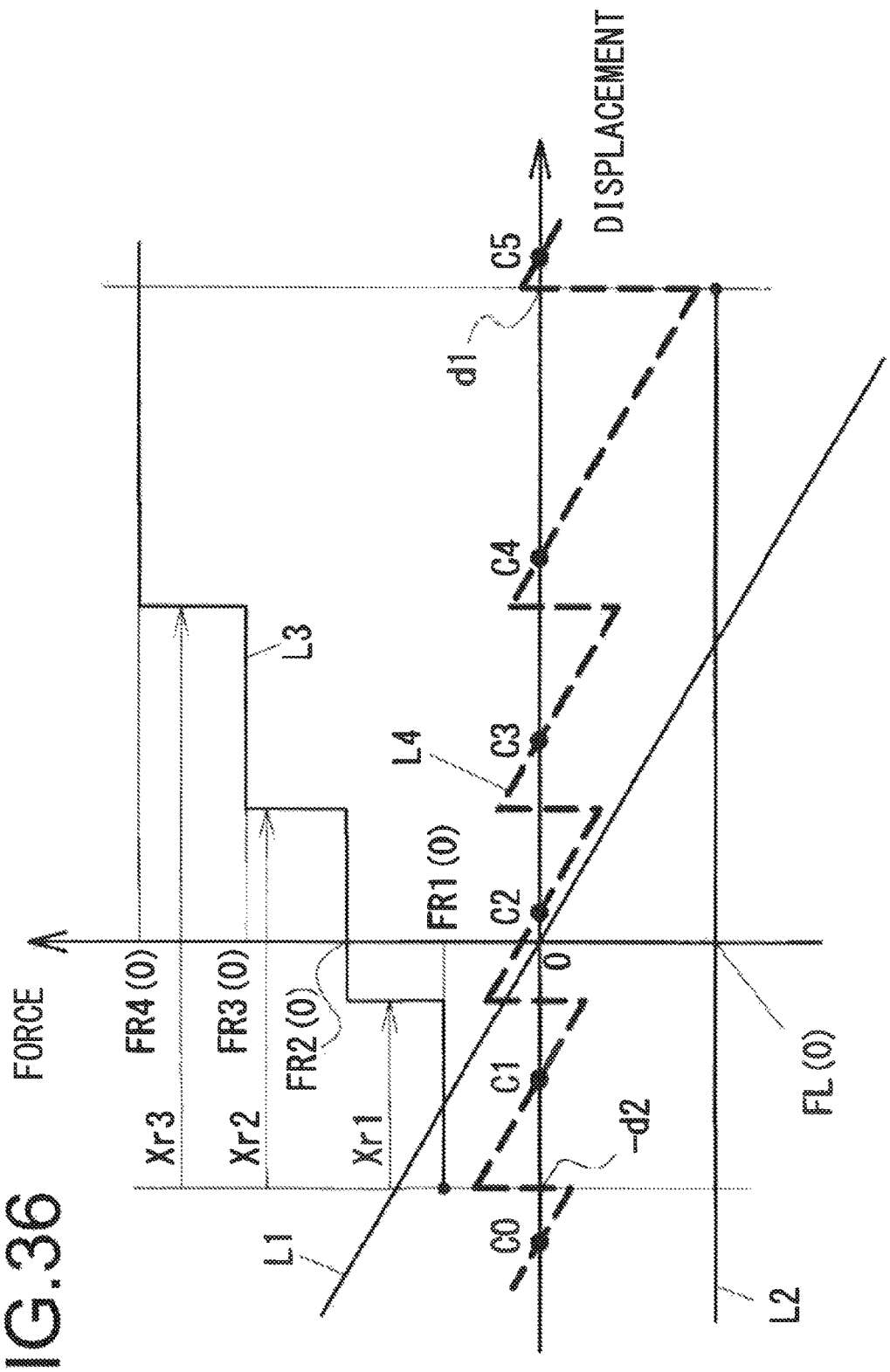
FIG. 36 is diagram illustrating a relationship between the displacement x and the force exerted on the movable part 5 when V1=V2=0.

Then, the motion of the actuator 11 is explained with reference to FIGS. 36 to 47. FIG. 36 is a diagram illustrating the relationship between the displacement x and the force exerted on the movable part 5 when the voltages V1 and V2 are not applied to the first actuation unit 8A and the second actuation unit 8B, respectively. In the same manner as in FIG. 4, the vertical axis represents the force and the horizontal axis represents the displacement x. The line L1 indicates the elastic force exerted by the elastic support part 6 and the line L2 indicates the electrostatic force acting between the first stationary electrode 3A and the first movable electrode 4A. The line L3 indicates the electrostatic force acting between the second stationary electrode 3C and the second movable electrode 4B. The second stationary electrode 3C includes four types of comb teeth 300 differing in length and the line L3 changes stepwise according to the displacement x. The line L4 in a broken line indicates the total force acting on the movable part 5.

At x≤−d2, all the groups of the comb teeth 300 to 303 of the second stationary electrode 3C are out from between the comb teeth 400 to make the insertion amount to be zero (=0), so that the electrostatic force acting between the second stationary electrode 3C and the second movable electrode 4B is zero. Consequently, the total force is the sum of the elastic force f(x)=−kx and the electrostatic force FL(0). The electrostatic force FL(0) is represented by the following expression (7). Here, Ve represents a voltage generated by the electrets. The line L4 crosses the horizontal axis at the position indicated by a filled circle C0. At the crossing point, the elastic force in the positive direction matches with the electrostatic force FL(0) in the negative direction.

$$FL(0) = -NL\varepsilon_0 b Ve^2/g \quad (7)$$

At −d2<x≤−d2+Xr1, the insertion amount≠0 for the first comb teeth 300 and the insertion amount=0 is maintained for the second comb teeth 301, the third comb teeth 302, and the fourth comb teeth 303. From this, the electrostatic force FR1(0) generated by the second stationary electrode 3C and the second movable electrode 4B is represented by the following expression (8). Consequently, the total force is the sum of the elastic force f(x)=−kx, the electrostatic force FL(0), and the electrostatic force FR1(0). The line L4 crosses the horizontal axis at the position indicated by the filled circle C1 and at this crossing point, the force in the positive direction (elastic force f(x)+electrostatic force FR1(0)) matches with the electrostatic force FL(0) in the negative direction.

$$FR1(0)=NR1\varepsilon_0 bVe^2/g \quad (8)$$

At $-d2+Xr1<x\le-d2+Xr2$, the insertion amount is not zero ($\ne 0$) for the first comb teeth 300 and the second comb teeth 301. The insertion amount=0 is maintained for the third comb teeth 302 and the fourth comb teeth 303. Accordingly, the electrostatic force FR2(0) acting between the second stationary electrode 3C and the second movable electrode 4B is as represented by the following expression (9). Consequently, the total force is the sum of the elastic force f(x)=−kx, the electrostatic force FL(0), and the electrostatic force FR2(0). The line L4 crosses the horizontal axis at the position of the filled circle C2. At this crossing point, the electrostatic force FR2(0) in the positive direction is matching with the force in the negative direction (elastic force f(x)+electrostatic force FL(0)).

$$FR2(0)=(NR1+NR2)\varepsilon_0 bVe^2/g \quad (9)$$

At $-d2+Xr2<x\le-d2+Xr3$, the insertion amount≠0 for the first comb teeth 300, the second comb teeth 301, and the third comb teeth 302. The insertion amount=0 is maintained for the fourth comb teeth 303. Accordingly, the electrostatic force FR3(0) acting between the second stationary electrode 3C and the second movable electrode 4B is represented by the following expression (10). Consequently, the total force is the sum of the elastic force f(x)=−kx, the electrostatic force FL(0), and the electrostatic force FR3(0). The line L4 crosses the horizontal axis at the position indicated by the filled circle C3. At this crossing point, the electrostatic force FR3(0) in the positive direction matches with the force in the negative direction (elastic force f(x)+electrostatic force FL(0))

$$FR3(0)=(NR1+NR2+NR3)\varepsilon_0 bVe^2/g \quad (10)$$

At $-d2+Xr3<x\le d1$, the insertion amount≠0 for all the first comb teeth 300, the second comb teeth 301, the third comb teeth 302, and the fourth comb teeth 303. Accordingly, the electrostatic force FR4(0) acting between the second stationary electrode 3C and the second movable electrode 4B is as represented by the following expression (11). Consequently, the total force is the sum of the elastic force f(x)=−kx, the electrostatic force FL(0), and the electrostatic force FR4(0). The line L4 crosses the horizontal axis at the position of the filled circle C4. At this crossing point, the electrostatic force FR4(0) in the positive direction is matching with the force in the negative direction (elastic force f(x)+electrostatic force FL(0)).

$$FR4(0)=(NR1+NR2+NR3+NR4)\varepsilon_0 bVe^2/g \quad (11)$$

At $d1\le x$, the front edges of the comb teeth 300 of the first stationary electrode 3A are out from between the comb teeth 400 of the first movable electrode 4A, so that the insertion amount is zero. Accordingly, the electrostatic force FL(0) acting between the first stationary electrode 3A and the first movable electrode 4A is zero, so that the total force is the sum of the elastic force f(x)=−kx and the electrostatic force FR4(0). The line L4 crosses the horizontal axis at the position of the filled circle C5. At this crossing point, the electrostatic force FR4(0) in the positive direction is matching with the elastic force f(x) in the negative direction.

As shown in FIG. 36, the total force (line L4) changes discontinuously at displacements x=−d2, −d2+Xr1, −d2+Xr2, −d2+Xr3, and d1. Comparison of bottom values before the changes with each other and comparison of top values before the changes with each other indicate that both types of values decrease in the order of the displacement x=−d2, −d2+Xr1, −d2+Xr2, −d2+Xr3, and d1. The sizes of the comb teeth 300 to 303 and the comb teeth 400 and d1, d2 and so on are set so that this relationship is established.

Figure 37:
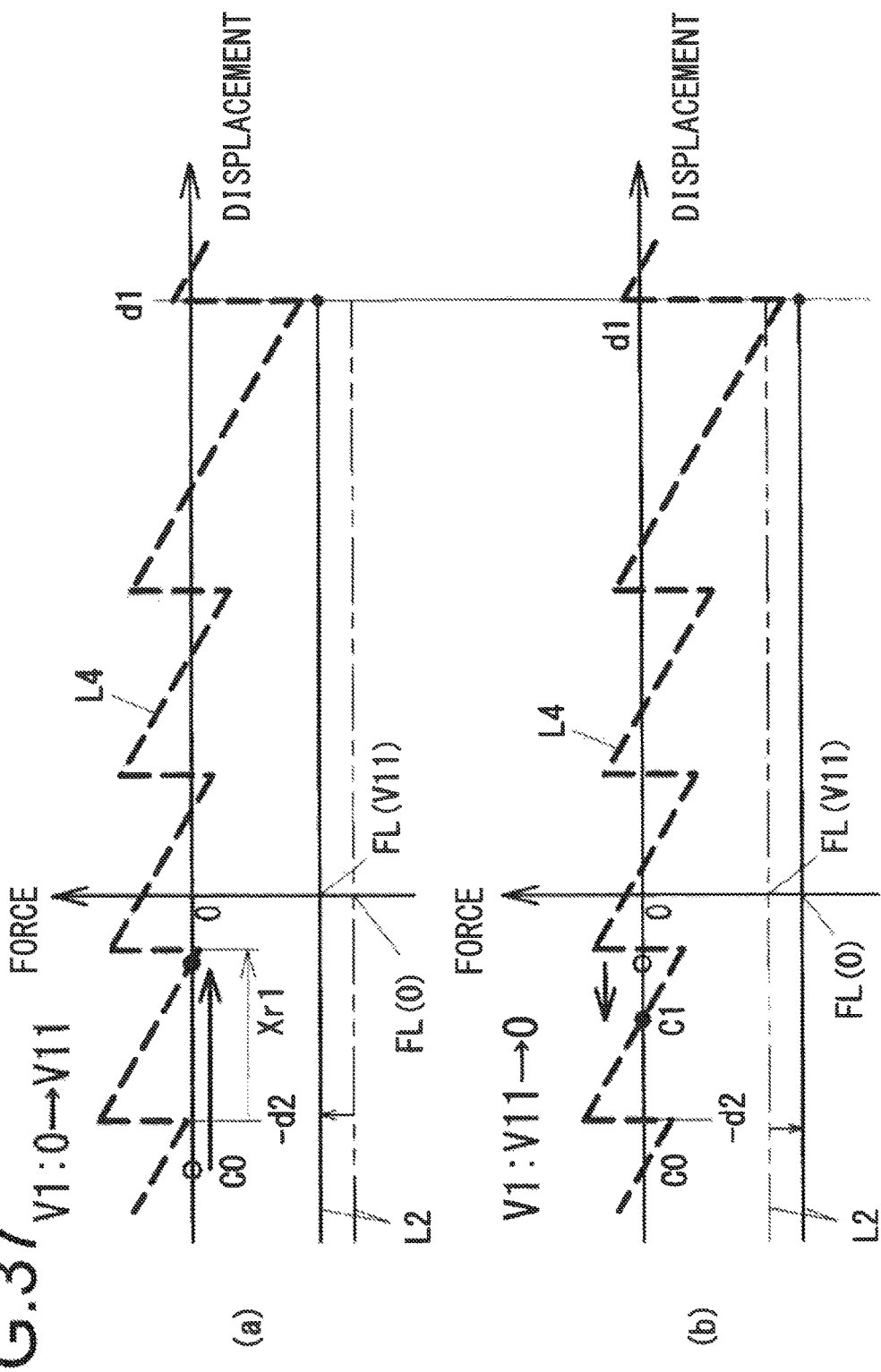
FIG. 37 shows diagrams explaining the displacement of the movable part 5 at a balanced position C0 to a balanced position C1.

FIG. 37 shows diagrams illustrating displacement of the movable part 5 at the balanced position C0 at V1=V2=0 to the balanced position C1. In this case, the voltage V1=V11 is applied such that for the electrodes 3A and 4A on the left side, the total force (f(x)+FL(V11)) at the displacement x=−d2 is positive and the total force (f(x)+FL(V11)+FR1(0)) at the displacement x=−d2+Xr1 is negative.

This causes the line L4 at x<d1 to be displaced upward in the figure by a difference=FL(V11)−FL(0) as shown in FIG. 37(a). As a result, between the balanced position C0 indicated by an open circle and the position indicated by a filled circle, which is a crossing point at which the line L4 crosses the horizontal axis, the total force is positive so that the movable part 5 is displaced in the positive direction and is balanced at the position indicated by the filled circle. Subsequently, as shown in FIG. 37(b), if the application of the voltage V1 is stopped, the line L4 returns to the state similar to that shown in FIG. 36 and the movable part 5 is displaced to the balanced position C1.

Figure 38:
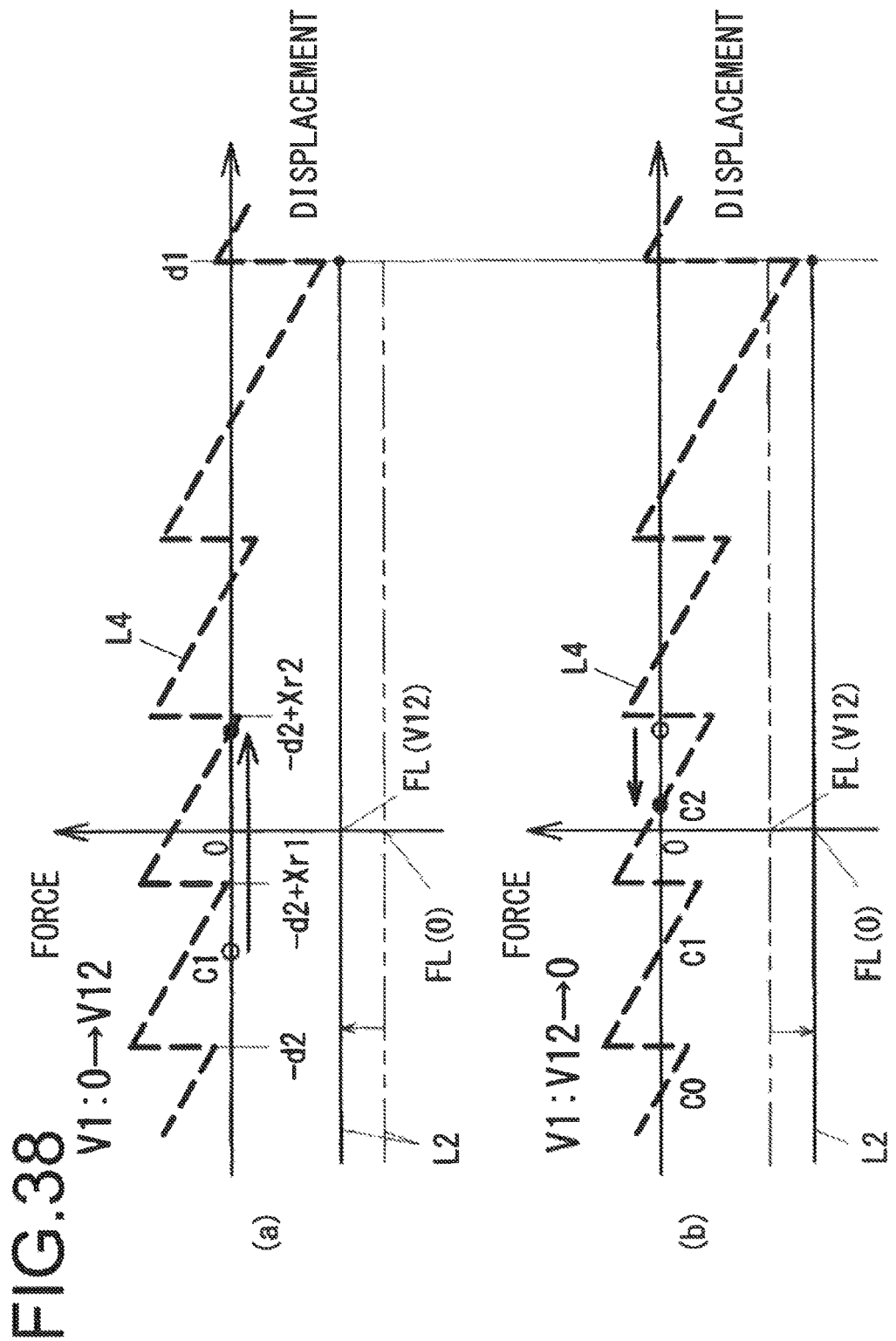
FIG. 38 shows diagrams explaining the displacement of the movable part 5 at the balanced position C1 to a balanced position C2.

FIG. 38 shows diagrams illustrating displacement of the movable part 5 that is located at the balanced position C1 as shown in FIG. 37(b) to the balanced position C2. In this case, the voltage V1=V12 is applied such that for the electrodes 3A and 4A on the left side, the total force (f(x)+FL(V12)+FR1(0)) at the displacement x=−d2+Xr1 is positive and the total force (f(x)+FL(V12)+FR2(0)) at the displacement x=−d2+Xr2 is negative.

This causes the line L4 at x<d1 to be displaced upward in the figure by a difference=FL(V12)−FL(0) as shown in FIG. 38(a). As a result, the total force is positive between the balanced position C1 indicated by an open circle and the position indicated by a filled circle, at which the line L4 crosses the horizontal axis, and the movable part 5 is displaced in the positive direction and is balanced at the position indicated by the filled circle. Subsequently, if the application of the voltage V1 is stopped, as shown in FIG. 38(b), the line L4 returns to the state similarly to the case as shown in FIG. 36 and the movable part 5 is displaced to the balanced position C2.

Figure 39:
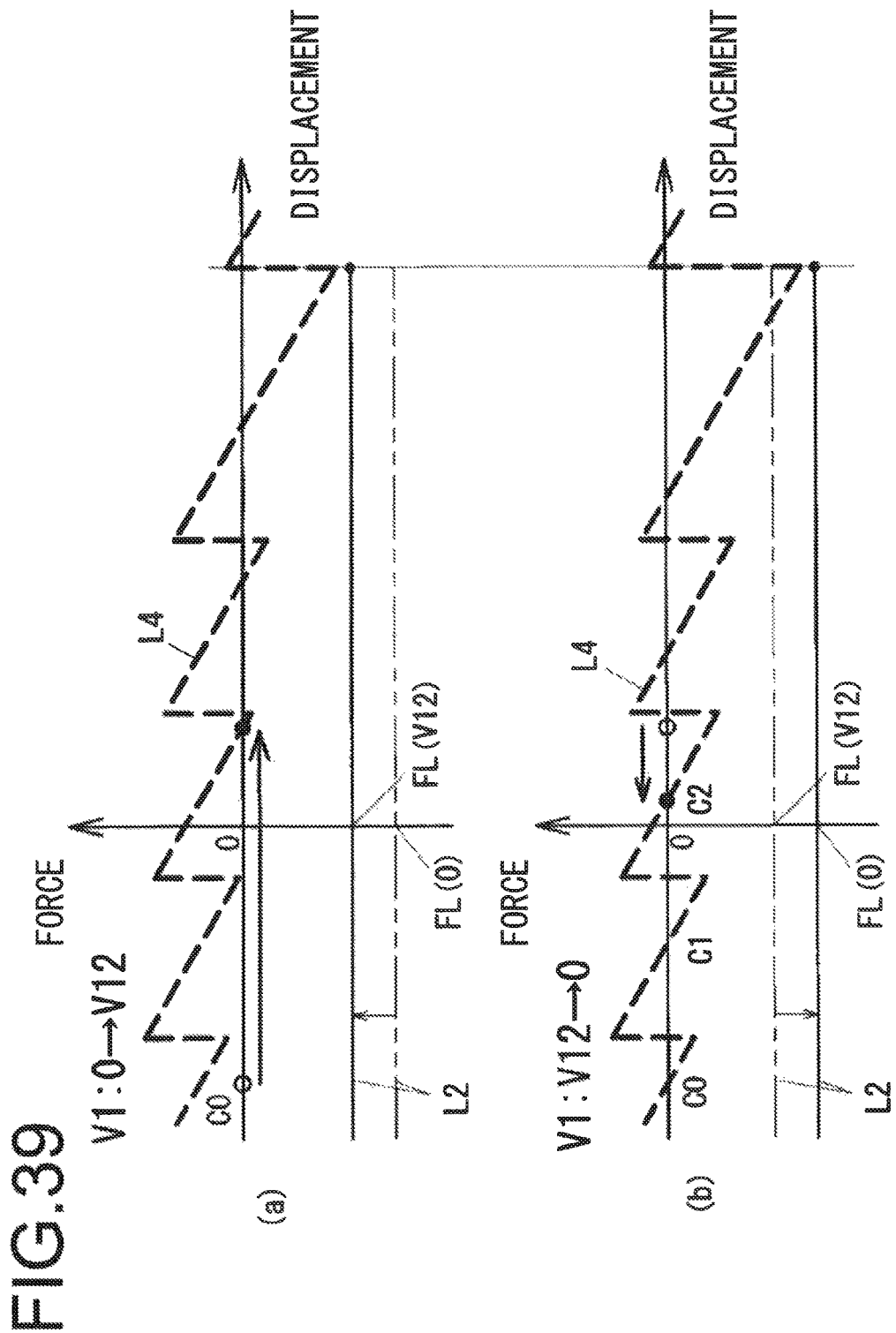
FIG. 39 shows diagrams explaining the displacement of the movable part 5 at the position C0 to the position C2.

FIG. 38 illustrates the displacement of the movable part 5 from the position C1 to the position C2. FIG. 39 illustrates the displacement of the movable part 5 from the position C0 to the position C2 after the applied voltage V1=V12 is applied at the position C0. In this case, as shown in FIG. 39(a), the movable part 5 is displaced at once from the position C0 to the position indicated by the filled circle. Subsequently, if the application of the voltage V1 is stopped, the movable part 5 is displaced to the balanced position C2.

Figure 40:
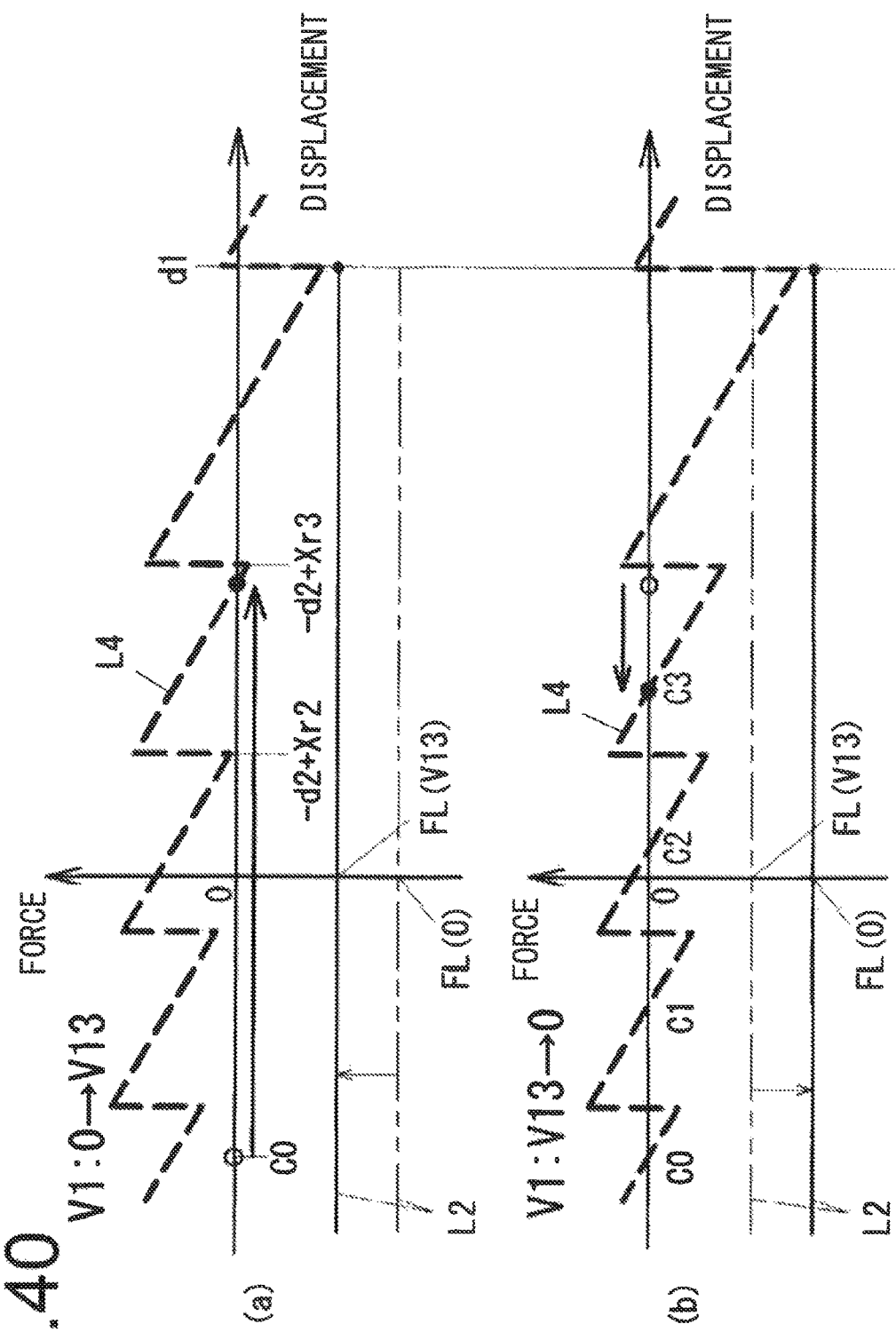
FIG. 40 shows diagrams explaining the displacement of the movable part 5 at the position C0 to a position C3.

FIG. 40 shows diagrams illustrating the displacement of the movable part 5 located at the position C0 to the position C3. In this case, the voltage V1=V13 is applied to the electrodes 3A and 4A on the left side such that the total force (f(x)+FL(V13)+FR2(0)) at the displacement x=−d2+Xr2 is positive and the total force (f(x)+FL(V13)+FR3(0)) at the displacement x=−d2+Xr3 is negative.

This causes the line L4 at x<d1 to be displaced upward by a difference=FL(V13)−FL(0) as FIG. 40(a). As a result, the total force is positive between the position C0 and the position indicated by a filled circle at which the line L4 crosses the horizontal axis. The movable part 5 is displaced in the positive direction and is balanced at the position indicated by the filled circle. Subsequently, if the application of the voltage V1 is stopped, as shown in FIG. 40(b), the line L4 returns to the state similarly to the case as shown in FIG. 36 and the movable part 5 is displaced to the balanced position C3.

Figure 41:
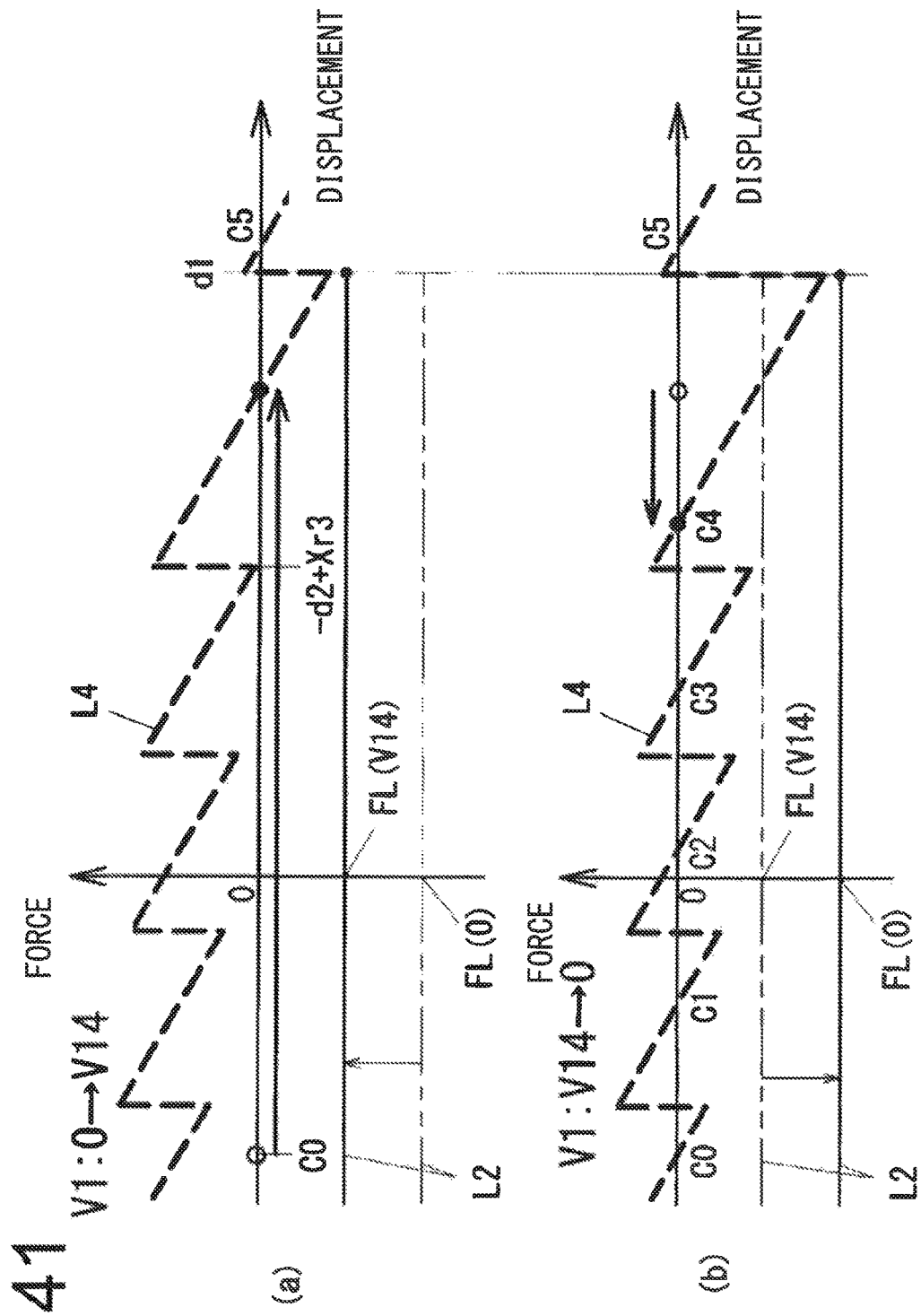
FIG. 41 shows diagrams explaining the displacement of the movable part 5 at the position C0 to a position C4.

FIG. 41 shows diagrams illustrating the displacement of the movable part 5 located at the position C0 to the position C4. In this case, the voltage V1=V14 is applied to the electrodes 3A and 4A on the left side such that the total force (f(x)+FL(V14)+FR4(0)) at the displacement x=−d2+Xr3 is positive and the total force (f(x)+FL(V14)+FR3(0)) at the displacement x=d1 is negative.

This causes the line L4 at x<d1 to be displaced upward in the figure by a difference=FL(V14)−FL(0) as shown in FIG. 41(a). As a result, the total force is positive between the position C0 and the position indicated by the filled circle, at which the line L4 crosses the horizontal axis, so that the movable part 5 is displaced in the positive direction and is balanced at the position of the filled circle. Subsequently, if the application of the voltage V1 is stopped, as shown in FIG. 41(b), the line L4 returns to the state similarly to the case as shown in FIG. 36 and the movable part 5 is displaced to the balanced position C4.

Figure 42:
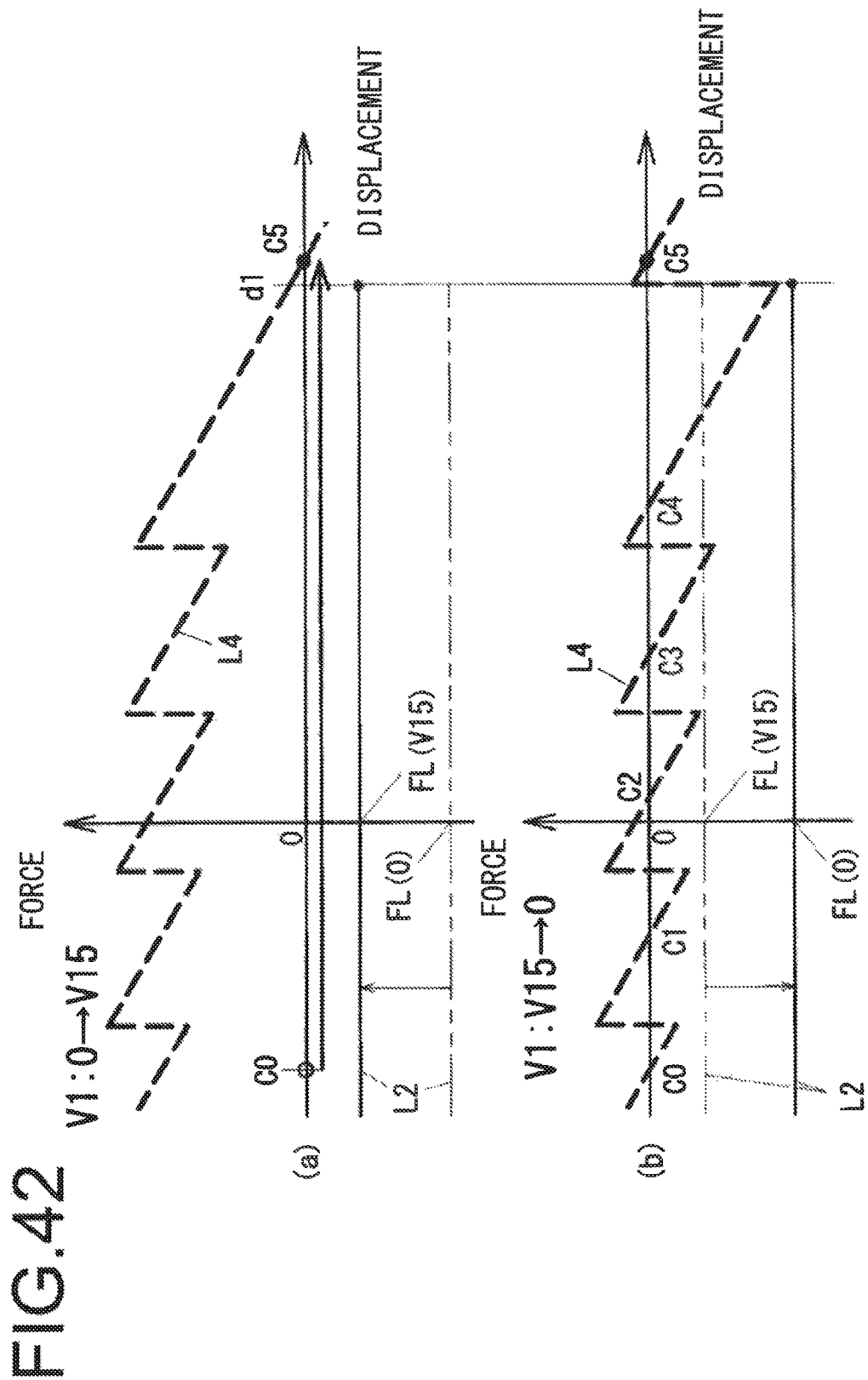
FIG. 42 shows diagrams explaining the displacement of the movable part 5 at the position C0 to a position C5.

FIG. 42 shows diagrams illustrating the displacement of the movable part 5 located at the position C0 to the position C5. In this case, the voltage V1=V15 is applied to the electrodes 3A and 4A on the left side such that the total force (f(x)+FL(V15)+FR4(0)) at the displacement x=d1 is positive. This causes the line L4 at x<d1 to be displaced upward in the figure by a difference=FL(V15)−FL(0) as shown in FIG. 42(a). As a result, the total force is positive between the position C0 and the position C5 at which the line L4 crosses the horizontal axis, so that the movable part 5 is displaced in the positive direction and is balanced at the position C5. Subsequently, if the application of the voltage V1 is stopped, as shown in FIG. 42(b), the line L4 returns to the state similar to the state as shown in FIG. 36.

Figure 43:
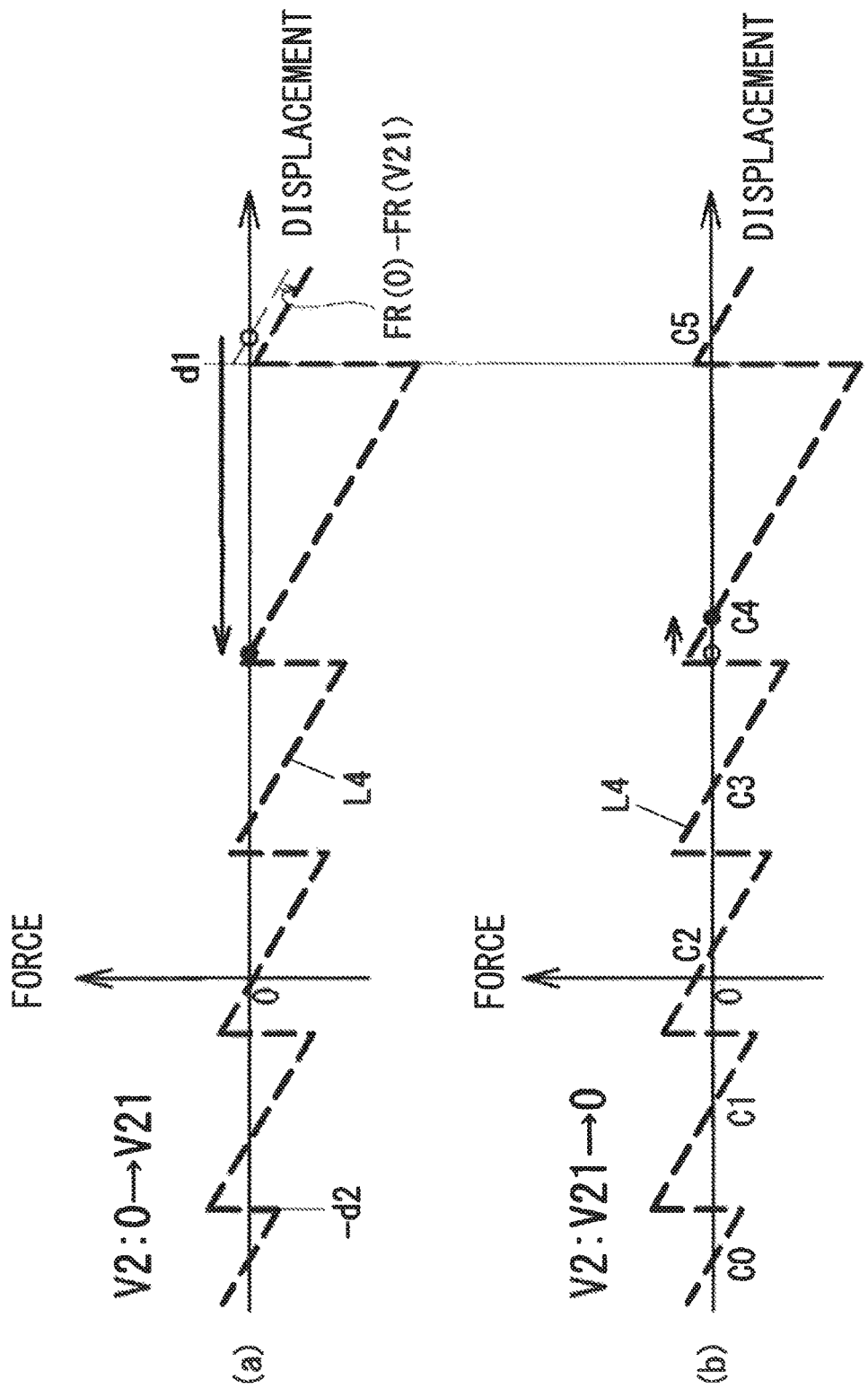
FIG. 43 shows diagrams explaining the displacement of the movable part 5 at the position C5 to the position C4.

FIG. 43 is a diagram illustrating the displacement of the movable part 5 located at the position C5 to the position C4. In this case, the voltage V2=V21 is applied to the electrodes 3C and 4B on the right side such that the total force (f(x)+FR4(V21)) at the displacement x=d1 is negative and the total force (f(x)+FL(0)+FR4(V21)) at the displacement x=−d2+Xr3 is positive.

This causes the line L4 at x>−d2 to be displaced downward in the figure by a difference=FR(0)−FR(V21) as shown in FIG. 43(a). As a result, the total force between the position C5 and the position of a filled circle at which the line L4 crosses the horizontal axis is negative, so that the movable part 5 is displaced in the negative direction and is balanced at the position of the filled circle. Subsequently, if the application of the voltage V2 is stopped, as shown in FIG. 43(b), the line L4 returns to the state similar to the state as shown in FIG. 36 and the movable part 5 is displaced to the balanced position C4.

Figure 44:
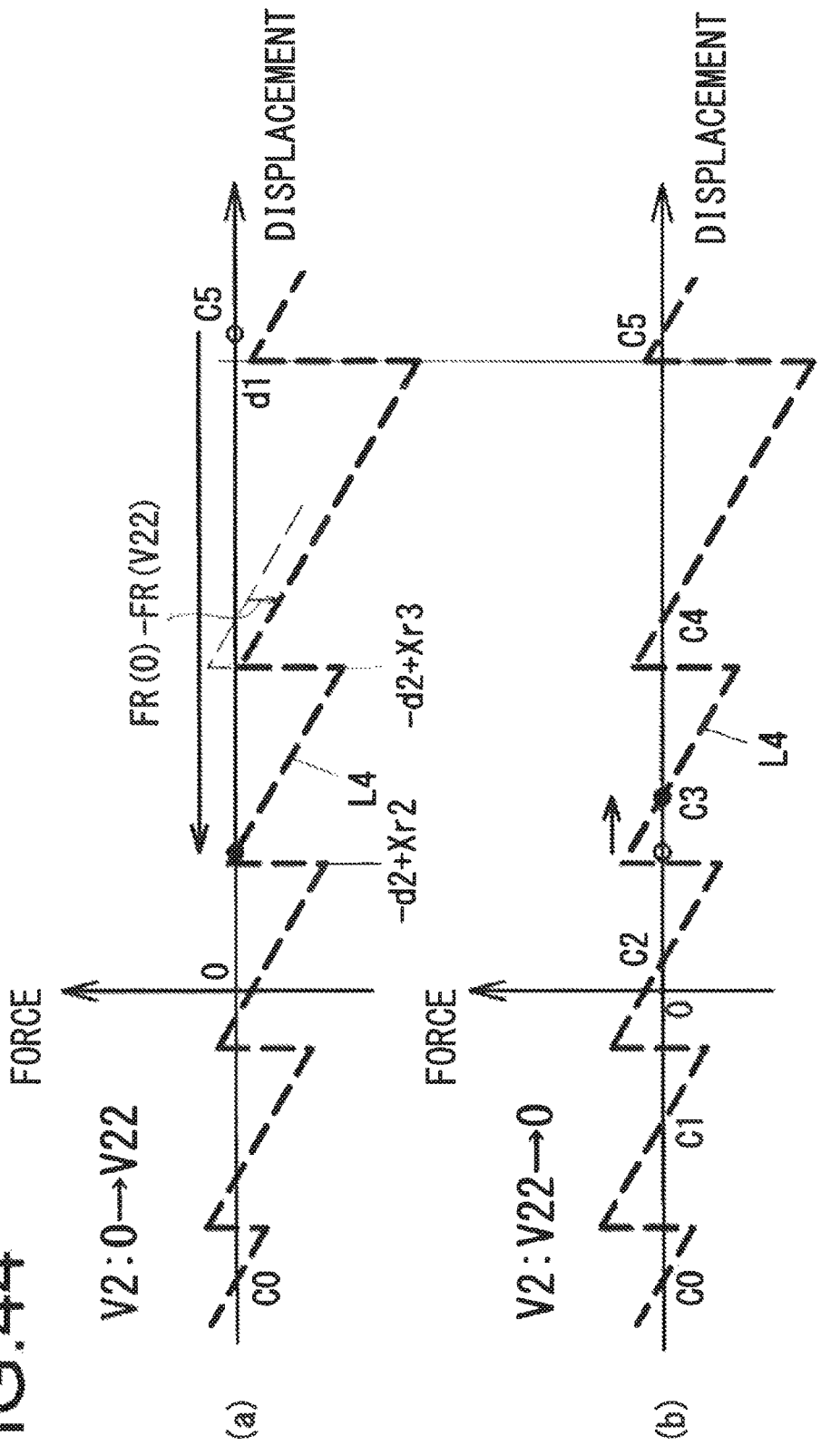
FIG. 44 shows diagrams explaining the displacement of the movable part 5 at the position C5 to the position C3.

FIG. 44 shows diagrams illustrating the displacement of the movable part 5 at the position C5 to the position C3. In this case, the voltage V2=V22 is applied to the electrodes 3C and 4B on the right side such that the total force (f(x)+FL(0)+FR4(V22)) at the displacement x=−d2+Xr3 is negative and the total force (f(x)+FL(0)+FR3(V22)) at the displacement x=−d2+Xr2 is positive.

This causes the line L4 at x>−d2 to be displaced downward in the figure by a difference=FR(0)−FR(V22) as shown in FIG. 44(a). As a result, the total force is negative between the position C5 and the position indicated by a filled circle at which the line L4 crosses the horizontal axis, so that the movable part 5 is displaced in the negative direction and is balanced at the position of the filled circle. Subsequently, if the application of the voltage V2 is stopped, as shown in FIG. 44(b), the line L4 returns to the state similar to the state as shown in FIG. 36, and the movable part 5 is displaced to the balanced position C3.

Figure 45:
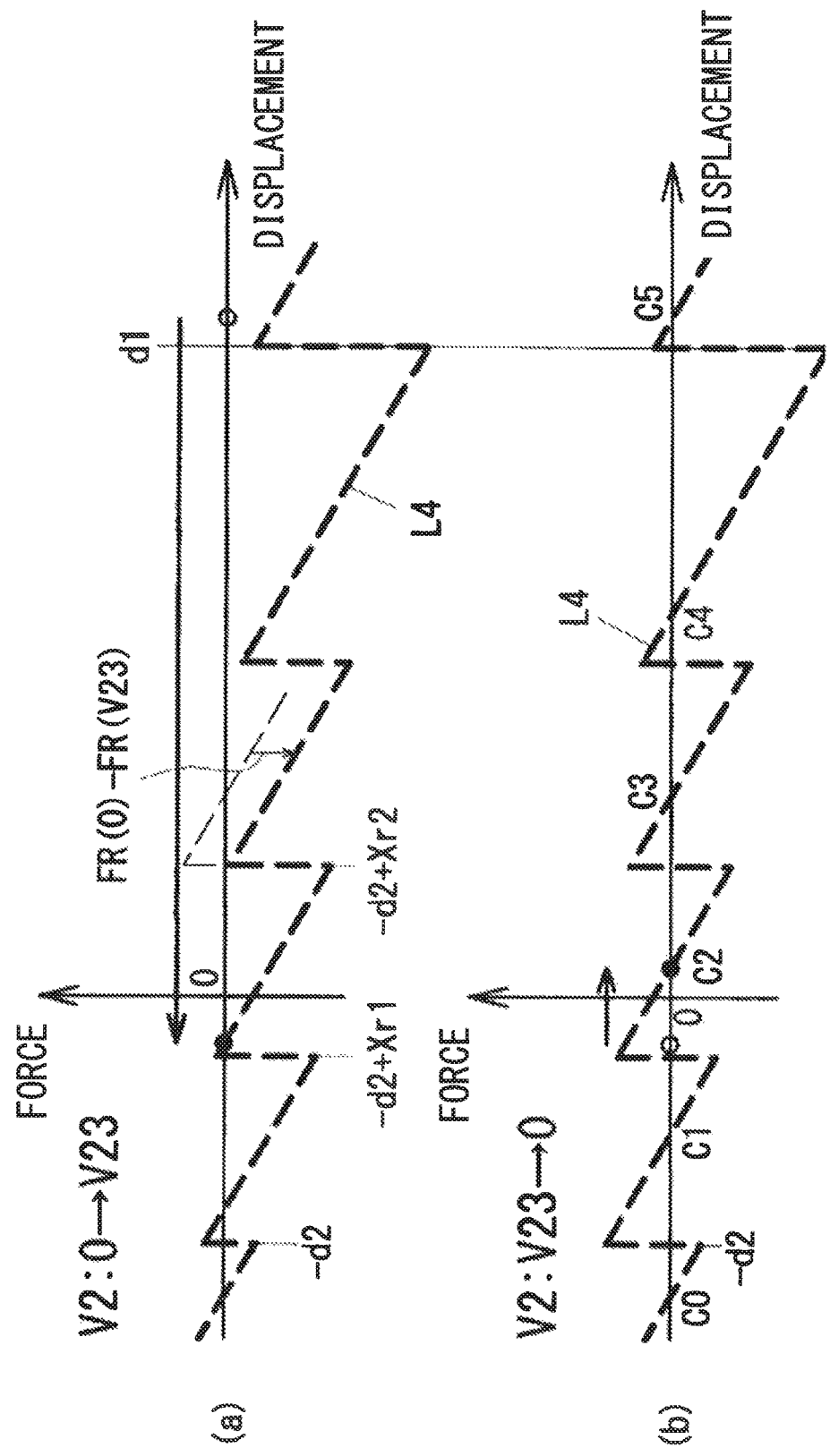
FIG. 45 shows diagrams explaining the displacement of the movable part 5 at the position C5 to the position C2.

FIG. 45 shows diagrams illustrating the displacement of the movable part 5 located at the position C5 to the position C2. In this case, the voltage V2=V23 is applied to the electrodes 3C and 4B on the right side such that the total force (f(x)+FL(0)+FR3(V23)) at the displacement x=−d2+Xr2 is negative and the total force (f(x)+FL(0)+FR2(V23)) at the displacement x=−d2+Xr1 is positive.

This causes the line L4 at x>−d2 to be displaced downward in the figure by a difference=FR(0)−FR(V23) as shown in FIG. 45(a). As a result, the total force is negative between the position C5 and the position indicated by a filled circle at which the line L4 crosses the horizontal axis, so that the movable part 5 is displaced in the negative direction and is balanced at the position of the filled circle. Subsequently, if the application of the voltage V2 is stopped, as shown in FIG. 45(b), the line L4 returns to the state similar to the state as shown in FIG. 36 and the movable part 5 is displaced to the balanced position C2.

Figure 46:
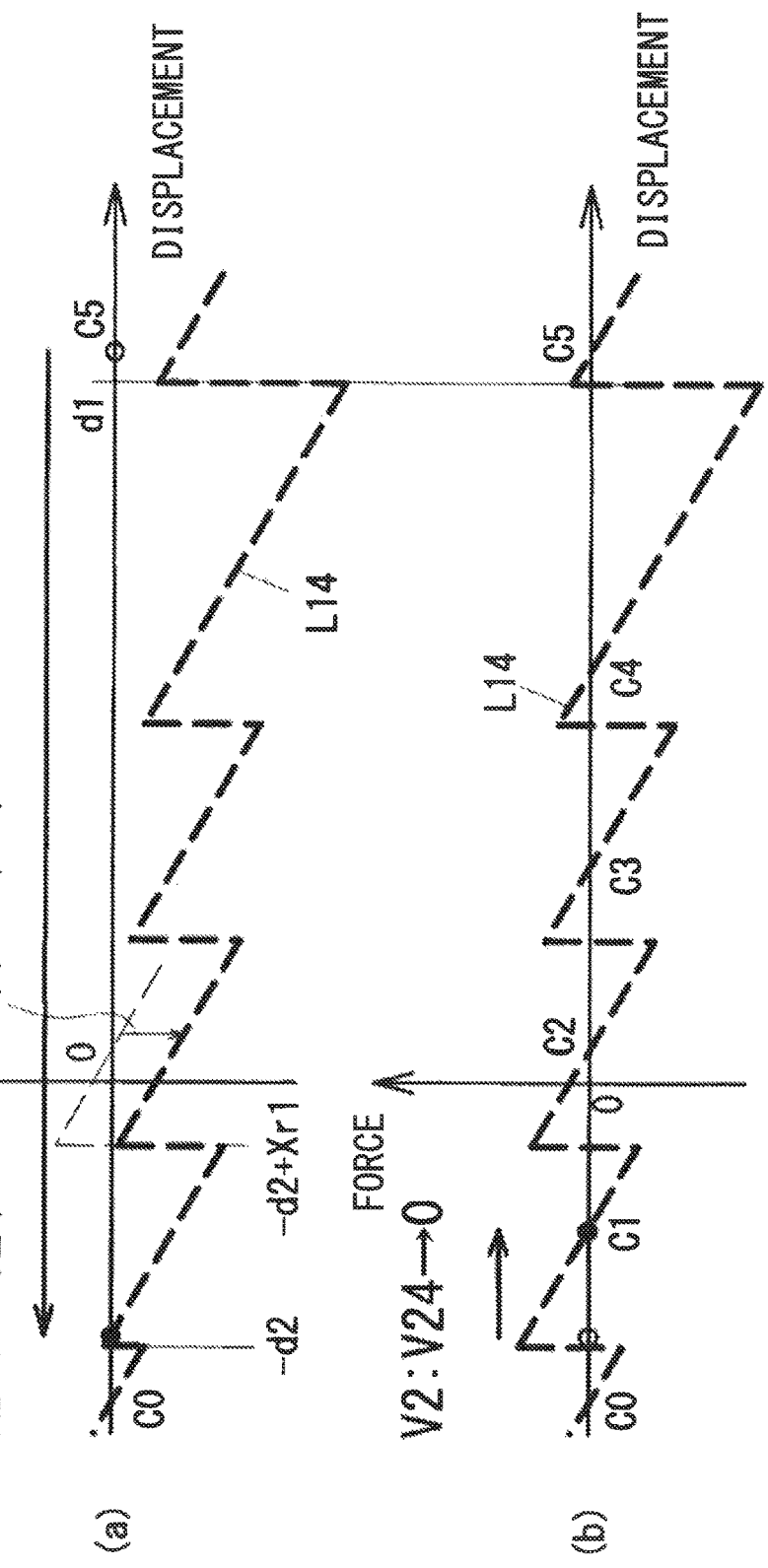
FIG. 46 shows diagrams explaining the displacement of the movable part 5 at the position C5 to the position C1.

FIG. 46 shows diagrams illustrating the displacement of the movable part 5 located at the position C5 to the position C1. In this case, the voltage V2=V24 is applied to the electrodes 3C and 4B on the right side such that the total force (f(x)+FL(0)+FR2(V24)) at the displacement x=−d2+Xr1 is negative and the total force (f(x)+FL(0)+FR1(V24)) at the displacement x=−d2 is positive.

This causes the line L4 at x>−d2 to be displaced downward in the figure by a difference=FR(0)−FR(V24) as shown in FIG. 46(a). As a result, the total force is negative between the position C5 and the position indicated by a filled circle at which the line L4 crosses the horizontal axis, so that the movable part 5 is displaced in the negative direction and is balanced at the position of the filled circle. Subsequently, if the application of the voltage V2 is stopped, as shown in FIG. 46(b), the line L4 returns to the state similar to the state as shown in FIG. 36 and the movable part 5 is displaced to the balanced position C1.

Figure 47:
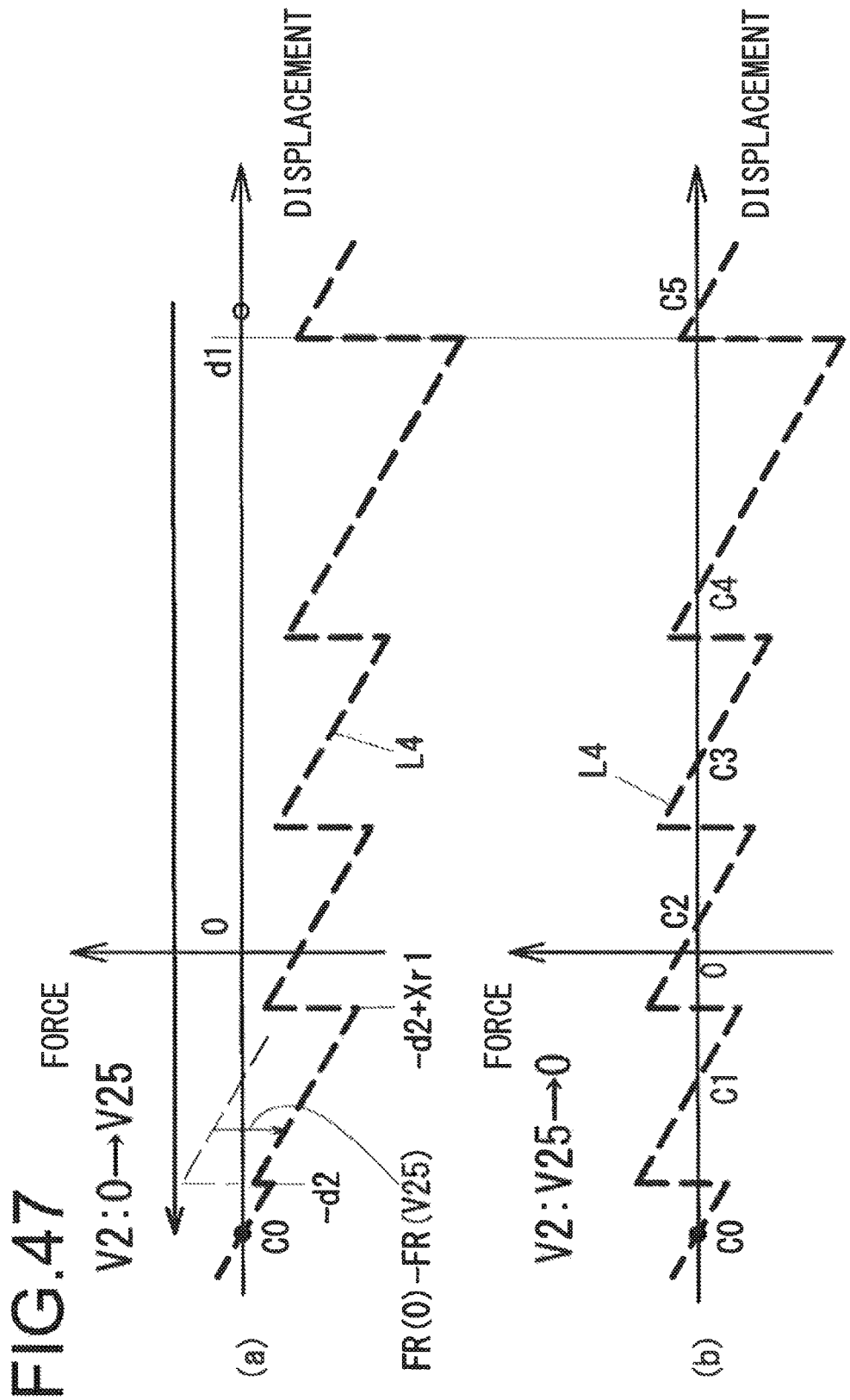
FIG. 47 shows diagrams explaining the displacement of the movable part 5 at the position C5 to the position C0.

FIG. 47 shows diagrams illustrating the displacement of the movable part 5 at the position C5 to the position C0. In this case, the voltage V2=V25 is applied to the electrodes 3C and 4B on the right side such that the total force (f(x)+FL(0)+FR2(V25)) at the displacement x=−d2 is negative. This causes the line L4 at x>−d2 to be displaced downward in the figure by a difference=FR(0)−FR(V25) as shown in FIG. 47(a). As a result, the total force is negative between the position C5 and the position C0, so that the movable part 5 is displaced in the negative direction and is balanced at the position C0. Subsequently, if the application of the voltage V2 is stopped, as shown in FIG. 47(b), the line L4 returns to the state similar to the state as shown in FIG. 36.

In the explanation of the motions shown in FIGS. 43 to 47, the voltage V2 is applied to the electrodes 3C and 4B to decrease the electrostatic force on the side of the electrodes 3C and 4B to displace the movable part 5 to a stable position closer to the electrodes 3A and 4A. However, instead of decreasing the attraction force by the electrostatic force on the side of the electrodes 3C and 4B, the electrostatic force on the side of the electrodes 3A and 4A may be increased by applying the voltage V1 of the same polarity as that of the voltage of the electrets. As a result, the force in the direction shown in the figure increases and similarly to the case illustrated in FIGS. 43 to 47 enables the movable part 5 to be displaced to a stable position closer to the electrodes 3A and 4A. Alternatively, application of voltages to both the electrodes 3C and 4B and to the electrodes 3A and 4A enables displacement to the stable position. In that case, the voltages V1 and V2 are adjusted to voltages necessary for the displacement.

The actuator 11 as shown in FIG. 34 is provided with a plurality of types of comb teeth 300 to 303 differing in length described above in the second stationary electrode 3C to enable a plurality of stable positions C0 to C5 to be obtained. However, the comb teeth on the side of the second movable electrode may be formed to include comb teeth of a plurality of types of lengths differing in length for this purpose. The configuration that provides a plurality of stable positions is not limited to this. For instance, as shown in FIG. 48, the width of the comb teeth 300 of the second stationary electrode 3C may be changed stepwise from the front edge side to the base side.

Figure 48:
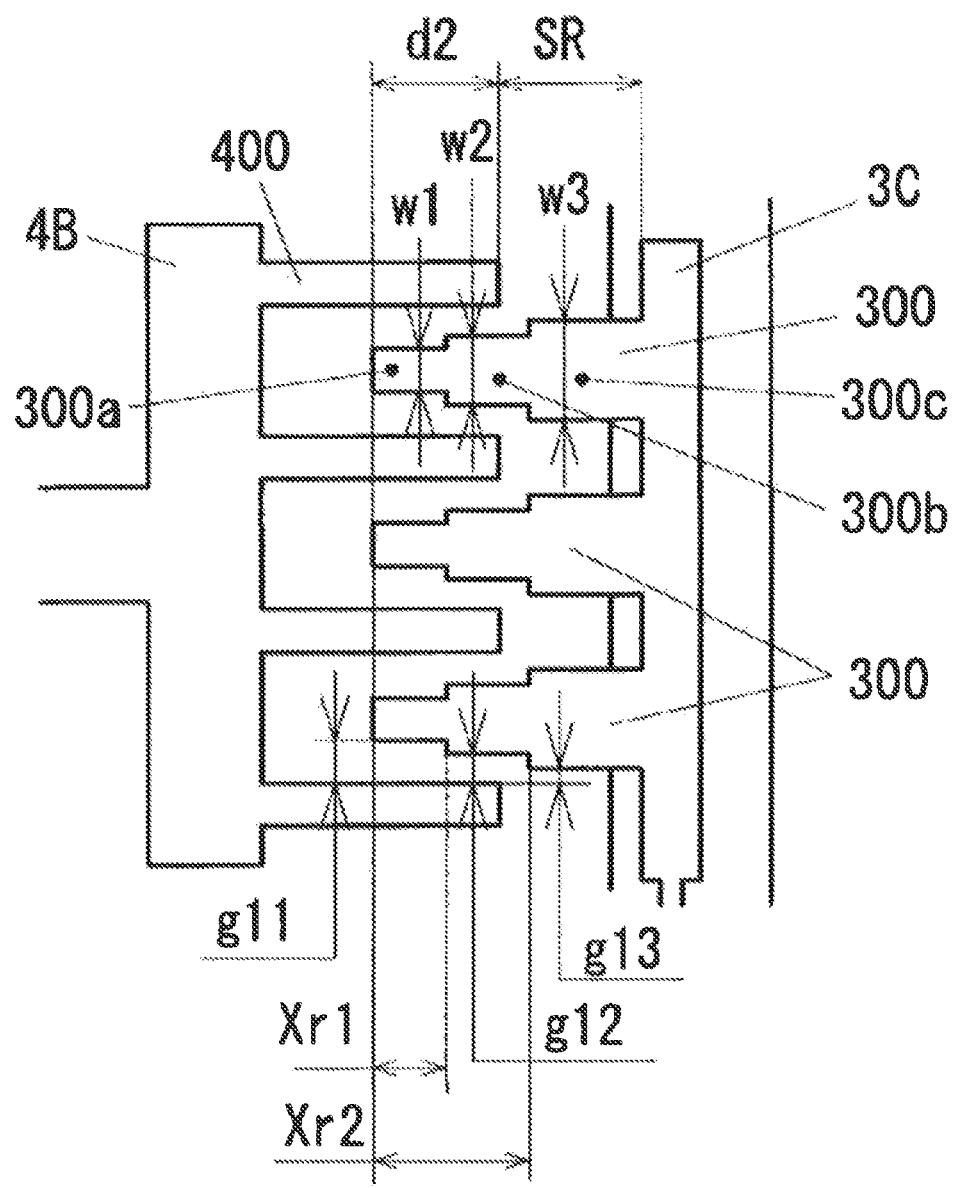
FIG. 48 is a diagram showing another example of the comb teeth shape that provides a plurality of stable positions.

In the example shown in FIG. 48, the comb teeth 300 include each a front edge part 300a, a middle part 300b, and a bottom part 300c, differing in width. The width of the front edge part 300a is w1, the width of the middle part 300b is w2, and the width of the bottom part 300c is w3 (w1<w2<w3). Based on the assumption that gap sizes between the comb teeth, corresponding to the widths w1, w2, and w3, are g11, g12, and g13 (g11>g12>g13), respectively, respective electrostatic forces (positive direction) acting between the electrodes 3C and 4B at the displacement x are represented by the following expressions (12) to (15). NR represents the total number of comb teeth and it is assumed that the application of the applied voltage V2 is in a stopped state.

$x \leq -d2$ $$FR0=0 \quad (12)$$

$-d2 < x \leq -d2 + Xr1$ $$FR1 = NR\varepsilon_0 b Ve^2 / g11 \quad (13)$$

$-d2 + Xr1 < x \leq -d2 + Xr2$ $$FR2 = NR\varepsilon_0 b Ve^2 / g12 \quad (14)$$

$-d2 + Xr2 < x$ $$FR3 = NR\varepsilon_0 b Ve^2 / g13 \quad (15)$$

Figure 49:
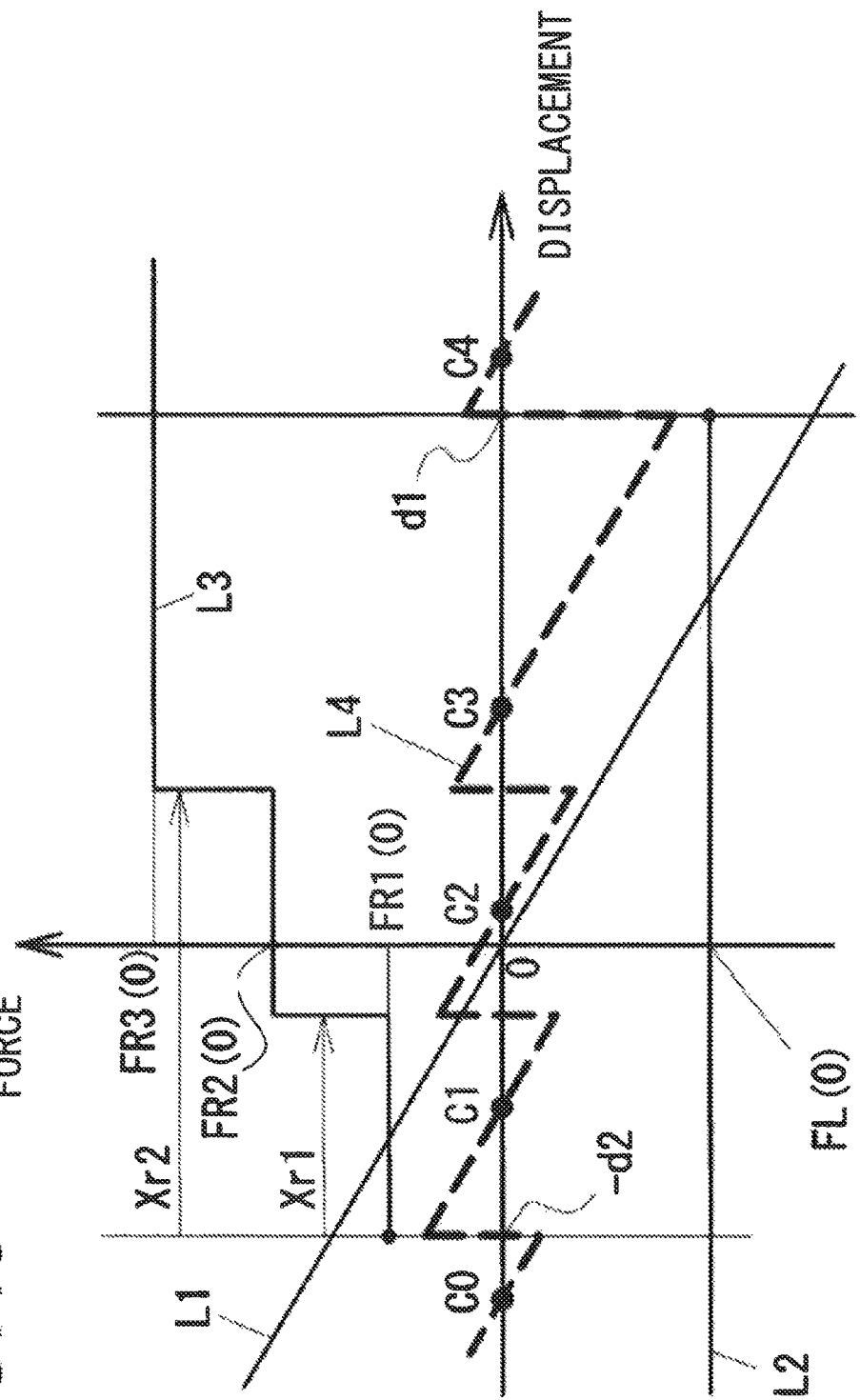
FIG. 49 is a diagram illustrating displacement x, elastic force L1, electrostatic forces L2 and L3, and total force L4.

FIG. 49 is a diagram illustrating the displacement x, the elastic force L1, the electrostatic forces L2 and L3, and the total force L4. FIG. 49 is the same as FIG. 36 except for having three steps of the electrostatic force L3 in contrast to four steps as shown in FIG. 36. Five stable positions C0 to C4 are present at which the elastic force matches with the electrostatic force. The motion of displacement between the stable positions is the same as that in the case shown in FIG. 36 although the number of steps is different, so that explanation of the motion of displacement is omitted here.

Figure 61:
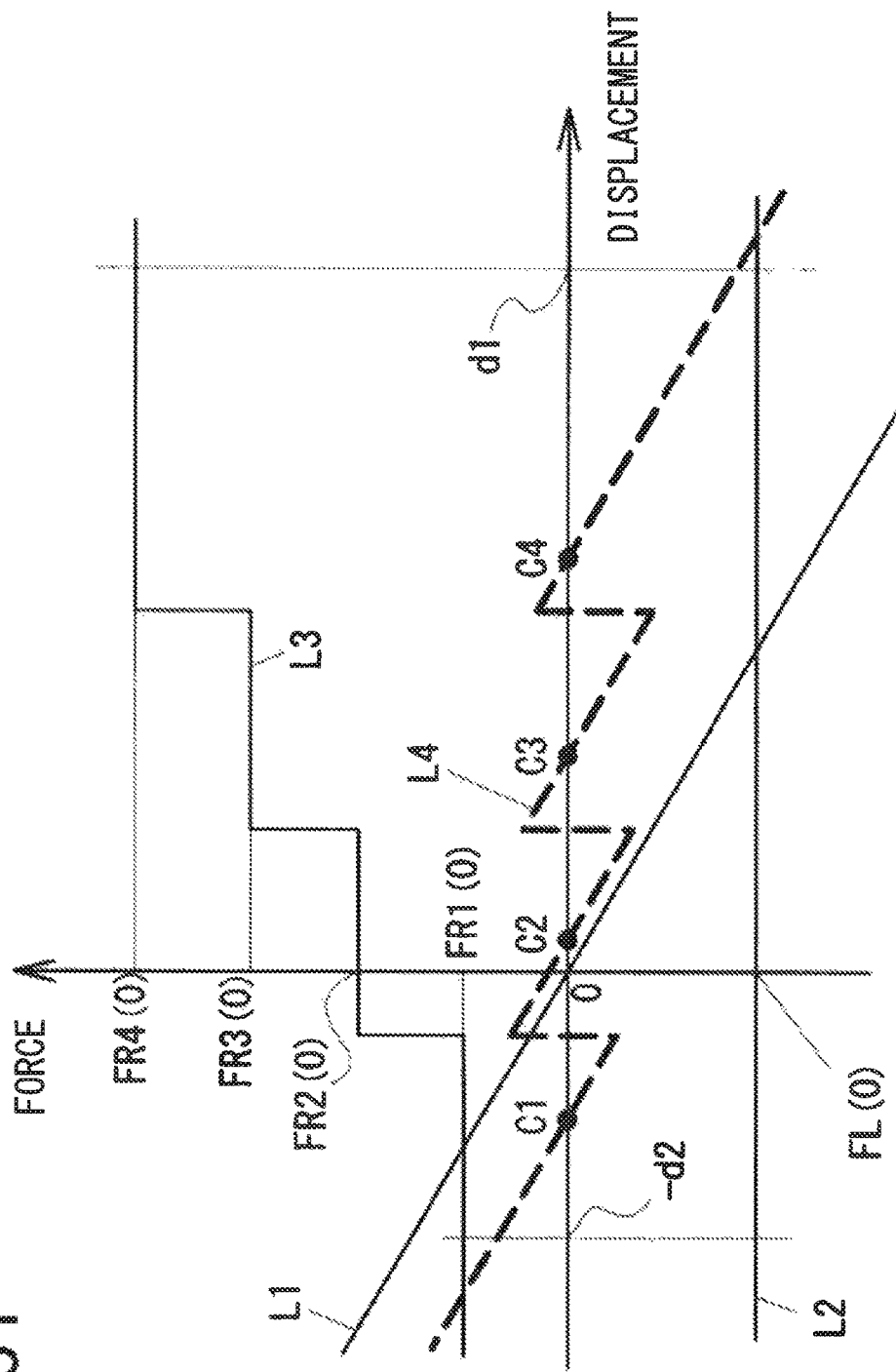
FIG. 61 is a diagram showing lines L1, L2 and L4 when an insertion amount≠0.

In the example shown in FIG. 36, a configuration is adopted, in which the movable part 5 is displaced to a state in which the comb teeth 400 of the electrodes 4A and 4B are completely retracted from the comb teeth 300 of the electrode 3A and 3C (state in which insertion amount=0), respectively. However, in the configuration of an actuator that has a plurality of stable positions by using different shapes of the comb teeth, the actuator may be configured to allow its use in a state in which the insertion amount≠0. In this case, the lines L1, L2, and L4 are in the condition as shown in FIG. 61. In the configuration in which the insertion amount≠0, the movable part 5 can be displaced either to the stable position in the leftward direction or to the stable position in the rightward direction by changing at least one of the voltages V1 and V2. In this case, the voltages V1 and V2 may be either of the same polarity as the polarity of the electrets or of reverse polarity to the polarity of the electrets. Of course, even if the construction is as shown in FIG. 36, similar motion can be obtained by limiting to the construction that uses none of the stable positions C0 and C5.

In the example shown in FIGS. 34, 35 and 48 described above, one of a pair of the stationary electrodes 3A and 3C provided on respective sides of the movable part 5 (stationary electrode 3C) is configured to have a comb teeth shape as shown in FIGS. 35 and 48 to form three or more stable positions. The configuration in which the comb teeth shape is changed as described above to form three or more stable positions may be similarly adopted in the actuators as shown in FIG. 55 and FIG. 58.

As described above, in this embodiment, the electrodes 3C and 4B on the right side, like the actuator 11 as shown in FIG. 34, are configured such that the electrostatic force between the second stationary electrode 3C and the second movable electrode 4B changes in a plurality of stages according to the insertion amount of the second movable electrode 4B. This allows a plurality of stable positions C1 to C4 at which the electrostatic force matches with the elastic force (first intermediate stable positions) to be set between the first stable position C0 and the second stable position C5. The first actuation unit 8A is configured to enable application of a voltage for displacing the movable part 5 to the second stable position C5 and in addition to this, application of a plurality of voltages for displacing the movable part 5 to a plurality of stable positions C1 to C4.

In this manner, the actuator 11 enables the movable part 5 to be displaced among a plurality of stable positions from one to another. The external voltages V1 and V2 need to be applied only when performing displacement and the stable state is maintained by the balance between the electrostatic force generated by the electrets and the elastic force exerted by the elastic support part 6. In one of applications, the actuator 11 may be used, for instance, as an actuator that displaces a sensor in one-dimensional direction to enable the sensor to perform detection.

In the optical shutter 101 as shown in FIG. 19, the actuator 1 of a bistable structure is used to enable the optical shutter 101 to make on/off of light. However, use of the actuator 11 that is able to displace the movable part 5 among a plurality of stable positions in place of the actuator 1 enables positioning the shutter plate 1S at a plurality of positions with different aperture ratios. That is, controlling the voltage applied to between the electrodes 3A and 4A of actuator 11 to displace the shutter plate 1S to a plurality of positions enables the optical shutter to pass light in controlled amounts.

Third Embodiment

Figure 50:
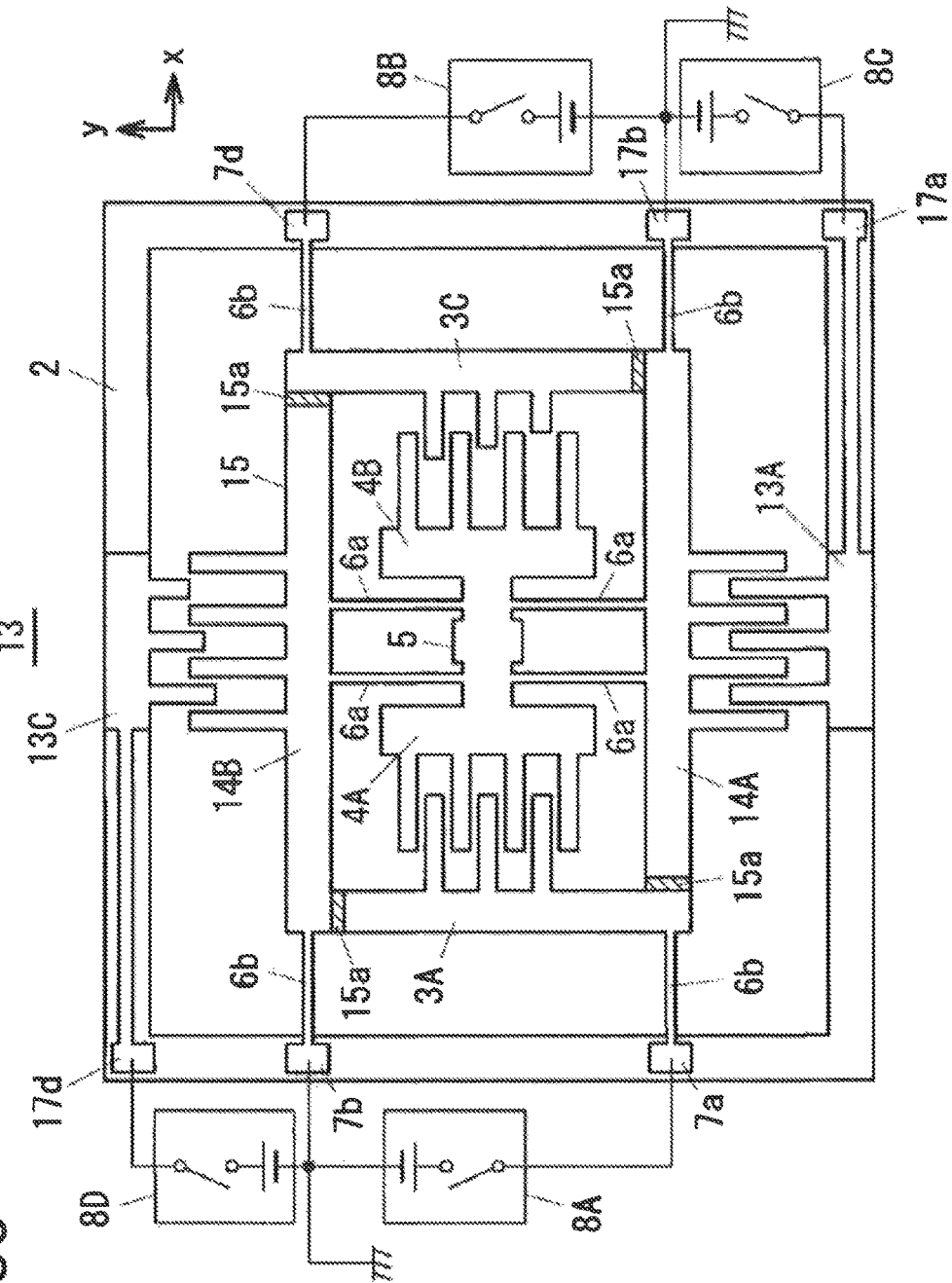
FIG. 50 is a diagram showing a third embodiment of the actuator according to the present invention.

FIG. 50 is a diagram showing a third embodiment of the actuator according to the present invention. The actuator 13 includes actuators each having a plurality of stable states as shown in FIG. 34, one actuator for displacement in the x-axis direction and another for displacement in the y-axis direction to enable two-dimensional displacement of the movable part 5. In FIG. 50, illustration of the control unit 223 is omitted. Here, a two-dimensional scanning actuator is fabricated by using the actuator as shown in FIG. 34.

However, any one of the actuators as shown in FIGS. 1, 48, 55, and 58 may be used for this purpose.

The actuator 13 includes a first stationary electrode 3A, a first movable electrode 4A, a second stationary electrode 3C, and a second movable electrode 4B for driving the movable part 5 in the x-axis direction. The actuator 13 also includes a third stationary electrode 13A, a third movable electrode 14A, a fourth stationary electrode 13C, and a fourth movable electrode 14B for driving the movable frame 15 in the y-axis direction. The movable part 5 is connected to a movable frame 15 via elastic support parts 6a. That is, the movable frame 15 serves as a base part for the movable part 5. The movable part 5 is provided at the movable frame 15 so that it can be displaced in the x-direction. On the other hand, the movable frame 15 is connected to the base 2 via elastic support parts 6b. The movable frame 15 is provided at the base 2 so that it can be displaced in the y-direction.

The relationships among the first stationary electrode 3A, the first movable electrode 4A, the second stationary electrode 3C, and the second movable electrode 4B are the same as the relationships among the respective electrodes indicated by the same symbols as those shown in FIG. 34. However, in the configuration shown in FIG. 34, the second stationary electrode 3C is provided with the comb teeth 300 to 303 differing in length from each other. In contrast, the actuator 13 shown in FIG. 50 is provided with three types of the comb teeth differing in length from each other, so that the number of stable positions relating to the x-direction displacement is 5 as described later. The third stationary electrode 13A has the same structure as that of the first stationary electrode 3A. The third movable electrode 14A has the same structure as that of the first movable electrode 4A. Also, the fourth stationary electrode 13C has the same structure as that of the second stationary electrode 3C. The fourth movable electrode 14B has the same structure as that of the second movable electrode 4B. The number of stable positions relating to the y-direction displacement is also 5.

The first stationary electrode 3A and the second stationary electrode 3C are provided at edge parts of the movable frame 15 along the x-axis direction. On the other hand, the third movable electrode 14A and the fourth movable electrode 14B are provided at edge parts of the movable frame 15 along the y-axis direction so that both the electrodes are arranged for the respective comb teeth to extend outward. The third stationary electrode 13A is provided on the base 2 so as to interdigitate with the third movable electrode 14A. The fourth stationary electrode 13C is provided on the base 2 so as to interdigitate with the fourth movable electrode 14B.

In the same manner as the construction shown in FIG. 34, the first actuation unit 8A is provided for the electrodes 3A and 4A and the second actuation unit 8B is provided for the electrodes 3C and 4B. In this embodiment, a third actuation unit 8C is provided for the electrodes 13A and 14A and a fourth actuation unit 8D is provided for the electrodes 13C and 14B. The first actuation unit 8A and the third actuation unit 8C apply the applied voltage V1 and the second actuation unit 8B and the fourth actuation unit 8D apply the applied voltage V2. The electrodes 3A. 3C, 14A, and 14B provided at the movable frame 15 are electrically insulated from each other by insulating parts 15a. In the example shown in FIG. 50, the movable frame 15 of the actuator 13, which frame is formed by fabricating the SOI substrate, includes a rectangular frame formed from the lower Si layer 31 and the electrodes 3A, 3C, 14A, and 14B formed from the upper Si layer 33 on the rectangular frame. The insulating parts 15a are constituted by a gap formed by etching the upper Si layer 33.

The negative sides of the first actuation unit 8A and of the fourth actuation unit 8D are set at the ground potential and connected to a connection pad part 7b of the fourth movable electrode 14B. The positive side of the first actuation unit 8A is connected to a connection pad part 7a of the first stationary electrode. The positive side of the fourth actuation unit 8D is connected to a connection pad part 17d of the fourth stationary electrode 13C. The negative sides of the second actuation unit 8B and of the third actuation unit 8C are set to the ground potential and connected to a connection pad part 17b of the third movable electrode 14A. The positive side of the second actuation unit 8B is connected to a connection pad part 7d of the second stationary electrode 3C. The positive side of the third actuation unit 8C is connected to a connection pad part 17a of the third stationary electrode 13A. From FIG. 50, it can be seen that the first to fourth movable electrodes 4A, 4B, 14A, and 14B are each set to the ground potential.

Figure 51:
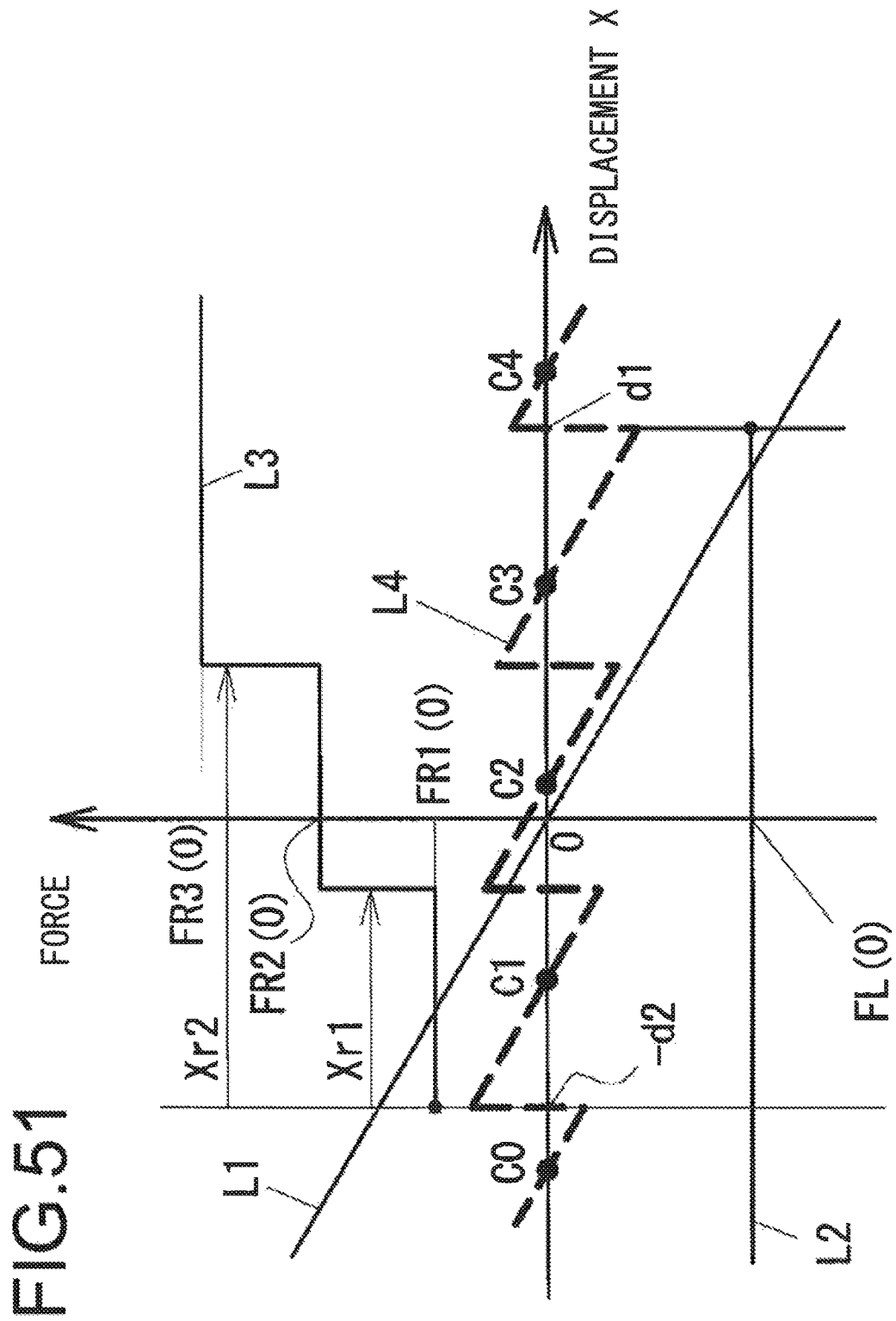
FIG. 51 is a diagram illustrating the displacement x and the force exerted on the movable part at V1=V2=0 in the actuator 13 shown in FIG. 50.
Figure 52:
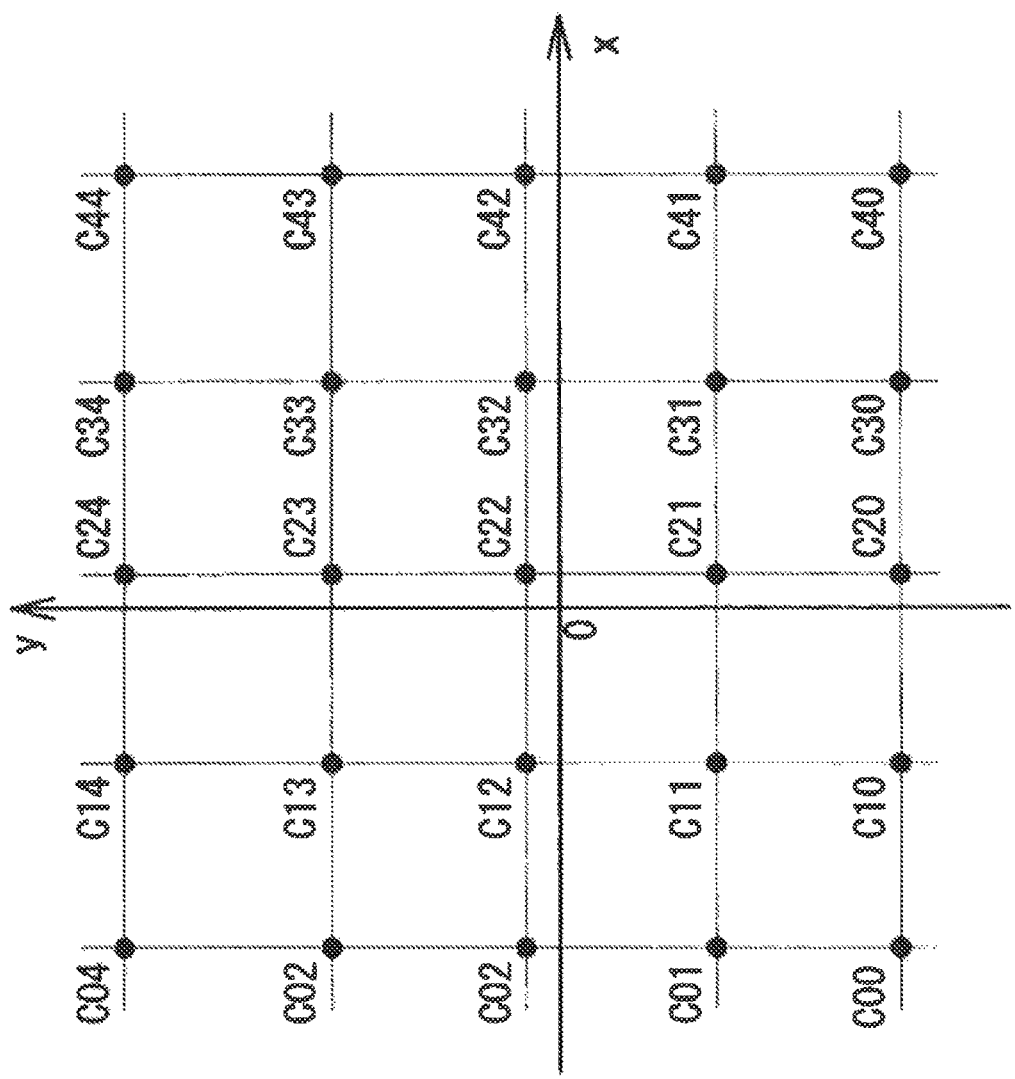
FIG. 52 is a diagram showing a stable position on a xy-plane.

FIG. 51 is a diagram illustrating the displacement x in the x-direction and the force acting on the movable part 5 in the absence of application of the voltages V1 and V2 by the first actuation unit 8A and the second actuation unit 8B, respectively. In this embodiment, the second stationary electrode 3C includes three types of comb teeth differing in length from each other and thus there are five stable positions (C0 to C4) at which the electrostatic force matches with the elastic force. On the other hand, the structures of the electrodes 13A, 14A, 13C, and 14B are the same as those of the electrodes 3A, 4A, 3C and 4B, so that the displacement y in the y-direction and the force acting on the movable frame 15 are quite the same as those in the case as shown in FIG. 51. As a result, the stable positions at the actuator 13, that is, positions that the movable part 5 can take are illustrated in the xy-plane as shown in FIG. 52. The movable part 5 can be displaced to any of 25 positions C00 to C44.

Figure 53:
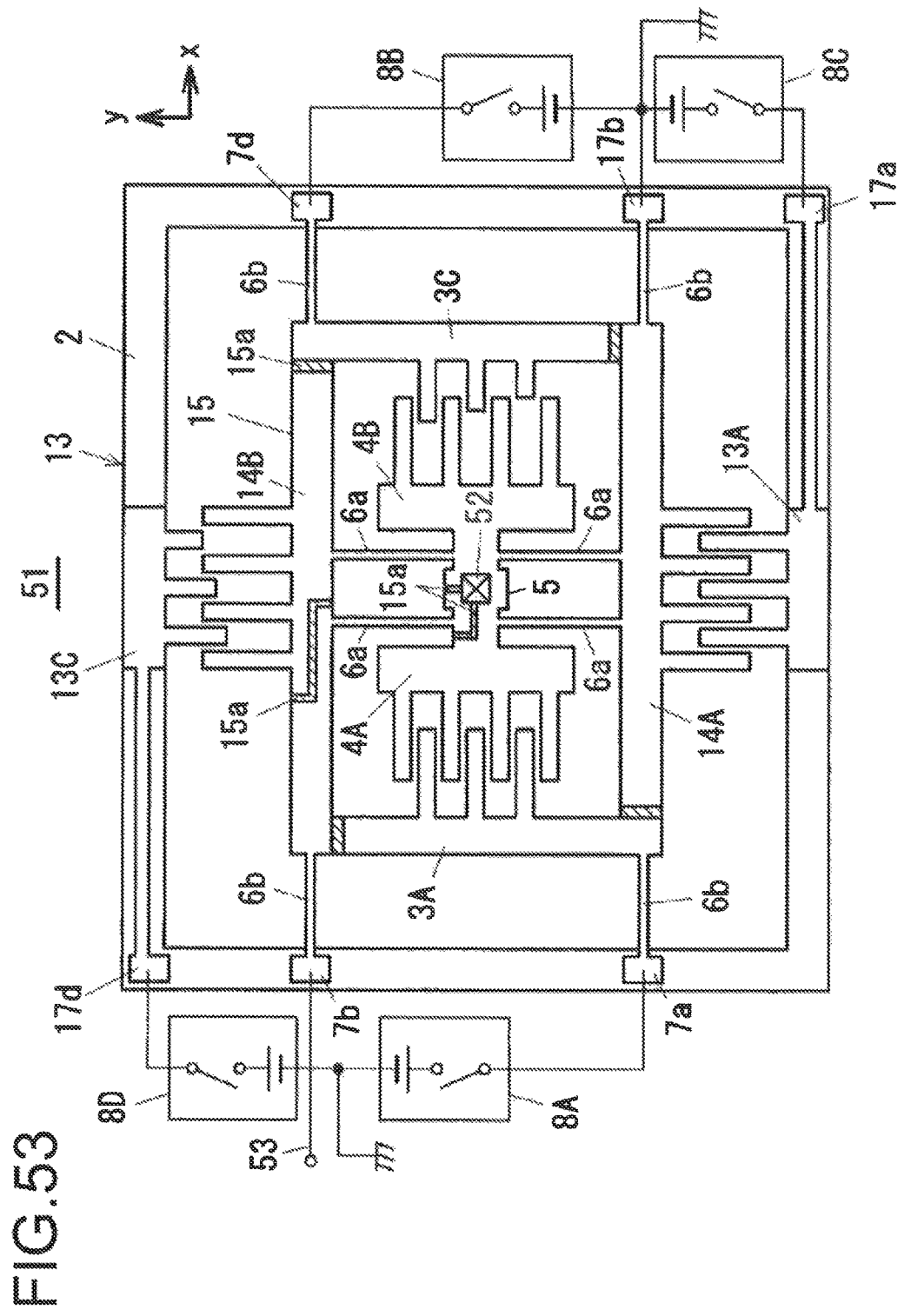
FIG. 53 is a diagram showing a two-dimensional scanning infrared ray detection device 51.

FIG. 53 illustrates the case in which the actuator 13 is adopted in a two-dimensional scanning infrared ray detection device 51. The infrared ray detection device as shown in FIG. 53 is a so-called a smart actuator, which includes an infrared ray detection element 52 installed at the movable part 5 of the actuator 13. The configuration of the movable part 5 allowing displacement to any one of the 25 stable positions as shown in FIG. 52 enables the infrared ray detection element 52 to perform two-dimensional measurement. For instance, the position of the movable part 5 is displaced like a sequence of C04, C14, C24, C34, C44, C02, C12, C22, . . . , C31, C41, C00, C10, C20, C30, and C40. Here, explanation is made on a two-dimensional scanning sensor device that includes a light detection sensor such as the infrared ray detection element 52. However, this embodiment can be adopted not only in optical sensors but also in sensors that detect various physical quantities other than light.

The infrared ray detection element 52 may be well-known infrared ray sensors such as a thermal infrared ray sensor that includes a light reception unit provided with an infrared ray absorption zone and a hollow substrate that supports the light reception unit with a fine beam to enable detection of the temperature of the light reception unit by a thermopile or the like (see, for instance, JP 2001-28106 A, etc.), and a dielectric bolometer infrared sensor. The infrared ray detection element 52 may be formed at the movable part 5 of the actuator 13 directly or may have a structure in which a sensor chip formed separately from the actuator 13 is installed on the movable part 5. In FIG. 53, unlike the actuator 13 shown in FIG. 50, a sensor output line 53 is connected to the connection pad part 7b.

As mentioned above, in the actuator 13 according to this embodiment, the first stationary electrode 3A and the second stationary electrode 3C are arranged opposite to each other at the movable frame 15, which is displaced by the lower side electrodes 13A and 14A and the upper side electrode 13C and 14B in the y-direction, spaced apart from each other in a direction (x-direction) that crosses the displacement direction of the movable frame 15. Between the first stationary electrode 3A and the second stationary electrode 3C, the movable part 5, which is provided with the first movable electrode 4A that disengageably interdigitates with the first stationary electrode 3A and with the second movable electrode 4B that disengageably interdigitates with the second stationary electrode 3C, is elastically supported by the elastic support parts 6a to enable displacement with respect to the movable frame 15 in the x-direction.

The actuator 13 is set to take a first stable position and a second stable position. The first stable position is a stable position at which the first movable electrode 4A is drawn by the first stationary electrode 3A to a position at which the insertion amount of the second movable electrode 4B into the second stationary electrode 3C becomes 0 (zero) to make the electrostatic force generated by the electrets of the electrodes 3A and 4A match with the elastic force exerted by the elastic support part 6a. The second stable position is a stable position at which the second movable electrode 4B is drawn by the second stationary electrode 3C to a position at which the insertion amount of the first movable electrode 4A into the first stationary electrode 3A becomes 0 (zero) to make the electrostatic force generated by the electrets of the electrodes 3C and 4B match with the elastic force exerted by the elastic support part 6a. In addition, the actuator 13 includes the first actuation unit 8A that applies the voltage V1 to weaken the electrostatic force acting between the electrodes 3A and 4A to displace movable part 5 from the first stable position to the second stable position and the second actuation unit 8B that applies the voltage V2 to weaken the electrostatic force acting between the electrodes 3C and 4B to displace the movable part 5 from the second stable position to the first stable position.

As a result, the movable part 5 can be displaced by sliding to a plurality of stable positions that are set two-dimensionally. In this embodiment, all the four sets of electrodes are made to have a comb-teeth electrode so that the electrodes can be arranged in one and the same plane to provide a relatively thin two-dimensional actuator. Such a planar structure enables each electrode, the movable part 5, and the movable frame 15 from the same substrate. This considerably reduces the man-hour for fabrication.

In the example shown in FIG. 50, electrets are formed at the comb teeth in each of the electrodes 3A, 3C, 4A, 4B, 13A, 13C, 14A, and 14B. However, the electrets may be formed at the comb teeth of only one of the pair of interdigitating electrodes. In the actuator 13 as shown in FIG. 50, the combination of the stationary electrode and the movable electrode similar to the combination of the electrodes 3A and 4A and the electrodes 3C and 4B in the actuator 11 is used in both the x-direction and the y-direction. However, the electrode configuration similar to that in the actuator 1 may be used in one of the x-direction and the y-direction or in both the x- and y-directions.

In the example shown in FIG. 50, the displacement direction of the movable part 5 is orthogonal to the displacement direction of the movable frame 15. However, a configuration may be adopted in which the movable part 5 is displaced in a direction oblique to the displacement direction of the movable frame 15.

The above-mentioned embodiments may be used singly or in combinations. This is because the effects of the embodiments can be achieved singly or in synergism. As far as the features of the present invention are not compromised, the present invention is not limited to the above-mentioned embodiments.

The disclosure of the following priority application is herein incorporated by reference:

Japanese Patent Application No. 2013-165166 filed Aug. 8, 2013

REFERENCE SIGNS LIST

1, 11, 13, 110A, 110B, 201: actuators, 1S: shutter plate, 2: base, 3A: first stationary electrode, 3B, 3C: second stationary electrodes, 3D, 4D: electrode plates, 4A: first movable electrode, 4B: second movable electrode, 5: movable part, 6, 6a, 6b: elastic support parts, 8A: first actuation unit, 8B: second actuation unit, 8C: third actuation unit, 8D: fourth actuation unit, 13A: third stationary electrode, 13C: third stationary electrode, 14A: third movable electrode, 14B: fourth stationary electrode, 15: movable frame, 51: two-dimensional scanning infrared ray detection device, 52: infrared ray detection element, 101: optical shutter, 102: backlight, 103: light shield plate, 201: flow channel switch valve, 202: valve element, 203a: groove, 204, 211, 221: flow channel structures, 205, 206, 212: flow channels, 210: three-way switch valve, 220: flow control valve, 223: control unit, 230, 240: RF switches, 300 to 303, 400: comb teeth, EL: electret

The invention claimed is:
1. An actuator comprising:
an electrostatic actuation mechanism including a stationary electrode and a movable electrode, the stationary electrode and the movable electrode being disposed in a planar arrangement;
a first movable part provided with the movable electrode and driven by the electrostatic actuation mechanism;
a first elastic support part that elastically supports the first movable part to enable the movable electrode to be displaced by sliding in a same plane with respect to the stationary electrode;
an electret formed in at least one of the stationary electrode and the movable electrode of the electrostatic actuation mechanism; and
a drive control unit that controls application of voltage to the electrostatic actuation mechanism, wherein:
a lower end of the movable electrode and a lower end of the stationary electrode in a direction perpendicular to a displacement direction of the movable electrode are positioned on a same single plane that is parallel to the displacement direction of the movable electrode;
in the actuator a plurality of stable states are set in which the first movable part is positioned at a stable position at which an electrostatic force generated by the electret matches with an elastic force exerted by the first elastic support part or at a stable position near such stable position; and
the drive control unit controls the electrostatic force generated by the electrostatic actuation mechanism to be weakened temporarily by applying a voltage to the electrostatic actuation mechanism to change any one of the stable states to another of the stable states to displace the first movable part from any stable position to another stable position.

2. The actuator according to claim 1, wherein:
the electrostatic actuation mechanism includes at least a comb-teeth actuation unit that is provided with a stationary comb-teeth electrode as the stationary electrode and a movable comb-teeth electrode as the movable electrode, with a direction in which an insertion amount of the movable comb-teeth electrode changes with respect to the stationary comb-teeth electrode corresponding to a direction in which displacement by sliding occurs; and
the electret is formed in at least one of the stationary comb-teeth electrode and the movable comb-teeth electrode.

3. The actuator according to claim 2, wherein:
the electrostatic actuation mechanism includes:
   a first comb-teeth actuation unit having a first stationary comb-teeth electrode, and a first movable comb-teeth electrode that disengageably interdigitates with the first stationary comb-teeth electrode; and
   a second comb-teeth actuation unit having a second stationary comb-teeth electrode, placed opposite to and at a distance from the first stationary comb-teeth electrode, and a second movable comb-teeth electrode that disengageably interdigitates with the second stationary comb-teeth electrode;
the first movable part is arranged between the first stationary comb-teeth electrode and the second stationary comb-teeth electrode and is provided with the first movable comb-teeth electrode and the second movable comb-teeth electrode;
the first elastic support part elastically supports the first movable part to enable the first movable part to be displaced by sliding in a direction in which respective insertion amounts of the first and second movable comb-teeth electrode to the first and second stationary comb-teeth electrodes change;
the electret has a first electret provided in at least one of the first stationary comb-teeth electrode and the first movable comb-teeth electrode and a second electret provided in at least one of the second stationary comb-teeth electrode and the second movable comb-teeth electrode;
the plurality of stable positions being set include:
   a first stable position, which is a stable position, at which the first movable comb-teeth electrode is drawn by the first stationary comb-teeth electrode to a position at which an insertion amount of the second movable comb-teeth electrode becomes zero and a first electrostatic force generated by the first electret matches with an elastic force exerted by the first elastic support part, or a stable position set near such stable position; and
   a second stable position, which is a stable position, at which the second movable comb-teeth electrode is drawn by the second stationary comb-teeth electrode to a position at which an insertion amount of the first movable comb-teeth electrode becomes zero and a second electrostatic force generated by the second electret matches with an elastic force exerted by the first elastic support part, or a stable position set near such stable position;
the drive control unit applies a first voltage to weaken the first electrostatic force to the first comb-teeth actuation unit to displace the first movable part from the first stable position to the second stable position; and
the drive control unit applies a second voltage to weaken the second electrostatic force to the second comb-teeth actuation unit to displace the first movable part from the second stable position to the first stable position.

4. The actuator according to claim 3, wherein:
the first stationary comb-teeth electrode or the first movable comb-teeth electrode has a comb-teeth shape such that magnitude of the first electrostatic force changes in a plurality of steps according to an insertion amount of the first movable comb-teeth electrode to enable a plurality of first intermediate stable positions to be set, at which the first and second electrostatic forces match with an elastic force exerted by the first elastic support part, between the first stable position and the second stable position; and
the drive control unit controls an applied voltage to at least one of the first comb-teeth actuation unit and the second comb-teeth actuation unit to displace the first movable part to any one of the first stable position, the second stable position, and the plurality of first intermediate stable positions.

5. The actuator according to claim 3, further comprising:
a third stationary comb-teeth electrode and a fourth stationary comb-teeth electrode, each being provided at a base and arranged opposite to and spaced apart from each other in a direction that crosses a direction of displacement of the first movable part;
a second movable part arranged between the third stationary comb-teeth electrode and the fourth stationary comb-teeth electrode and provided with a third movable comb-teeth electrode that disengageably interdigitates with the third stationary comb-teeth electrode and with a fourth movable comb-teeth electrode that disengageably interdigitates with the fourth stationary comb-teeth electrode; and
a second elastic support part that elastically supports the second movable part to enable the second movable part to be displaced by sliding with respect to the first movable part in the crossing direction, wherein:
the electret further includes a third electret provided in at least one of the third stationary comb-teeth electrode and the third movable comb-teeth electrode and a fourth electret provided in at least one of the fourth stationary comb-teeth electrode and the fourth movable comb-teeth electrode;
the plurality of stable positions being set further includes:
   a third stable position, which is a stable position, at which the third movable comb-teeth electrode is drawn by the third stationary comb-teeth electrode to a position at which an insertion amount of the fourth movable comb-teeth electrode with respect to the fourth stationary comb-teeth electrode becomes zero and a third electrostatic force generated by the third electret matches with an elastic force exerted by the second elastic support part, or a stable position set near such stable position; and
   a fourth stable position, which is a stable position, at which the fourth movable comb-teeth electrode is drawn by the fourth stationary comb-teeth electrode to a position at which an insertion amount of the third movable comb-teeth electrode with respect to the third stationary comb-teeth electrode becomes zero and a fourth electrostatic force generated by the fourth electret matches with an elastic force exerted by the second elastic support part, or a stable position set near such stable position;

the drive control unit applies a third voltage to weaken the third electrostatic force to between the third stationary comb-teeth electrode and the third movable comb-teeth electrode to displace the second movable part from the third stable position to the fourth stable position; and the drive control unit applies a fourth voltage to weaken the fourth electrostatic force to between the fourth stationary comb-teeth electrode and the fourth movable comb-teeth electrode to displace the second movable part from the fourth stable position to the third stable position.

6. A two-dimensional scanning sensor device comprising:
the actuator according to claim 5; and
a sensor that is displaced integrally with the second movable part of the actuator to detect a physical quantity within a range of displacement of the second movable part, wherein
the sensor is configured to detect the physical quantity by displacing at least one of the first movable part and the second movable part to a corresponding stable position to displace the sensor two-dimensionally.

7. The actuator according to claim 2, wherein:
the electrostatic actuation mechanism further includes:
  a stationary electrode plate provided on a side opposite to the stationary comb-teeth electrode in a sliding direction of the first movable part, so that the first movable part is sandwiched by the stationary comb-teeth electrode and the stationary electrode plate; and
  a movable electrode plate arranged to face the stationary electrode plate and is provided at the first movable part, wherein:
the electret includes a first electret provided in at least one of the stationary comb-teeth electrode and the movable comb-teeth electrode and a second electret provided in at least one of the stationary electrode plate and the movable electrode plate which are disposed to face each other;
the plurality of stable positions being set includes:
  a first stable position, which is a stable position, at which the movable comb-teeth electrode is drawn by the stationary comb-teeth electrode so as to be inserted into the stationary comb-teeth electrode to make a first electrostatic force generated by the first electret match with an elastic force exerted by the first elastic support part, or a stable position set near such stable position; and
  a second stable position, which is a stable position, at which the movable electrode plate is drawn toward the stationary electrode plate to a position at which an insertion amount of the movable comb-teeth electrode with respect to the stationary comb-teeth electrode becomes zero and a second electrostatic force generated by the second electret matches with an elastic force exerted by the first elastic support part, or a stable position set near such stable position;
the drive control unit applies a first voltage to weaken the first electrostatic force to between the stationary comb-teeth electrode and the movable comb-teeth electrode to displace the first movable part from the first stable position to the second stable position; and
the drive control unit applies a second voltage to weaken the second electrostatic force to between the stationary electrode plate and the movable electrode plate to displace the first movable part from the second stable position to the first stable position.

8. The actuator according to claim 7, wherein:
the stationary comb-teeth electrode or the movable comb-teeth electrode has a comb-teeth shape such that magnitude of the first electrostatic force changes in a plurality of steps according to an insertion amount of the movable comb-teeth electrode to enable a plurality of intermediate stable positions to be set, at which the first and second electrostatic forces match with an elastic force exerted by the first elastic support part, between the first stable position and the second stable position; and
the drive control unit is configured to be able to apply a plurality of voltages to the comb-teeth actuation unit to drive the first movable part to the plurality of intermediate stable positions, respectively.

9. The actuator according to claim 8, wherein:
the stationary comb-teeth electrode or the movable comb-teeth electrode includes a plurality of kinds of comb-tooth groups differing in length or a plurality of kinds of comb-tooth groups differing in width in a direction of arrangement of the comb teeth.

10. The actuator according to claim 2, wherein:
the electret is provided in at least one of the stationary comb-teeth electrode and the movable comb-teeth electrode;
the plurality of stable positions being set includes:
  a first stable position, which is a stable position, at which the insertion amount is positive and an electrostatic force generated by the electret matches with an elastic force exerted by the first elastic support part, or a stable position set near such stable position; and
  a second stable position, which is a stable position, at which the insertion amount is zero, an electrostatic attraction force generated by a fringe electric field of the stationary comb-teeth electrode generated by the electret matches with the elastic force, and an electrostatic force generated by a fringe electric field when the second voltage is applied is greater than the elastic force, or a stable position set near such stable position; and
the drive control unit applies a first voltage to weaken an electrostatic force exerted by the comb-teeth actuation unit to drive the first movable part from the first stable position to the second stable position, and applies a second voltage to strengthen an electrostatic force of the comb-teeth actuation unit to drive the first movable part from the second stable position to the first stable position.

11. The actuator according to claim 10, wherein:
the stationary comb-teeth electrode or the movable comb-teeth electrode has a comb-teeth shape such that magnitude of an electrostatic force generated by the electret changes in a plurality of steps according to an insertion amount of the movable comb-teeth electrode to enable a plurality of intermediate stable positions to be set, at which an electrostatic force generated by the electret matches with an elastic force exerted by the first elastic support part, between the first stable position and the second stable position; and
the drive control unit is configured to be able to apply a plurality of voltages to the comb-teeth actuation unit to drive the first movable part to the plurality of intermediate stable positions, respectively.

12. The actuator according to claim 2, wherein:
the electrostatic actuation mechanism includes a first comb-teeth actuation unit that has a first stationary comb-teeth electrode and a first movable comb-teeth electrode, and a second comb-teeth actuation unit that has a second stationary comb-teeth electrode and a second movable comb-teeth electrode;

the first stationary comb-teeth electrode and the second stationary comb-teeth electrode are arranged opposite to and spaced apart from each other;

the first movable part is arranged between the first stationary comb-teeth electrode and the second stationary comb-teeth electrode, and is provided with the first movable comb-teeth electrode so as to disengageably interdigitate with the first stationary comb-teeth electrode, and the second movable comb-teeth electrode so as to disengageably interdigitate with the second stationary comb-teeth electrode;

the first elastic support part elastically supports the first movable part so that the first movable part is displaceable by sliding in directions in which respective insertion amounts of the first and second movable comb-teeth electrodes change;

the electret includes a first electret provided in at least one of the first stationary comb-teeth electrode and the first movable comb-teeth electrode and a second electret provided in at least one of the second stationary comb-teeth electrode and the second movable comb-teeth electrode;

to enable a plurality of stable positions to be set, at which a first electrostatic force generated by the first electret and a second electrostatic force generated by the second electret match with an elastic force exerted by the first elastic support part as the plurality of stable positions, the first stationary comb-teeth electrode or the first movable comb-teeth electrode is configured to have a comb-teeth shape that allows magnitude of the first electrostatic force to change in a plurality of steps according to an insertion amount of the first movable comb-teeth electrode; and the drive control unit controls an applied voltage applied to at least one of the first comb-teeth actuation unit and the second comb-teeth actuation unit to displace the first movable part to any one of the plurality of stable positions.

13. The actuator according to claim 12, wherein:
the first stationary comb-teeth electrode or the first movable comb-teeth electrode includes a plurality of kinds of comb-tooth groups differing in length or a plurality of kinds of comb-tooth groups differing in width in a direction of arrangement of the comb teeth.

14. The actuator according to claim 12, further comprising:
a third stationary comb-teeth electrode and a fourth stationary comb-teeth electrode, each being provided at a base and arranged opposite to and spaced apart from each other in a direction that crosses a direction in which the first movable part is displaced;
a second movable part arranged between the third stationary comb-teeth electrode and the fourth stationary comb-teeth electrode and provided with a third movable comb-teeth electrode that disengageably interdigitates with the third stationary comb-teeth electrode and with a fourth movable comb-teeth electrode that disengageably interdigitates with the fourth stationary comb-teeth electrode; and
a second elastic support part that elastically supports the second movable part with respect to the first movable part to enable the second movable part to be displaced in the crossing direction, wherein:

the electret further includes a third electret provided in at least one of the third stationary comb-teeth electrode and the third movable comb-teeth electrode and a fourth electret provided in at least one of the fourth stationary comb-teeth electrode and the fourth movable comb-teeth electrode;

to enable a plurality of second stable positions to be set, at which a third electrostatic force generated by the third electret and a fourth electrostatic force generated by the fourth electret match with an elastic force exerted by the second elastic support part as the plurality of stable positions, the third stationary comb-teeth electrode or the third movable comb-teeth electrode is configured to have a comb-teeth shape such that magnitude of the third electrostatic force changes in a plurality of steps according to an insertion amount of the third movable electrode; and the drive control unit controls at least one of an applied voltage applied to between the third stationary comb-teeth electrode and the third movable comb-teeth electrode and an applied voltage applied to between the fourth stationary comb-teeth electrode and the fourth movable comb-teeth electrode to displace the second movable part to any one of the plurality of second stable positions.

15. A shutter device comprising:
the actuator according to claim 12; and
a shield member that is displaced integrally with the first movable part of the actuator to be inserted in and removed from a light path, a light path shielding ratio of the shield member differing according to which one of the plurality of stable positions the first movable part is displaced to, wherein
the applied voltage is controlled by the drive control unit to displace the first movable part to any of the plurality of stable positions to control an amount of transmitted light.

16. The actuator according to claim 1, wherein:
the electrostatic actuation mechanism, the first movable part, and the first elastic support part are formed by processing a single silicon substrate.

17. A shutter device comprising:
the actuator according to claim 1; and
a shutter member that is displaced integrally with the first movable part of the actuator to be inserted in or removed from a light path to switch light from a light source to one of a transmissive state and a non-transmissive state, wherein
when the first movable part is displaced to a first stable position among the plurality of stable positions, the shutter member is in the transmissive state and when the first movable part is displaced to a second stable position other than the first stable position, the shutter member is in the non-transmissive state.

18. A fluid control device comprising:
the actuator according to claim 1;
a flow channel-formed body in which a flow channel is formed; and
a valve element that is displaced integrally with the first movable part of the actuator to open and close the flow channel, wherein
the valve element opens the flow channel when the first movable part is displaced to a first stable position among the plurality of stable positions and closes the flow channel when the first movable part is displace to a second stable position other than the first stable position.

19. The fluid control device according to claim 18, wherein:
the flow channel has a first flow channel on an inlet side of the flow channel and a second flow channel on an outlet side of the flow channel; and
the valve element corresponding to the flow channel is provided with a communication part that communicates the first flow channel with the second flow channel and a shielding part that blocks one of the first flow channel and the second flow channel to establish a non-transmissive state.

20. A fluid control device comprising:
a flow channel-formed body in which a plurality of flow channel is formed;
the actuator according to claim 1, provided in each of the plurality of flow channels; and
a valve element that is provided in each of the plurality of flow channels and is displaced integrally with the first movable part of the actuator corresponding to a flow channel to open and close the flow channel, wherein
each of the plurality of valve elements opens the flow channel when the first movable part that is displaced integrally with the valve element is displaced to a first stable position among the plurality of stable positions and closes the flow channel when the first movable part is displaced to a second stable position other than the first stable position.

21. A fluid control device comprising:
a flow channel-formed body having a first flow channel and a plurality of second flow channels;
the actuator according to claim 1, provided in each of the plurality of second flow channels; and
a valve element provided at each of the plurality of second flow channels that is displaced integrally with the first movable part of the actuator corresponding to a second flow channel to switch transmission and non-transmission of the second flow channel with respect to the first flow channel, wherein
each of the plurality of valve elements causes a corresponding second flow channel and the first flow channel to be brought into a transmissive state with each other if the first movable part that is displaced integrally with the valve element is displaced to a first stable position among the plurality of stable positions, and causes the corresponding second flow channel and the first flow channel to be brought into a non-transmissive state if the first movable part that is displaced integrally with the valve element is displaced to a second stable position among the plurality of stable positions other than the first stable position.

22. A switch comprising:
the actuator according to claim 1;
a first contact point to which a signal line for inputting a high-frequency signal is connected;
a second contact point to which a signal line for outputting the input high-frequency signal is connected; and
a movable contact point that is displaced integrally with the first movable part of the actuator to switch over continuity and discontinuity between the first contact point and the second contact point, wherein
the movable contact point causes continuity to be established between the first contact point and the second contact point if the first movable part is displaced to a first stable position among the plurality of stable positions, and causes discontinuity to be established between the first contact point and the second contact point if the first movable part is displaced to a second stable position among the plurality of stable positions other than the first stable position.

23. A switch comprising:
the actuator according to claim 1;
a first contact point and a second contact point to which a first signal line for inputting a high-frequency signal is connected;
a third contact point to which a second signal line for outputting the input high-frequency signal is connected;
a fourth contact point to which a third signal line for outputting the input high-frequency signal is connected;
a first movable contact point that is displaced integrally with the first movable part of the actuator to switch over continuity and discontinuity between the first contact point and the third contact point; and
a second movable contact point that is displaced integrally with the first movable part of the actuator to switch over continuity and discontinuity between the second contact point and the fourth contact point, wherein:
if the first movable part is displaced to a first stable position among the plurality of stable positions, continuity is established between the first contact point and the third contact point and discontinuity is established between the second contact point and the fourth contact point; and
if the first movable part is displaced to a second stable position other than the first stable position, continuity is established between the second contact point and the fourth contact point and discontinuity is established between the first contact point and the third contact point.

* * * * *